US011200850B2

(12) United States Patent
Choi

(10) Patent No.: US 11,200,850 B2
(45) Date of Patent: Dec. 14, 2021

(54) GATE DRIVING CIRCUIT AND LIGHT EMITTING DISPLAY APPARATUS COMPRISING THE SAME

(71) Applicant: LG Display Co., Ltd., Seoul (KR)

(72) Inventor: Jaeyi Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/118,397

(22) Filed: Dec. 10, 2020

(65) Prior Publication Data

US 2021/0201814 A1    Jul. 1, 2021

(30) Foreign Application Priority Data

Dec. 31, 2019    (KR) .......................... 10-2019-0180120

(51) Int. Cl.
*G09G 3/3266* (2016.01)
*G09G 3/3275* (2016.01)
*G09G 3/3233* (2016.01)

(52) U.S. Cl.
CPC ......... *G09G 3/3266* (2013.01); *G09G 3/3233* (2013.01); *G09G 3/3275* (2013.01); *G09G 2310/0254* (2013.01); *G09G 2310/08* (2013.01); *G09G 2320/0252* (2013.01); *G09G 2320/0257* (2013.01); *G09G 2320/10* (2013.01)

(58) Field of Classification Search
CPC .. G09G 3/3266; G09G 3/3275; G09G 3/3233; G09G 2310/0254; G09G 232/0252; G09G 2320/0257; G09G 2320/10; G09G 2310/08; G09G 2330/12; G09G 2310/0291; G09G 2310/0218; G09G 3/3258; G09G 2310/0243; G09G 2310/0264; G09G 2230/00; G11C 19/28
See application file for complete search history.

(56) References Cited

U.S. PATENT DOCUMENTS

| | | | |
|---|---|---|---|
| 2021/0201767 A1* | 7/2021 | Park | G09G 3/3233 |
| 2021/0201770 A1* | 7/2021 | Park | G09G 3/32 |
| 2021/0201816 A1* | 7/2021 | Kim | G09G 3/3233 |

FOREIGN PATENT DOCUMENTS

| | | |
|---|---|---|
| KR | 10-2016-0093179 A | 8/2016 |
| KR | 10-2017-0054654 A | 5/2017 |
| KR | 10-2018-0002099 A | 1/2018 |

* cited by examiner

*Primary Examiner* — Christopher J Kohlman
(74) *Attorney, Agent, or Firm* — Seed IP Law Group LLP

(57) ABSTRACT

A gate driving circuit and a light emitting display apparatus including the same are disclosed, in which current leakage of a control node may be avoided. The gate driving circuit includes first to mth stage circuits, wherein each of the first to mth stage circuits includes first to fifth control nodes, a node control circuit controlling a voltage of each of the first to fourth control nodes based on a first front carry signal, a sensing control circuit controlling a voltage of the fifth control node based on a line sensing preparation signal, a second front carry signal and a first reset signal, and a first node reset circuit controlling the voltage of the first control node based on the voltage of the fifth control node and a second reset signal, wherein the first node reset circuit may include a discharge path having two thin film transistors connected between a gate low potential voltage line and the fifth control node.

23 Claims, 22 Drawing Sheets

GATE DRIVING CIRCUIT AND LIGHT EMITTING DISPLAY APPARATUS COMPRISING THE SAME

CROSS-REFERENCE TO RELATED APPLICATIONS

This disclosure claims the benefit of and priority to the Korean Patent Application No. 10-2019-0180120 filed on Dec. 31, 2019, the entirety of which is hereby incorporated by reference as if fully set forth herein.

BACKGROUND

Technical Field

The present disclosure relates to a gate driving circuit and a light emitting display apparatus comprising the same.

Description of the Related Art

Since a light emitting display apparatus displays an image by using a self-light emitting diode, the light emitting display apparatus has a fast response speed, low power consumption, and a good viewing angle, and thus, are attracting much attention as a next-generation display apparatus.

The light emitting display apparatus may include pixels having a light emitting diode and a pixel circuit that drives the light emitting diode. For example, the pixel circuit includes a driving thin film transistor controlling a driving current flowing to the light emitting diode, and at least one switching thin film transistor controlling (or programming) a gate-source voltage of the driving thin film transistor in accordance with a scan signal. The switching thin film transistor of the pixel circuit may be switched by an output signal of a gate driving circuit directly formed in a substrate of a display panel. For example, the gate driving circuit may output a signal for switching the switching thin film transistor of the pixel circuit in accordance with a voltage of a control node.

BRIEF SUMMARY

Having recognizing the various problems in the related art, the inventors of the present disclosure employed a technique for inserting a black image to shorten a motion picture response time in a light emitting display apparatus. The black image insertion technique may shorten the motion picture response time by displaying a black image between adjacent frames to remove an influence of an image of a previous frame on an image of a next frame.

The inventors of the present disclosure have also suggested an external compensation technique to enhance quality of an image displayed in the light emitting display apparatus. The external compensation technique may compensate for a driving characteristic deviation between pixels by sensing a pixel voltage or current based on a driving characteristic (or electric characteristic) of the pixels and modulating data of an input image based on the sensed result.

However, the inventors have recognized that in the gate driving circuit of the light emitting display apparatus of the related art, a charging characteristic of the control node is deteriorated due to a threshold voltage change of a thin film transistor, whereby the gate driving circuit may output an abnormal signal or may be operated in error due to a voltage drop (e.g., IR Drop) of a gate driving voltage based on a leakage current of the thin film transistor connected to the control node.

The light emitting display apparatus to which the black image insertion technique and/or the external compensation technique is applied sequentially displays black images on a basis of a horizontal line (or horizontal pixel line). As the black image is displayed within one frame in accordance with charging characteristic deterioration of the control node, which is generated in the gate driving circuit, or a leakage current of the thin film transistor connected to the control node, or a time for sensing a driving characteristic of a pixel is not enough, a defect in picture quality is generated, whereby reliability may be deteriorated due to such a defect in picture quality.

Having recognized that the techniques for addressing one or more problems in the related art had further short comings, the inventors of the present disclosure have provided one or more embodiments that has been made in view of the various problems in the related art including the above problems identified by the inventors of the present disclosure.

One or more embodiments of the present disclosure provides a gate driving circuit and a light emitting display apparatus comprising the same, in which current leakage of a control node may be avoided and addresses one or more problems in the related art.

Further embodiments of the present disclosure provides a gate driving circuit and a light emitting display apparatus comprising the same, in which a voltage drop of a gate driving voltage is reduced or minimized by a leakage current of a thin film transistor connected to a control node.

In addition to the technical benefits of the present disclosure as mentioned above, additional benefits and features of the present disclosure will be clearly understood by those skilled in the art from the following description of the present disclosure.

A gate driving circuit according to one embodiment of the present disclosure comprises first to mth stage circuits, wherein each of the first to mth stage circuits includes first to fifth control nodes, a node control circuit controlling a voltage of each of the first to fourth control nodes based on a first front carry signal, a sensing control circuit controlling a voltage of the fifth control node based on a line sensing preparation signal, a second front carry signal and a first reset signal, and a first node reset circuit controlling the voltage of the first control node based on the voltage of the fifth control node and a second reset signal, wherein the first node reset circuit may include a discharge path having two thin film transistors connected between a gate low potential voltage line and the fifth control node.

A light emitting display apparatus according to one embodiment of the present disclosure comprises a light emitting display panel including a plurality of pixels, a plurality of gate line groups having first and second gate lines connected to the plurality of pixels, and a plurality of data and reference lines connected to the plurality of pixels, overlapping the plurality of gate line groups, a gate driving circuit portion including a gate driving circuit connected to the plurality of gate line groups, a data driving circuit portion connected to the plurality of data lines and the plurality of reference lines, and a timing controller controlling a driving timing of each of the gate driving circuit portion and the data driving circuit portion, wherein the gate driving circuit comprises first to mth stage circuits, each of the first to mth stage circuits including first to fifth control nodes, a node control circuit controlling a voltage of each of the first to fourth control nodes based on a first front carry signal, a sensing control circuit controlling a voltage of the fifth control node based on a line sensing preparation signal, a second front carry signal and a first reset signal, and a first node reset circuit controlling the voltage of the first control node based on the voltage of the fifth control node and a second reset signal, and the first node reset circuit including a discharge path having two thin film transistors connected between a gate low potential voltage line and the fifth control node.

Details according to various embodiments of the present disclosure in addition to the above benefits are included in the detailed description and drawings.

According to one embodiment of the present disclosure, a gate driving circuit and a light emitting display apparatus comprising the same may be provided, in which current leakage of a control node may be avoided.

According to one embodiment of the present disclosure, a gate driving circuit and a light emitting display apparatus comprising the same may be provided, in which a voltage drop of a gate driving voltage is reduced or minimized by a leakage current of a thin film transistor connected to a control node.

In addition to the effects of the present disclosure as mentioned above, additional advantages and features of the present disclosure will be clearly understood by those skilled in the art from the above description of the present disclosure.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
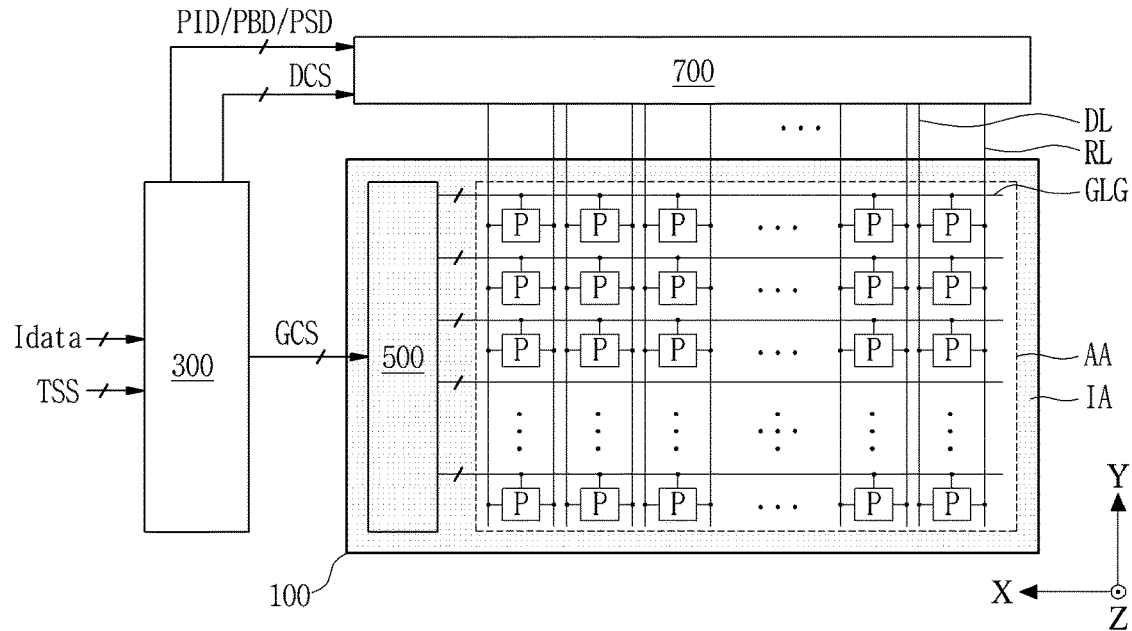
FIG. 1 is a view illustrating a light emitting display apparatus according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The phrase "in accordance with" as used herein may be interchangeably used with the phrase "based on."

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the present disclosure, a pixel circuit and a gate driving circuit, which are formed on a substrate of a light emitting display panel, may be embodied as n-type MOSFET type thin film transistors but are not limited thereto. The pixel circuit and the gate driving circuit may be embodied as p-type MOSFET type thin film transistors. The thin film transistor may include a gate, a source, and a drain. In the thin film transistor, a carrier moves from the source to the drain. In the n-type thin film transistor, since the carrier is an electron, a source voltage is lower than a drain voltage such that the electron may move from the source to the drain. In the n-type thin film transistor, since the electron moves from the source to the drain, a current moves from the drain to the source. In the p-type thin film transistor, since the carrier is a hole, the source voltage is higher than the drain voltage in order for the hole to move from the source to the drain. In the p-type thin film transistor, since the hole moves from the source to the drain, a current moves from the source to the drain. In the MOSFET type thin film transistor, the source and the drain are not fixed but may be changed depending on a voltage applied thereto. Therefore, in the description of the embodiment according to the present disclosure, a description will be given based on that any one of the source and the drain is referred to as a first source/drain electrode and the other one of the source and the drain is referred to as a second source/drain electrode.

Hereinafter, a gate driving circuit and a light emitting display apparatus comprising the gate driving circuit according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 2:
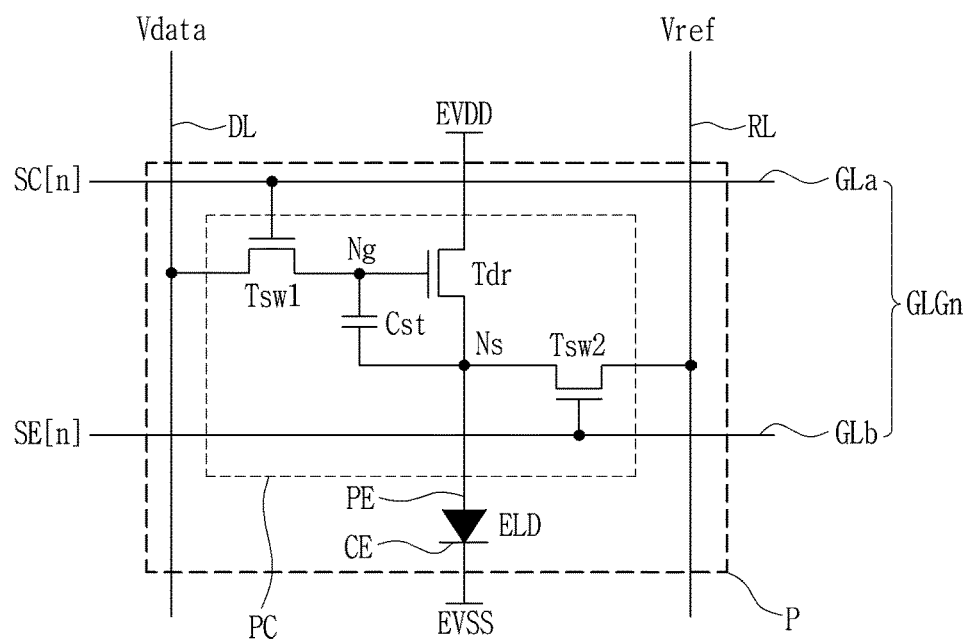
FIG. 2 is an equivalent circuit view illustrating a pixel shown in FIG. 1.
Figure 3:
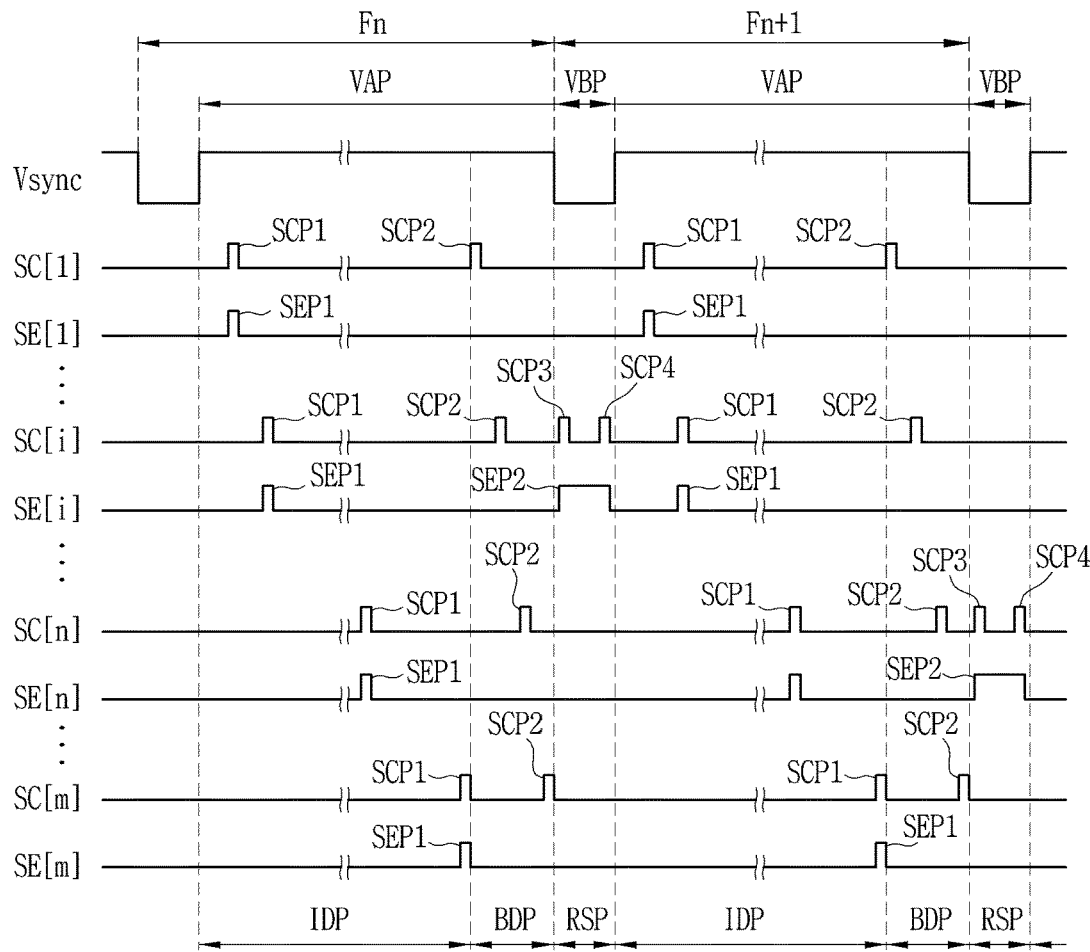
FIG. 3 is a waveform illustrating an output signal of a gate driving circuit according to one embodiment of the present disclosure.

FIG. 1 is a view illustrating a light emitting display apparatus according to one embodiment of the present disclosure, FIG. 2 is an equivalent circuit view illustrating a pixel shown in FIG. 1, and FIG. 3 is a waveform illustrating an output signal of a gate driving circuit according to one embodiment of the present disclosure.

Referring to FIGS. 1 to 3, the light emitting display apparatus according to one embodiment of the present disclosure may include a light emitting display panel 100, a timing controller 300, a gate driving circuit portion 500, and a data driving circuit portion 700.

The light emitting display panel 100 may include a display area AA (or active area) defined on a substrate, and a non-display area IA (or inactive area) adjacent to or in some cases surrounding the display area AA.

The display area AA may include a plurality of gate line groups GLG, a plurality of data lines DL, a plurality of reference lines RL and a plurality of pixels P.

Each of the plurality of gate line groups GLG may longitudinally be extended along a first direction X, and may be disposed on the substrate to be spaced apart from another gate line group along a second direction Y overlapping the first direction X. Each of the gate line groups GLG may include a first gate line (scan signal line) GLa and a second gate line (sense signal line) GLb.

Each of the plurality of data lines DL may longitudinally be extended along the second direction Y, and may be disposed on the substrate to be spaced apart from another data line along the first direction X.

Each of the plurality of reference lines RL may be disposed on the substrate to be parallel with each of the plurality of data lines DL. For example, the reference lines RL may be expressed as sensing lines.

Each of the plurality of pixels P may be disposed in a pixel area defined by the plurality of gate line groups GLG and the plurality of data lines DL.

Each of the plurality of pixels P according to one embodiment may be a red pixel, a green pixel or a blue pixel. In this case, the red pixel, the green pixel and the blue pixel may embody one unit pixel.

Each of the plurality of pixels P according to another embodiment may be a red pixel, a green pixel, a blue pixel or a white pixel. In this case, the red pixel, the green pixel, the blue pixel and the white pixel, which are adjacent to one another, may embody one unit pixel for displaying one color image.

The display area AA may further include a plurality of horizontal lines or a plurality of horizontal pixel lines along a length direction of each of the plurality of gate line groups GLG. The pixels P disposed in each horizontal line or horizontal pixel line may commonly be connected to the same gate line group GLG.

Each of the plurality of pixels P may include a light emitting diode ELD, and a pixel circuit PC for controlling light emission of the light emitting diode ELD.

The pixel circuit PC may be switched in accordance with a signal supplied through the gate line group GLG adjacent thereto, to output a data current based on a differential voltage Vdata-Vref of a data voltage Vdata supplied through the data line DL adjacent thereto and a reference voltage Vref supplied through the reference line RL adjacent thereto.

The pixel circuit PC according to one embodiment may include a first switching thin film transistor Tsw1, a second switching thin film transistor Tsw2, a driving thin film transistor Tdr, and a storage capacitor Cst. In the following description, the thin film transistor will be referred to as "TFT".

At least one of the first switching TFT Tsw1, the second switching TFT Tsw2 and the driving TFT Tdr may be a-Si TFT, poly-Si TFT, Oxide TFT, or Organic TFT. For example, in the pixel circuit PC, some of the first switching TFT Tsw1, the second switching TFT Tsw2 and the driving TFT Tdr may be a TFT that includes a semiconductor layer (or active layer) made of low-temperature poly-Si (LTPS) having an excellent response characteristic, and the other of the first switching TFT Tsw1, the second switching TFT Tsw2 and the driving TFT Tdr may be a TFT that includes a semiconductor layer (or active layer) made of oxide having an excellent off current characteristic.

The first switching TFT Tsw1 includes a gate electrode connected to the first gate line GLa of the gate line group GLG, a first source/drain electrode connected to the data line DL adjacent thereto, and a second source/drain electrode connected to a gate node Ng of the driving TFT Tdr. The first switching TFT Tsw1 supplies the data voltage Vdata supplied through the data line DL adjacent thereto, to the gate node Ng of the driving TFT Tdr in accordance with scan signals SC[1] to SC[n] supplied through the first gate line GLa.

The second switching TFT Tsw2 includes a gate electrode connected to the second gate line GLb of the gate line group GLG, a first source/drain electrode connected to a source node Ns of the driving TFT Tdr, and a second source/drain electrode connected to the reference line RL adjacent thereto. The second switching TFT Tsw2 supplies the reference voltage Vref supplied through the reference line RL adjacent thereto, to a source node Ns of the driving TFT Tdr in accordance with sense signals SE[1] to SE[m] supplied through the second gate line GLb.

The storage capacitor Cst may be formed between the gate node Ng and the source node Ns of the driving TFT Tdr. The storage capacitor Cst according to one embodiment may include a first capacitor electrode connected with the gate node Ng of the driving TFT Tdr, a second capacitor electrode connected with the source node Ns of the driving TFT Tdr, and a dielectric layer formed in an overlap area between the first capacitor electrode and the second capacitor electrode. Such a storage capacitor Cst charges a differential voltage between the gate node Ng and the source node Ns of the driving TFT Tdr and then switches the driving TFT Tdr in accordance with the charged voltage.

The driving TFT Tdr may include a gate electrode (or gate node Ng) commonly connected to the second source/drain electrode of the first switching TFT Tsw1 and the first capacitor electrode of the storage capacitor Cst, a first source/drain electrode (or source node Ns) commonly connected to the first source/drain electrode of the second switching TFT Tsw2, the second capacitor electrode of the storage capacitor Cst and the light emitting diode ELD, and a second source/drain electrode (or drain node) connected to a pixel driving power source EVDD. The driving TFT Tdr may be turned on by the voltage of the storage capacitor Cst to control the amount of a current flowing from the pixel driving power source EVDD to the light emitting diode ELD.

The light emitting diode ELD emits light in accordance with the data current supplied from the pixel circuit PC to emit light of luminance corresponding to the data current.

The light emitting diode ELD according to one embodiment may include a pixel electrode (or anode electrode) PE electrically connected with the pixel circuit PC, a self-light emitting diode, and a common electrode (or cathode electrode) CE disposed on the self-light emitting diode and connected to a pixel common power source EVSS.

The pixel electrode PE may be disposed in a light emitting area (or opening area) defined in the pixel P and electrically be connected with the source node Ns of the pixel circuit PC through a contact hole disposed in an insulating layer (or planarization layer) that covers the pixel circuit PC. The pixel electrode PE may be made of a transparent conductive metal material or a reflective metal material depending on a top emission structure or a bottom emission structure of the light emitting diode ELD.

The self-light emitting diode is formed on the pixel electrode PE and is directly in contact with the pixel electrode PE. This light emitting diode ELD emits light in accordance with the data current supplied from the pixel circuit PC to emit light of luminance corresponding to the data current.

The self-light emitting diode according to one embodiment may be a common layer commonly formed in each of the plurality of pixels P so as not to be identified per pixel P. The self-light emitting diode may emit white light by responding to a current flowing between the pixel electrode PE and the common electrode CE. The self-light emitting diode according to one embodiment may include an organic light emitting diode or an inorganic light emitting diode, or may include a deposited or mixture structure of an organic light emitting diode (or inorganic light emitting diode) and a quantum dot light emitting diode.

The organic light emitting diode according to one embodiment includes two or more light emitting material layers (or light emitting portions) for emitting white light. For example, the organic light emitting diode may include first and second light emitting material layers for emitting white light by mixture of first light and second light. In this case, the first light emitting material layer may include at least one of a blue light emitting material, a green light emitting material, a red light emitting material, a yellow light emitting material, and a yellow-green light emitting material. The second light emitting material layer may include at least one of a blue light emitting material, a green light emitting material, a red light emitting material, a yellow light emitting material, and a yellow-green light emitting material to emit second light which may make white light by mixture with the first light emitted from the first light emitting material layer.

The organic light emitting diode according to one embodiment may further include at least one functional layer for improving light emission efficiency and/or lifetime. For example, the functional layer may be disposed in each of an upper portion and/or a lower portion of the light emitting material layer.

The inorganic light emitting diode according to one embodiment may include a semiconductor light emitting diode, a micro light emitting diode, or a quantum dot light emitting diode. For example, when the light emitting diode ELD is an inorganic light emitting diode, the light emitting diode ELD may have, but not limited to, a scale of 1 to 100 micrometers.

The common electrode CE may be disposed on the display area AA, and may directly be in contact with the self-light emitting diode or electrically and directly be in contact with the self-light emitting diode. The common electrode CE may be made of a transparent conductive metal material or a reflective metal material depending on a top emission structure or a bottom emission structure of the light emitting diode ELD.

The number of the gate lines GLa and GLb connected to each of the plurality of pixels P may be varied depending on a structure or driving method of the pixel P. For example, when the first switching TFT Tsw1 and the second switching TFT Tsw2 have a two-scan structure in which the TFTs Tsw1 and Tsw2 are driven differently from each other, each pixel P is connected to two gate lines GLa and GLb. When the first switching TFT Tsw1 and the second switching TFT Tsw2 have one scan structure in which the TFTs Tsw1 and Tsw2 are driven equally to each other, each pixel P is connected to one gate line group GLG. In the present disclosure, a description will be given based on the two-scan structure for convenience of description, but technical spirits of the present disclosure are not limited to the two-scan structure.

The timing controller 300 may be embodied to control the light emitting display panel 100 in a display mode and a sensing mode based on a vertical synchronization signal Vsync and a horizontal synchronization signal of timing synchronization signals TSS provided from a display driving system (or host controller).

The display mode of the light emitting display panel 100 may be driving for sequentially displaying an input image and a black image, which have a certain time difference, in a plurality of horizontal lines. The display mode according to one embodiment may include an image display period (or light emitting display period) IDP for displaying an input image, and a black display period (or impulse non-light emission period) for displaying a black image.

The sensing mode (or real-time sensing mode) of the light emitting display panel 100 may be real-time sensing driving for sensing a driving characteristic of the pixels P disposed in one of the plurality of horizontal lines and updating a compensation value per pixel to compensate for a driving characteristic change of the corresponding pixels P based on the sensed value, after the image display period (IDP) in one frame. The sensing mode according to one embodiment may sense driving characteristics of the pixels P disposed in any one of the plurality of horizontal lines in accordance with an irregular order in a vertical blank period VBP of each frame. Since the pixels P emitting light in accordance with the display mode do not emit light in the sensing mode, line dim may occur due to non-light emission of the sensed horizontal line when the horizontal lines are sensed sequentially in the sensing mode. On the other hand, when the horizontal lines are sensed in the sensing mode in an irregular order or a random order, line dim may be reduced or minimized or avoided due to a visual dispersion effect.

According to one embodiment, the timing controller 300 may set each frame Fn, Fn+1 for displaying an image on the light emitting display panel 100 to the image display period IDP, the black display period BDP and the real-time sensing period RSP. For example, the timing controller 300 may set a vertical active period VAP of one frame period Fn, Fn+1 to the display period IDP, BDP for the display mode, and may set the vertical blank period VBP to the sensing period (or real time sensing period) RSP for the sensing mode.

The timing controller 300 may vary a duty (or light emission duty) of the image display period IDP by controlling a start timing of the black display period BDP in one frame Fn, Fn+1. The timing controller 300 according to one embodiment may extract a motion vector of input images by comparing and analyzing the input images on a basis of frame Fn, Fn+1, and may vary the start timing of the black display period BDP in accordance with the motion vector of the images. For example, the timing controller 300 may reduce the duty of the image display period IDP by advancing the start timing of the black display period BDP within one frame Fn, Fn+1 if the motion vector of the images is greater than a reference value, thereby increasing maximum instantaneous luminance of the pixel P. As a result, a motion picture response time may be reduced and at the same time motion blurring may be reduced or minimized. On the contrary, the timing controller 300 may increase the duty of the image display period IDP by delaying the start timing of the black display period BDP within one frame Fn, Fn+1 if the motion vector of the images is smaller than the reference value, thereby increasing luminance of the pixel P. As a result, a motion picture response time may be reduced and at the same time motion blurring may be reduced or minimized.

The timing controller 300 may generate and output a gate control signal GCS and a data control signal DCS for driving the light emitting display panel 100 in the image display period IDP, the black display period BDP and the sensing period RSP based on the timing synchronization signals TSS provided from the display driving system (or host controller).

The data control signal DCS may include a source start pulse, a source sampling clock and a source output enable to control the driving timing of the data driving circuit portion 700.

The gate control signal GCS may include a gate start signal, a first reset signal, a second reset signal, a gate driving clock, and a line sensing preparation signal to control the driving timing of the gate driving circuit portion 500.

The timing controller 300 may generate a respective gate driving clock in each of the image display period IDP, the black display period BDP, and the sensing period RSP. For example, the timing controller 300 may generate an image display gate driving clock in the image display period IDP, a black display gate driving clock in the black display period BDP, and a sensing gate driving clock in the sensing period RSP. The image display gate driving clock, the black display gate driving clock and the sensing gate driving clock may be different from one another.

The timing controller 300 may align input data Idata supplied from the display driving system (or host controller) per image display period IDP of the display mode to be suitable for driving of the light emitting display panel 100 as pixel image data PID and then supply the aligned pixel image data to the data driving circuit portion 700.

The timing controller 300 may generate pixel black data PBD per black display period BDP of the display mode and supply the generated pixel black data PBD to the data driving circuit portion 700. For example, the timing controller 300 may generate a preset non-light emitting gray scale value or black gray scale value of the light emitting diode ELD as pixel black data PBD.

The timing controller 300 may generate pixel sensing data PSD per sensing period RSP of the sensing mode and supply the generated pixel sensing data PSD to the data driving circuit portion 700. For example, the timing controller 300 may generate a gray scale value, which may turn on the driving TFT Tdr of the pixels disposed in a horizontal line to be sensed in the sensing period RSP, as pixel sensing data PSD. At this time, the pixel sensing data PSD corresponding to the pixels constituting a unit pixel may have the same gray scale value or respective gray scale values different per pixel.

The gate driving circuit portion 500 may be disposed in the non-display area IA of the light emitting display panel 100 and electrically connected with the plurality of gate line groups GLG. The gate driving circuit portion 500 may sequentially drive the plurality of gate line groups GLG based on the gate control signal GCS supplied from the timing controller 300.

The gate driving circuit portion 500 may respectively generate a scan signal SC and a sense signal SE respectively corresponding to the image display period IDP, the black display period BDP and the sensing period RSP based on the gate control signal GCS supplied from the timing controller 300, and may supply the generated scan signal SC and sense signal SE to the corresponding gate line group GLG. For example, the gate driving circuit portion 500 sequentially supplies scan signals SC[1] to SC[m] and sense signals SE[1] to SE[m] to the plurality of gate line groups GLG in the vertical active period VAP of each frame period, and may output scan signals SC[i], SC[n] and sense signals SE[i], SE[n] to any one of the gate line groups GLG in the vertical blank period VBP of each frame period.

According to one embodiment, the gate driving circuit portion 500 sequentially supplies scan signals SC[1] to SC[m] having a first scan pulse SCP1 corresponding to the image display period IDP and a second scan pulse SCP2 corresponding to the black display period BDP to the first gate line GLa of each of the plurality of gate line groups GLG in the display mode, and may sequentially supply sense signals SE[1] to SE[m] having a first sense pulse SEP1 synchronized with the first scan pulse SCP1 to the second gate line GLb of each of the plurality of gate line groups GLG.

Optionally, the gate driving circuit portion 500 may group the plurality of gate line groups GLG in a plurality of horizontal groups, and may simultaneously supply the second scan pulse SCP2 of the scan signal SC[i] on a horizontal group basis in the black display period BDP of the display mode. For example, when the display area AA is virtually divided into a first area and a second area, the gate driving circuit portion 500 may simultaneously supply the second scan pulse SCP2 to the plurality of first gate lines GLa disposed in the second area in the display mode, in the middle of sequentially supplying the first scan pulse SCP1 to the plurality of first gate lines GLa disposed in the first area.

According to one embodiment, the gate driving circuit portion 500 may supply scan signals SC[i], SC[n] having a third scan pulse SCP3 (or sensing scan pulse) and a fourth scan pulse SCP4 (or reset scan pulse) to the first gate line GLa of the gate line group GLG disposed in any one specific horizontal line to be sensed, among the plurality of gate line groups GLG, per sensing mode of each frame Fn, Fn+1, and may supply the sense signals SE[i], SE[n] having a second sense pulse SEP2 (or sensing sense pulse) overlapped with all of the third scan pulse SCP3 and the fourth scan pulse SCP4 to the second gate line GLb of the gate ling group GLG disposed in a specific horizontal line.

As an example, in the sensing mode of the Nth frame Fn, when sensing driving is performed for the pixels P connected to the ith gate line group of the plurality of gate line groups GLG, the gate driving circuit portion 500 may supply the scan signal SC[i] having a third scan pulse SCP3 and a fourth scan pulse SCP4 to the first gate line GLa of the ith gate line group and at the same time supply the sense signal SE[i] having a second sense pulse SEP2 overlapped with all of the third scan pulse SCP3 and the fourth scan pulse SCP4 to the second gate line GLb of the ith gate ling group.

As another example, in the sensing mode of the (N+1)th frame Fn+1, when sensing driving (or sensing period RSP) is performed for the pixels P connected to the nth gate line group of the plurality of gate line groups GLG, the gate driving circuit portion 500 may supply the scan signal SC[n] having a third scan pulse SCP3 and a fourth scan pulse SCP4 to the first gate line GLa of the nth gate line group and at the same time supply the sense signal SE[n] having a second sense pulse SEP2 overlapped with all of the third scan pulse SCP3 and the fourth scan pulse SCP4 to the second gate line GLb of the nth gate ling group.

The gate driving circuit portion 500 may directly be formed or embedded in the non-display area of the display panel 100 and thus connected with the plurality of gate line groups GLG individually in accordance with the manufacturing process of the TFT.

As an example, the gate driving circuit portion 500 may be embodied in the non-display area IA at a left side of the substrate and drive the plurality of gate line groups GLG in due order in accordance with a single feeding method.

As another example, the gate driving circuit portion 500 may be embodied in the non-display area IA at each of a left side and a right side of the substrate and drive the plurality of gate line groups GLG in due order in accordance with a double feeding method or a single feeding method. For example, in the single feeding method, the gate driving circuit portion 500 embodied in the non-display area IA at the left side of the substrate may sequentially drive the odd numbered gate line groups of the plurality of gate line groups GLG, and the gate driving circuit portion 500 embodied in the non-display area IA at the right side of the substrate may sequentially drive the even numbered gate line groups of the plurality of gate line groups GLG. In the double feeding method, each of the gate driving circuit portion 500 embodied in the non-display area IA at the left side of the substrate and the gate driving circuit portion 500 embodied in the non-display area IA at the right side of the substrate may sequentially drive the plurality of gate line groups GLG at the same time.

The data driving circuit portion 700 may be connected with the plurality of data lines DL provided in the light emitting display panel 100. The data driving circuit portion 700 according to one embodiment may convert the data PID, PBD and PSD to analog type data voltages Vdata by using the data PID, PBD and PSD and the data control signal DCS supplied from the timing controller 300 and a plurality of reference gamma voltages supplied from a power supply, and may supply the converted data voltages to the corresponding data line DL.

In the image display period IDP of the display mode, the data driving circuit portion 700 may convert the pixel image data PID to the image data voltage Vdata based on the data control signal DCS supplied from the timing controller 300 and supply the converted image data voltage Vdata to the corresponding data line DL, and at the same time may generate a reference voltage Vref and supply the generated reference voltage Vref to the reference line RL. The image data voltage Vdata may be synchronized with the first scan pulse SCP1 of the scan signals SC[1] to SC[m] supplied to the gate line group GLG corresponding to the image display period IDP of the display mode. The reference voltage Vref may be synchronized with the display sense pulse SEP of the sense signals SE[1] to SE[m] supplied to the gate line group GLG corresponding to the image display period IDP of the display mode.

In the black display period BDP of the display mode, the data driving circuit portion 700 may convert the pixel black data PBD to the black data voltage Vdata based on the data control signal DCS supplied from the timing controller 300 and supply the converted black data voltage Vdata to the corresponding data line DL. The black data voltage Vdata may be synchronized with the second scan pulse SCP2 for display of the scan signals SC[i] and SC[n] supplied to the gate line group GLG corresponding to the black display period BDP of the display mode.

In the sensing period RSP of the sensing mode, the data driving circuit portion 700 may convert the pixel sensing data PSD to the sensing data voltage Vdata based on the data control signal DCS supplied from the timing controller 300 and supply the converted sensing data voltage Vdata to the corresponding data line DL, and at the same time may generate a reference voltage Vref and supply the generated reference voltage Vref to the reference line RL. The sensing data voltage Vdata may be synchronized with the third scan pulse SCP3 of the scan signals SC[i] and SC[n] supplied to the gate line group GLG corresponding to the sensing period RSP of the sensing mode. The reference voltage Vref may be synchronized with the second sense pulse SEP2 of the sense signals SE[i] and SE[n] supplied to the gate line group GLG corresponding to the sensing period RSP of the sensing mode.

In the sensing period RSP of the sensing mode, the data driving circuit portion 700 may sense a driving characteristic of the pixel P, for example, a characteristic value of the driving TFT, through the plurality of reference lines RL, and may generate sensing low data corresponding to the sensed value and supply the generated sensing low data to the timing controller 300. The data driving circuit portion 700 may generate a restoring data voltage Vdata synchronized with the fourth scan pulse SCP4 of the scan signals SC[i] and SC[n] supplied to the gate line group GLG corresponding to the sensing period RSP of the sensing mode and supply the generated restoring data voltage Vdata to the data line DL, thereby restoring (or recovering) a display state (or driving state) of the pixels P connected to the gate line group GLG corresponding to the sensing period RSP equally to a previous state of the sensing period RSP. For example, when the image display period IDP is performed prior to the sensing period RSP, the restoring data voltage Vdata may be image data voltage Vdata. When the black display period BDP is performed prior to the sensing period RSP, the restoring data voltage Vdata may be black data voltage Vdata.

Meanwhile, the timing controller 300 according to one embodiment stores sensing low data per pixel P supplied from the data driving circuit portion 700 in a storage circuit in accordance with the sensing mode. In the display mode, the timing controller 300 may compensate for the pixel image data PID to be supplied to the sensed pixel P based on the sensing low data stored in the storage circuit and supply the compensated pixel image data to the data driving circuit portion 700. For example, the sensing low data may include sequential change information of each of the driving TFT and the light emitting diode ELD, which are disposed in the pixel P. Therefore, the timing controller 300 may sense a characteristic value (for example, threshold voltage or mobility) of the driving TFT disposed in each pixel, in the sensing mode, and may compensate for the pixel image data PDI to be supplied to each pixel P, based on the sensed characteristic value, thereby reducing or minimizing or avoiding picture quality deterioration based on characteristic value deviation of the driving TFT in the plurality of pixels P. Since the sensing mode of the light emitting display apparatus is the technique already known in the art by the applicant of the present disclosure, its detailed description will be omitted. For example, the light emitting display apparatus according to the present disclosure may sense the driving characteristic value disposed in each pixel P through the sensing mode disclosed in the Korean Laid-Open Patent No. 10-2016-0093179, 10-2017-0054654, or 10-2018-0002099.

Figure 4:
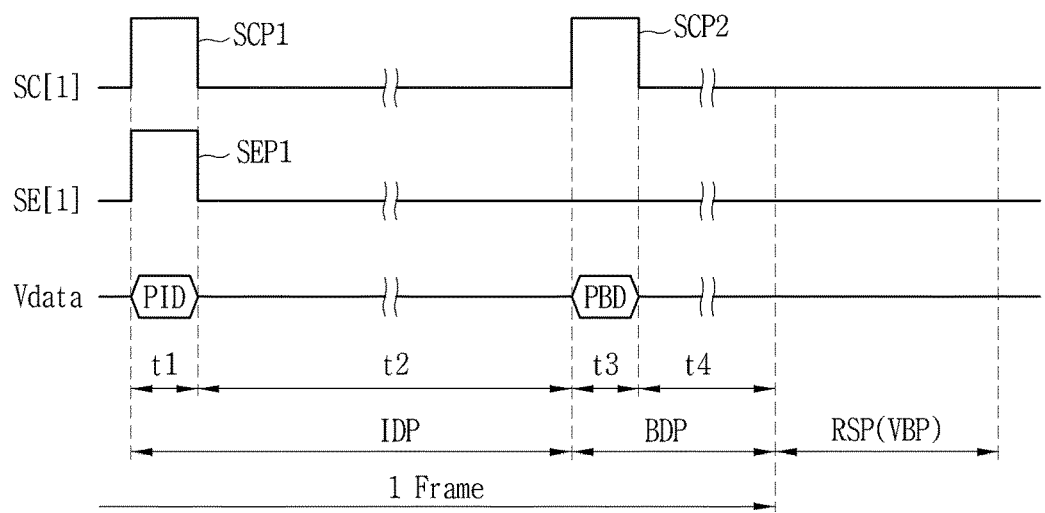
FIG. 4 is a timing view illustrating a scan signal, a sense signal, and a data voltage for driving pixels disposed in a first horizontal line.

FIG. 4 is a timing view illustrating a scan signal, a sense signal, and a data voltage for driving pixels disposed in a first horizontal line (or one horizontal line).

Referring to FIGS. 2 and 4, the pixel P according to one embodiment of the present disclosure may be driven (or operated) in the image display period IDP and the black display period BDP for one frame.

The image display period IDP of the pixel P may include an image data addressing period t1 and a light emission period t2.

At the image data addressing period (or first data addressing period) t1 of the pixel P, the first switching TFT Tsw1 disposed in the pixel P is turned on by the first scan pulse SCP1 of the scan signal SC[1] supplied through the first gate line GLa of the first gate line group GLG1, and the second switching TFT Tsw2 is turned on by the sense pulse SEP of the sense signal SE[1] supplied through the second gate line GLb of the first gate line group GLG1. Therefore, the image data voltage Vdata of the pixel image data PID supplied through the data line DL is applied to the gate node Ng of the driving TFT Tdr, and at the same time, the reference voltage Vref supplied through the reference line RL is applied to the source node Ns of the driving TFT Tdr. Therefore, at the image data addressing period t1, a voltage difference Vdata-Vref between the gate node Ng and the source node Ns of the driving TFT Tdr may be set to a voltage higher than the threshold voltage of the driving TFT Tdr, and the storage capacitor Cst may store a differential voltage Vdata-Vref of the image data voltage Vdata and the reference voltage Vref. In this case, the image data voltage Vdata may have a voltage level in which the threshold voltage of the driving TFT Tdr sensed through the sensing mode is reflected in an actual data voltage or compensated.

At the light emission period t2 of the pixel P, each of the first and second switching TFTs Tsw1 and Tsw2 disposed in the pixel P is turned off, whereby the driving TFT Tdr disposed in the pixel P is turned on by the voltage Vdata-Vref charged in the storage capacitor Cst. Therefore, the driving TFT Tdr supplies the data current determined by the differential voltage Vdata-Vref of the image data voltage Vdata and the reference voltage Vref to the light emitting diode ELD to allow the light emitting diode ELD to emit light in proportion to the data current flowing from the pixel driving power source EVDD to the pixel common power source EVSS. That is, at the light emission period t2, if the first and second switching TFTs Tsw1 and Tsw2 are turned off, a current flows to the driving TFT Tdr and the light emitting diode ELD starts to emit light in proportion to the current, whereby a voltage of the source node Ns of the driving TFT Tdr is increased and a voltage of the gate node Ng of the driving TFT Tdr is increased by the storage capacitor Cst as much as the voltage increase of the source node Ns of the driving TFT Tdr. As a result, a gate-source voltage Vgs of the driving TFT Tdr may continuously be maintained by the voltage of the storage capacitor Cst, and light emission of the light emitting diode ELD may be sustained to reach the start timing of the black display period BDP. The light emission period of the light emitting diode ELD may correspond to a light emission duty.

The black display period BDP of the pixel P may include a black data addressing period t3 and a non-light emission period t4.

At the black data addressing period (or second data addressing period) t3 of the pixel P, the first switching TFT Tsw1 disposed in the pixel P is turned on by the second scan pulse SCP2 of the scan signal SC[1] supplied through the first gate line GLa of the first gate line group GLG1, and the second switching TFT Tsw2 is maintained at a turn-off state by the sense signal SE[1] of a TFT off-voltage level supplied through the second gate line GLb of the first gate line group GLG1. Therefore, the black data voltage Vdata of the pixel black data PBD supplied through the data line DL is applied to the gate node Ng of the driving TFT Tdr. At this time, the source node Ns of the driving TFT Tdr may be maintained at an operation voltage level (or non-light emitting start voltage) of the light emitting diode ELD in accordance with the turn-off state of the second switching TFT Tsw2. The black data voltage Vdata may have a voltage level lower than an operation voltage level (or non-light emitting voltage level) of the light emitting diode ELD or a voltage level lower than the threshold voltage of the driving TFT Tdr. Therefore, at the black data addressing period t3, the driving TFT Tdr is turned off as the voltage Vgs between the gate node Ng and the source node Ns is varied to be lower than the threshold voltage of the driving TFT Tdr by the black data voltage Vdata. For this reason, as the data current supplied from the driving TFT Tdr to the light emitting diode ELD is cut off, light emission of the light emitting diode ELD is stopped, whereby the pixel P displays a black image due to non-light emission of the light emitting diode ELD.

At the non-light emission period t4 of the pixel P, the first switching TFT Tsw1 disposed in the pixel P is turned off, and the second switching TFT Tsw2 is maintained at a turn-off state, whereby the driving TFT Tdr maintains the turn-off state. For this reason, the light emitting diode ELD may maintain the non-light emission state, and non-light emission of the light emitting diode ELD may be sustained to reach the image data addressing period t1 of next frame or the start timing of the sensing period RSP. The non-light emission period of the light emitting diode ELD may correspond to a black duty or a non-light emission duty.

Meanwhile, the pixels P disposed in the other horizontal line except any one specific horizontal line to be sensed among the plurality of horizontal lines disposed in the display area may be driven in the image display period IDP and the black display period BDP substantially equally to the pixel P disposed in the aforementioned first horizontal line.

Figure 5:
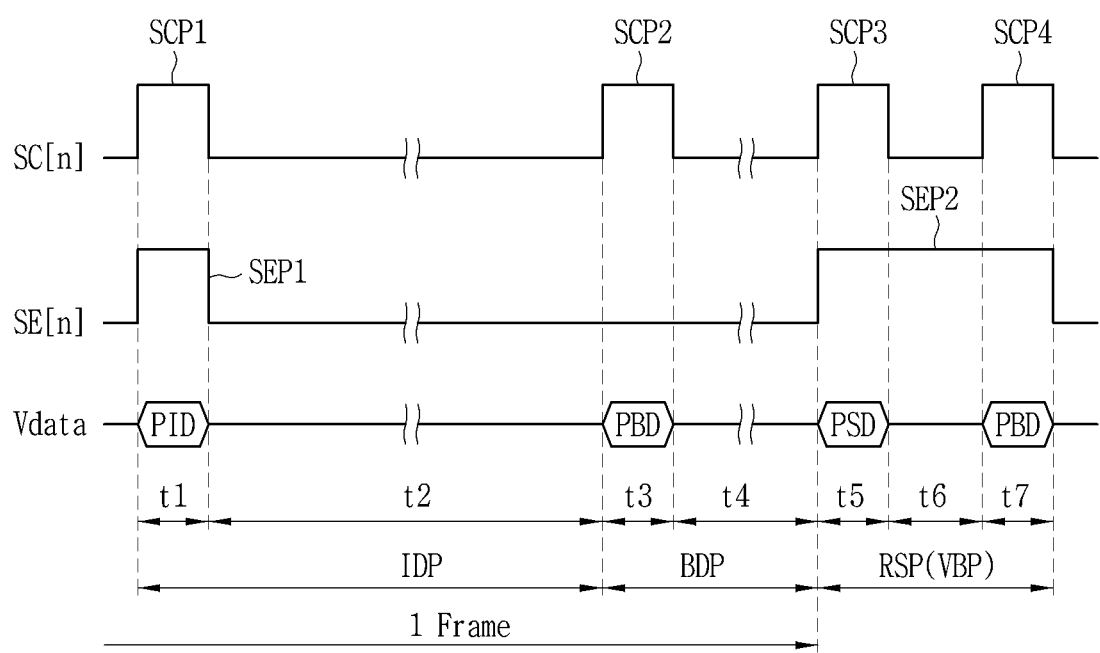
FIG. 5 is a timing view illustrating a scan signal, a sense signal, and a data voltage for driving pixels disposed in an nth horizontal line.

FIG. 5 is a timing view illustrating a scan signal, a sense signal, and a data voltage for driving pixels disposed in an nth horizontal line.

Referring to FIGS. 2 and 5, the pixel P according to one embodiment of the present disclosure may be driven (or operated) in the image display period IDP, the black display period BDP and the sensing period RSP for one frame.

The image display period IDP of the pixel P may include an image data addressing period t1 and a light emission period t2. Since the image data addressing period t1 and the light emission period t2 are substantially equal to those described with reference to FIG. 4, their repeated description will be omitted.

The black display period IDP of the pixel P may include a black data addressing period t3 and a non-light emission period t4. Since the black data addressing period t3 and the non-light emission period t4 are substantially equal to those described with reference to FIG. 4, their repeated description will be omitted.

The sensing period RSP of the pixel P may include a sensing data addressing period t5 and a sampling period t6.

At the sensing data addressing period (or third data addressing period) t5 of the pixel P, the first switching TFT Tsw1 disposed in the pixel P is turned on by the third scan pulse SCP3 of the scan signal SC[n] supplied through the first gate line GLa of the nth gate line group GLGn, and the second switching TFT Tsw2 is turned on by the second sense pulse SEP2 of the sense signal SE[n] supplied through the second gate line GLb of the nth gate line group GLGn. Therefore, the sensing data voltage Vdata of the pixel sensing data PSD supplied through the data line DL is applied to the gate node Ng of the driving TFT Tdr, and at the same time, the reference voltage Vref supplied through the reference line RL is applied to the source node Ns of the driving TFT Tdr. Therefore, at the sensing data addressing period t5, a voltage Vgs between the gate node Ng and the source node Ns of the driving TFT Tdr is set to correspond to the sensing data voltage. For example, the sensing data voltage Vdata may have a level of a target voltage set to sense the threshold voltage of the driving TFT Tdr.

At the sampling period t6 (or real-time sensing period) of the pixel P, the first switching TFT Tsw1 disposed in the pixel P is turned off by the scan signal SC[n] of the TFT off-voltage level supplied through the first gate line GLa of the nth gate line group GLGn, and the second switching TFT Tsw2 is maintained at the turn-on state by the second sense pulse SEP2 of the sense signal SE[n] supplied through the second gate line GLb of the nth gate line group GLGn. The reference line RL is electrically connected to a sensing unit embedded in the data driving circuit. Therefore, the sensing unit of the data driving circuit may sample a sensing pixel current or sensing pixel voltage supplied through the source node Ns of the driving TFT Tdr and the second switching TFT Tsw2 and the reference line RL, and may convert the sampled sampling signal through analog-digital conversion to generate sensing low data and supply the generated sensing low data to the timing controller 300.

The sensing period RSP of the pixel P according to one embodiment of the present disclosure may further include a data restoring period t7.

At the data restoring period t7 (or real-time sensing period) of the pixel P, the first switching TFT Tsw1 disposed in the pixel P is turned off by the scan signal SC[n] of the TFT off-voltage level supplied through the first gate line GLa of the nth gate line group GLGn, and the second switching TFT Tsw2 is maintained at the turn-on state by the second sense pulse SEP2 of the sense signal SE[n] supplied through the second gate line GLb of the nth gate line group GLGn. The reference line RL is electrically detached from the sensing unit of the data driving circuit and electrically connected with a reference power source. Therefore, the restoring data voltage Vdata of the pixel black data PBD supplied through the data line DL is applied to the gate node Ng of the driving TFT Tdr and at the same time, the reference voltage Vref supplied through the reference line RL is applied to the source node Ns of the driving TFT Tdr. Therefore, at the data restoring period t7, the voltage between the gate node Ng and the source node Ns of the driving TFT Tdr is restored to a previous state of the sensing period RSP, whereby the pixels P may again emit light and re-emission of the light emitting diode ELD may be sustained to reach the image data addressing period t1 of next frame Fn+1.

Figure 6:
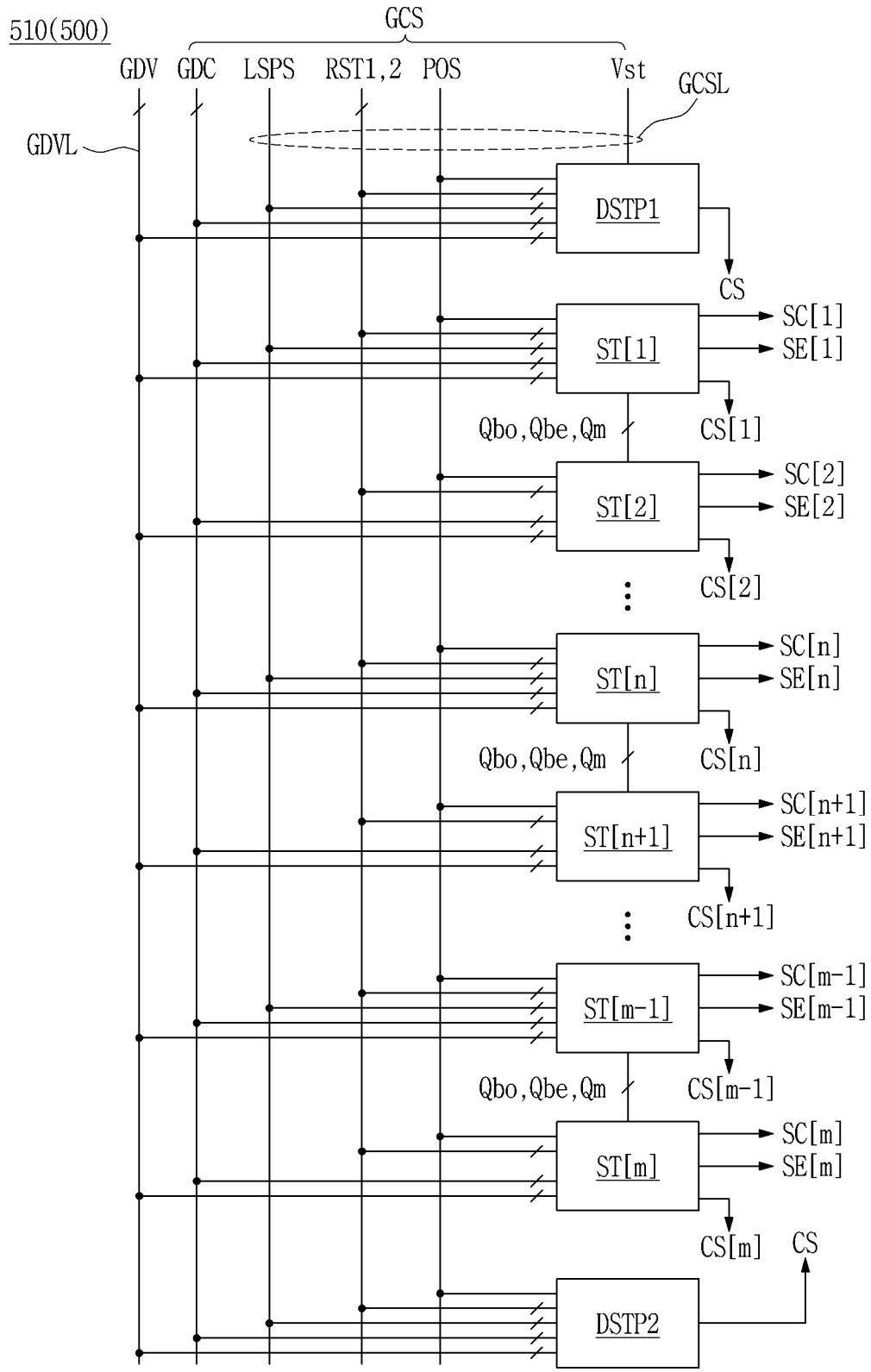
FIG. 6 is a waveform illustrating a gate driving circuit according to one embodiment of the present disclosure, which is shown in FIG. 1.

FIG. 6 is a waveform illustrating a gate driving circuit according to one embodiment of the present disclosure, which is shown in FIG. 1.

Referring to FIGS. 1 and 6, the gate driving circuit portion 500 according to one embodiment of the present disclosure may include a gate driving circuit 510.

The gate driving circuit 510 may include a gate control signal line GCSL, a gate driving voltage line GDVL, and first to mth stage circuits ST[1] to ST[m]. The gate driving circuit 510 may further include a front dummy stage circuit portion DSTP1 disposed at a front end of the first stage circuit ST[1], and a rear dummy stage circuit portion DSTP2 disposed at a rear end of the mth stage circuit ST[m].

The gate control signal line GCSL receives the gate control signal GCS supplied from the timing controller 300. The gate control signal line GCSL according to one embodiment may include a gate start signal line, a first reset signal line, a second reset signal line, a plurality of gate driving clock lines, a display panel on signal line, and a sensing preparation signal line.

The gate start signal line may receive a gate start signal Vst supplied from the timing controller 300. For example, the gate start signal line may be connected to the front dummy stage circuit portion DSTP1.

The first reset signal line may receive a first reset signal RST1 supplied from the timing controller 300. The second reset signal line may receive a second reset signal RST2 supplied from the timing controller 300. For example, each of the first and second reset signal lines may commonly be connected to the front dummy stage circuit portion DSTP1, the first to mth stage circuits ST[1] to ST[m], and the rear dummy stage circuit portion DSTP2.

The plurality of gate driving clock lines may include a plurality of carry clock lines, a plurality of scan clock lines and a plurality of sense clock lines, which respectively receive a plurality of carry shift clocks, a plurality of scan shift clocks and a plurality of sense shift clocks. The clock lines included in the plurality of gate driving clock lines may selectively be connected to the front dummy stage circuit portion DSTP1, the first to mth stage circuits ST[1] to ST[m], and the rear dummy stage circuit portion DSTP2.

The display panel on signal line may receive a display panel on signal POS supplied from the timing controller 300. For example, the display panel on signal line may commonly be connected to the front dummy stage circuit portion DSTP1 and the first to mth stage circuits ST[1] to ST[m].

The sensing preparation signal line may receive a line sensing preparation signal LSPS supplied from the timing controller 300. For example, the sensing preparation signal line may commonly be connected to the first to mth stage circuits ST[1] to ST[m]. Optionally, the sensing preparation signal line may additionally be connected to the front dummy stage circuit portion DSTP1.

The gate driving voltage line GDVL may include first to fourth gate high potential voltage lines respectively receiving first to fourth gate high potential voltages having their respective voltage levels different from one another, from a power supply circuit, and first to third gate low potential voltage lines respectively receiving first to third gate low potential voltages having their respective voltage levels different from one another, from the power supply circuit.

According to one embodiment, the first gate high potential voltage may have a voltage level higher than that of the second gate high potential voltage. The third and fourth gate high potential voltages may be swung to be opposite to each other or reversed with respect to each other for alternating current driving between a high voltage (or TFT on voltage or first voltage) and a low voltage (or TFT off voltage or second voltage). For example, when the third gate high potential voltage (or gate odd high potential voltage) has a high voltage, the fourth gate high potential voltage (or gate even high potential voltage) may have a low voltage. When the third gate high potential voltage has a low voltage, the fourth gate high potential voltage may have a high voltage.

Each of the first and second gate high potential voltage lines may commonly be connected to the first to mth stage circuits ST[1] to ST[m], the front dummy stage circuit portion DSTP1 and the rear dummy stage circuit portion DSTP2.

The third gate high potential voltage line may commonly be connected to odd numbered stage circuits of the first to mth stage circuits ST[1] to ST[m], and may commonly be connected to odd numbered dummy stage circuits of each of the front dummy stage circuit portion DSTP1 and the rear dummy stage circuit portion DSTP2.

The fourth gate high potential voltage line may commonly be connected to even numbered stage circuits of the first to mth stage circuits ST[1] to ST[m], and may commonly be connected to even numbered dummy stage circuits of each of the front dummy stage circuit portion DSTP1 and the rear dummy stage circuit portion DSTP2.

According to one embodiment, the first gate low potential voltage and the second gate low potential voltage may substantially have the same voltage level. The third gate low potential voltage may have a TFT off voltage level. The first gate low potential voltage may have a voltage level higher than that of the third gate low potential voltage. In one embodiment of the present disclosure, the first gate low potential voltage may be set to a voltage level higher than that of the third gate low potential voltage, whereby an off current of a TFT having a gate electrode connected to a control node of a stage circuit, which will be described later, may certainly be cut off to make sure of stability and reliability in the operation of the corresponding TFT.

The first to third gate low potential voltage lines may commonly be connected to the first to mth stage circuits ST[1] to ST[m].

The front dummy stage circuit portion DSTP1 may be switched in accordance with the gate start signal Vst supplied from the timing controller 300 to sequentially generate a plurality of front carry signals, thereby supplying the generated front carry signals to any one of the rear stages as the front carry signals or the gate start signals.

The rear dummy stage circuit portion DSTP2 may sequentially generate a plurality of rear carry signals to supply the rear carry signals (or stage reset signals) to any one of the front stages.

The first to mth stage circuits ST[1] to ST[m] may be connected to one another to be mutually dependent upon one another. The first to mth stage circuits ST[1] to ST[m] may generate first to mth scan signals SC[1] to SC[m] and first to meth sense signals SE[1] to SE[m] and output the generated signals to the corresponding gate line group GLG disposed on the light emitting display panel 100. The first to mth stage circuits ST[1] to ST[m] may generate first to mth carry signals CS[1] to CS[m] and supply the generated signals to any one of the rear stages as the front carry signals (or gate start signals) and at the same time supply the generated signals to any one of the front stages as the rear carry signals (or stage reset signals).

Two adjacent stages ST[n] and ST[n+1] of the first to mth stage circuits ST[1] to ST[m] may mutually share some of a sensing control circuit and control nodes Qbo, Qbe, Qm, whereby circuit configuration of the gate driving circuit 500 may be simplified, and an area occupied by the gate driving circuit portion 500 in the light emitting display panel 100 may be reduced.

Figure 7:
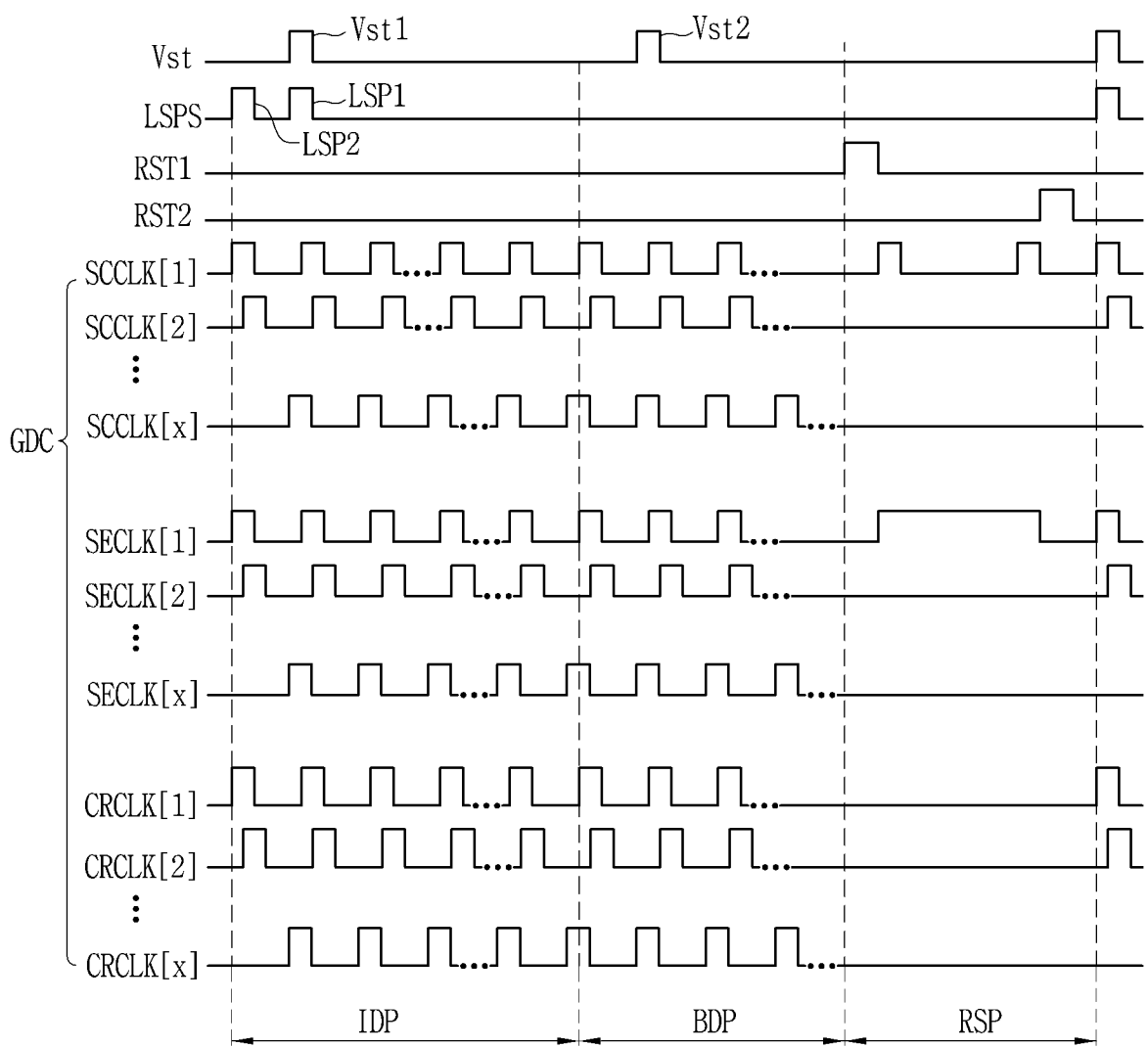
FIG. 7 is a waveform illustrating a signal applied to a gate control signal line shown in FIG. 6, and a voltage and an output signal of a control node of each of first and second stage circuits.

FIG. 7 is a waveform illustrating a signal applied to a gate control signal line shown in FIG. 6, and a voltage and an output signal of a control node of each of first and second stage circuits.

Referring to FIGS. 6 and 7, the gate control signal GCS applied to the gate control signal line according to one embodiment of the present disclosure may include a gate start signal Vst, a line sensing preparation signal LSPS, a first reset signal RST1, a second reset signal RST2, a display panel on signal POS, and a plurality of gate driving clocks GDC.

The gate start signal Vst is a signal for controlling a start timing of each of the image display period IDP and the black display period BDP of every frame, and may be generated just before each of the image display period IDP and the black display period BDP starts. For example, the gate start signal Vst may be generated twice per frame.

The gate start signal Vst according to one embodiment may include a first gate start pulse (or image display gate start pulse) Vst1 generated just before the image display period IDP starts within one frame, and a second gate start pulse (or black display gate start pulse) Vst2 generated just before the black display period BDP starts.

The line sensing preparation signal LSPS may be generated irregularly or randomly within the image display period IDP of every frame. The each of line sensing preparation signals LSPS generated per frame may be different from a start timing of one frame.

The line sensing preparation signal LSPS according to one embodiment may include a line sensing selection pulse LSP1 and a line sensing release pulse LSP2.

The line sensing selection pulse LSP1 may be a signal for selecting any one horizontal line to be sensed among a plurality of horizontal lines. The line sensing selection pulse LSP1 may be synchronized with a gate start pulse or a front carry signal supplied to any one of the stage circuits ST[1] to ST[m] as a gate start signal. For example, the line sensing selection pulse LSP1 may be expressed as a sensing line precharging control signal.

The line sensing release pulse LSP2 may be a signal for releasing line sensing for a horizontal line which is completely sensed. The line sensing release pulse LSP2 may be generated between an end timing of the sensing period RSP and a start timing of the line sensing selection pulse LSP1.

The first reset signal RST1 may be generated at the time when the sensing mode starts. The second reset signal RST2 may be generated at the time when the sensing mode ends. Optionally, the second reset signal RST2 may be omitted or equal to the first rest signal RST1.

The display panel on signal POS may be generated when the light emitting display apparatus is powered on. The display panel on signal POS may commonly be supplied to all the stage circuits embodied in the gate driving circuit 510. Therefore, all the stage circuits embodied in the gate driving circuit 510 may simultaneously be initialized or reset by the display panel on signal POS of a high voltage.

The plurality of gate driving clocks GDC may include a plurality of carry shift clocks CRCLK[1] to CRCLK[x] having their respective phases different from one another or sequentially shifted phases, a plurality of scan shift clocks SCCLK[1] to SCCLK[x] having their respective phases different from one another or sequentially shifted phases, and a plurality of sense shift clocks SECLK[1] to SECLK[x] having their respective phases different from one another or sequentially shifted phases.

The carry shift clocks CRCLK[1] to CRCLK[x] may be clock signals for generating carry signals, the scan shift clocks SCCLK[1] to SCCLK[x] may be clock signals for generating scan signals having scan pulses, and the sense shift clocks SECLK[1] to SECLK[x] may be clock signals for generating sense signals having sense pulses.

Each of the scan shift clocks SCCLK[1] to SCCLK[x] and the sense shift clocks SECLK[1] to SECLK[x] may be swung between a high voltage and a low voltage. A swing voltage width of the carry shift clocks according to one embodiment may be greater than a switching voltage width of each of the scan shift clocks SCCLK[1] to SCCLK[x] and the sense shift clocks SECLK[1] to SECLK[x].

For the display mode, each of the scan shift clocks SCCLK[1] to SCCLK[x] and the sense shift clocks SECLK[1] to SECLK[x] may be swung. For the sensing mode, a specific one SCCLK[1] of the scan shift clocks SCCLK[1] to SCCLK[x] may be swung to correspond to the third and fourth scan pulses SCP3 and SCP4 shown in FIG. 5, and the other scan shift clocks may maintain a low voltage. For the sensing mode, a specific one SECLK[1] of the sense shift clocks SECLK[1] to SECLK[x] may be swung to correspond to the second scan pulse SCP2 shown in FIG. 5, and the other sense shift clocks may maintain a low voltage. These clocks may be overlapped with one another to make sure of an enough charging time during high speed driving. High voltage periods of the adjacent clocks may be overlapped with each other as much as a period which is set.

Figure 8:
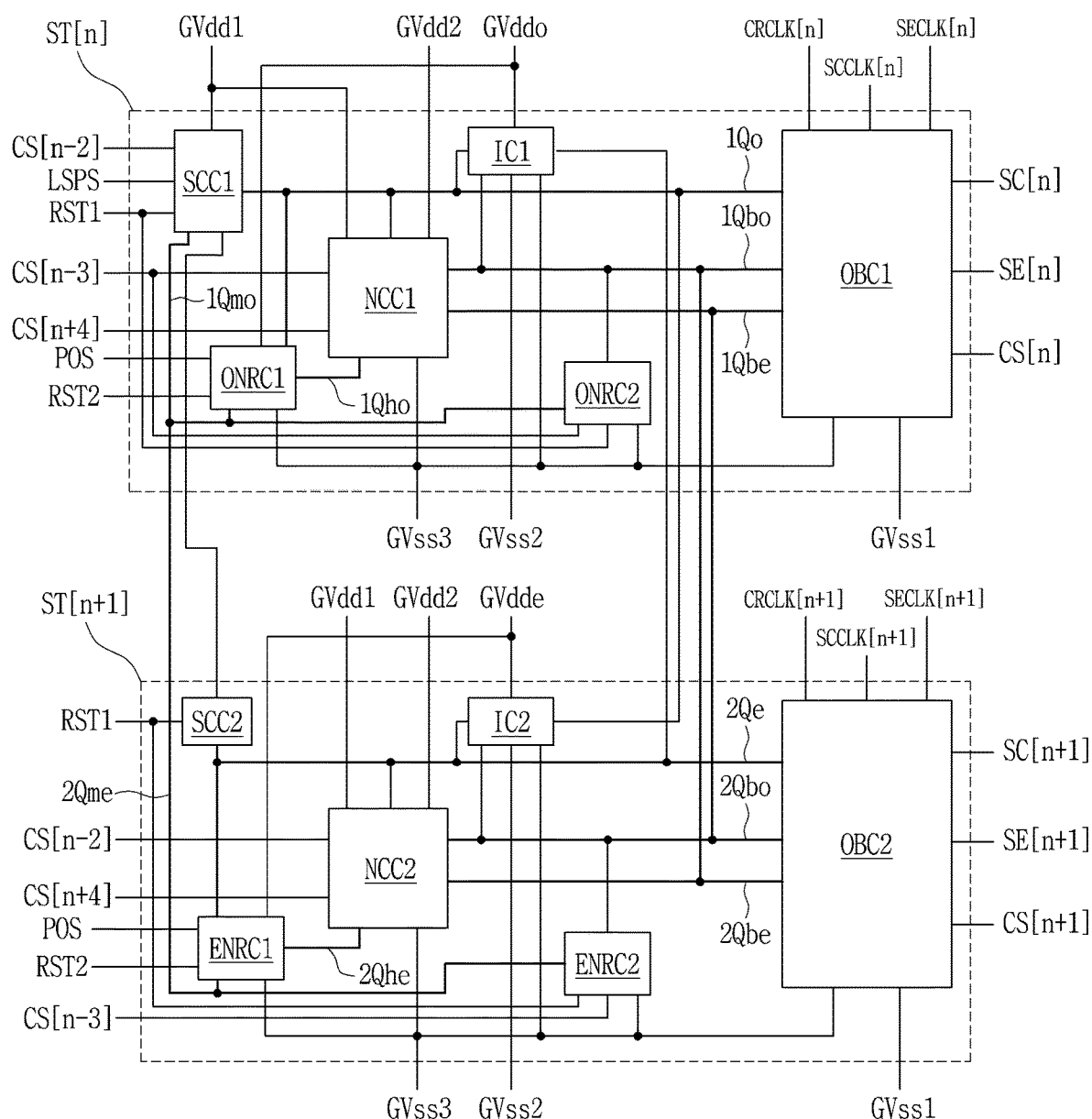
FIG. 8 is a block view illustrating an nth stage circuit and an (n+1)th stage circuit shown in FIG. 6.

FIG. 8 is a block view illustrating an nth stage circuit and an (n+1)th stage circuit shown in FIG. 6.

Referring to FIGS. 6 to 8, the nth stage circuit ST[n] may be odd numbered stage circuits of the first to mth stage circuits ST[1] to ST[m].

The nth stage circuit ST[n] according to one embodiment may include first to fifth odd control nodes 1Qo, 1Qbo, 1Qbe, 1Qho and 1Qmo, a first sensing control circuit SCC1, a first node control circuit NCC1, a first inverter circuit IC1, a first odd node reset circuit ONRC1, a second odd node reset circuit ONRC2, and a first output buffer circuit OBC1.

The first odd control node 1Qo may electrically be connected to each of the first sensing control circuit SCC1, the first node control circuit NCC1, the first inverter circuit IC1, the first odd node reset circuit ONRC1 and the first output buffer circuit OBC1.

The second odd control node 1Qbo may electrically be connected to each of the first node control circuit NCC1, the first inverter circuit IC1, the second odd node reset circuit ONRC2 and the first output buffer circuit OBC1. The second odd control node 1Qbo may electrically be connected with the (n+1)th stage circuit ST[n+1].

The third odd control node 1Qbe may electrically be connected to each of the first node control circuit NCC1 and the first output buffer circuit OBC1. The third odd control node 1Qbe may electrically be connected with the (n+1)th stage circuit ST[n+1].

The fourth odd control node 1Qho may electrically be connected to each of the first node control circuit NCC1 and the first odd node reset circuit ONRC1.

The fifth odd control node 1Qmo may electrically be connected to each of the first sensing control circuit SCC1, the second odd node reset circuit ONRC2 and the first odd node reset circuit ONRC1, and may electrically be connected with the (n+1)th stage circuit ST[n+1].

The first sensing control circuit SCC1 may be embodied to be switched in accordance with the line sensing preparation signal LSPS and the (n−2)th carry signal CS[n−2] (second front carry signal) to control the potential of the fifth odd control node 1Qmo through the first gate high potential voltage GVdd1, and may be embodied to be switched in accordance with the voltage of the fifth odd control node 1Qmo and the first reset signal RST1 to control the potential of the first odd control node 1Qo through the first gate high potential voltage GVdd1.

The first node control circuit NCC1 may be embodied to control the voltage of each of the first to third odd control nodes 1Qo, 1Qbo and 1Qbe.

The first node control circuit NCC1 may be embodied to be switched in accordance with the (n−3)th carry signal CS[n−3] (first front carry signal) to control the potential of the first odd control node 1Qo through the first gate high potential voltage GVdd1, and may be embodied to be switched in accordance with the (n+4)th carry signal CS[n+4] (or second rear carry signal) to control the potential of each of the first odd control node 1Qo and the fourth odd control node 1Qho through the third gate low potential voltage GVss3. Optionally, the first node control circuit NCC1 may be embodied to be switched in accordance with the (n+3)th carry signal CS[n+3] (or first rear carry signal) to control the potential of each of the first odd control node 1Qo and the fourth odd control node 1Qho through the third gate low potential voltage GVss3.

The first node control circuit NCC1 may be embodied to be switched in accordance with the voltage of the first odd control node 1Qo to control the potential of the fourth odd control node 1Qho through the first gate high potential voltage GVdd1. The first node control circuit NCC1 may be embodied to be switched in accordance with the voltage of the second odd control node 1Qbo or the voltage of the third odd control node 1Qbe to control the potential of each of the first odd control node 1Qo and the fourth odd control node 1Qho through the third gate low potential voltage GVss3.

The first inverter circuit IC1 may be embodied to be switched in accordance with the voltage of the first odd control node 1Qo to control the potential of the second odd control node 1Qbo through the third gate high potential voltage GVddo or the third gate low potential voltage GVss3. For example, when the potential of the first odd control node 1Qo is a high voltage or more, the first inverter circuit IC1 may control the potential of the second odd control node 1Qbo through the third gate low potential voltage GVss3. The first inverter circuit IC1 may be embodied to be switched in accordance with the voltage of the first even control node 2Qe of the (n+1)th stage circuit ST[n+1] to control the potential of the second odd control node 1Qbo through the third gate high potential voltage GVddo or the third gate low potential voltage GVss3. For example, when the potential of the first even control node 2Qe of the (n+1)th stage circuit ST[n+1] is a low voltage, the first inverter circuit IC1 may control the potential of the second odd control node 1Qbo through the third gate high potential voltage GVddo.

The first odd node reset circuit ONRC1 may be embodied to be switched in accordance with the voltage of the fifth odd control node 1Qmo, the third gate high potential voltage GVddo, the second reset signal RST2 and the display panel on signal POS to control the potential of the first odd control node 1Qo through the third gate low potential voltage GVss3. For example, the first odd node reset circuit ONRC1 may be embodied to be switched in accordance with the display panel on signal POS supplied when the light emitting display apparatus is powered on, to discharge or reset the potential of the first odd control node 1Qo through the third gate low potential voltage GVss3. The first odd node reset circuit ONRC1 may be embodied to be switched in accordance with the voltage of the fifth odd control node 1Qmo, the third gate high potential voltage GVddo and the second reset signal RST2 generated at the end timing of the sensing mode (or sensing period), to discharge or reset the potential of the first odd control node 1Qo to the third gate low potential voltage GVss3.

The second odd node reset circuit ONRC2 may be embodied to be switched in accordance with the (n−3)th carry signal CS[n−3] to control the potential of the second odd control node 1Qbo through the third gate low potential voltage GVss3. The second odd node reset circuit ONRC2 may be embodied to be switched in accordance with the voltage of the fifth odd control node 1Qmo and the first reset signal RST1 to control the potential of the second odd control node 1Qbo through the third gate low potential voltage GVss3.

The first output buffer circuit OBC1 may be embodied to be switched in accordance with the voltage of each of the first to third odd control nodes 1Qo, 1Qbo and 1Qbe to output the nth scan shift clock SCCLK[n] as the nth scan signal SC[n]. The first output buffer circuit OBC1 may be embodied to be switched in accordance with the voltage of each of the first to third odd control nodes 1Qo, 1Qbo and 1Qbe to output the nth sense shift clock SECLK[n] as the nth sense signal SE[n]. The first output buffer circuit OBC1 may be embodied to be switched in accordance with the voltage of each of the first to third odd control nodes 1Qo, 1Qbo and 1Qbe to output the nth carry shift clock CRCLK[n] as the nth carry signal CS[n].

According to one embodiment, when the potential of the first odd control node 1Qo based on coupling between a boost capacitor embodied between the first odd control node 1Qo and the output node and a clock is bootstrapped, the first output buffer circuit OBC1 may output each of the corresponding scan shift clock SCCLK[n], sense shift clock SECLK[n] and carry shift clock CRCLK[n] to a corresponding output node.

The (n+1)th stage circuit ST[n+1] according to one embodiment may be even numbered stage circuits of the first to mth stage circuits ST[1] to ST[m].

The (n+1)th stage circuit ST[n] according to one embodiment may include first to fifth even control nodes 2Qe, 2Qbo, 2Qbe, 2Qbe and 2Qme, a second sensing control circuit SCC2, a second node control circuit NCC2, a second inverter circuit IC2, a first even node reset circuit ENRC1, a second even node reset circuit ENRC2, and a second output buffer circuit OBC2.

The first even control node 2Qe may electrically be connected to each of the second sensing control circuit SCC2, the second node control circuit NCC2, the second inverter circuit IC2, the second even node reset circuit ENRC2 and the second output buffer circuit OBC2.

The second even control node 2Qbo may electrically be connected to each of the second node control circuit NCC2, the second inverter circuit IC2, the second even node reset circuit ENRC2 and the second output buffer circuit OBC2. The second even control node 2Qbo may electrically be connected with the third odd control node 1Qbe of the nth stage circuit ST[n]. Therefore, the third odd control node 1Qbe of the nth stage circuit ST[n] and the second even control node 2Qbo of the (n+1)th stage circuit ST[n+1] may be connected or shared with each other.

The third even control node 2Qbe may electrically be connected to each of the second node control circuit NCC2 and the second output buffer circuit OBC2. The third even control node 2Qbe may electrically be connected with the second odd control node 1Qbo of the nth stage circuit ST[n]. Therefore, the second odd control node 1Qbo of the nth stage circuit ST[n] and the third even control node 2Qbe of the (n+1)th stage circuit ST[n+1] may be connected or shared with each other.

The fourth even control node 2Qhe may electrically be connected to each of the second node control circuit NCC2 and the first even node reset circuit ENRC1.

The fifth even control node 2Qme may electrically be connected to each of the second even node reset circuit ENRC2 and the first even node reset circuit ENRC1, and may electrically be connected with the fifth odd control node 1Qmo of the nth stage circuit ST[n].

The second sensing control circuit SCC2 may share the potential of the fifth odd control node 1Qmo of the first sensing control circuit SCC1 embodied in the nth stage circuit ST[n]. For example, the second sensing control circuit SCC2 may share a circuit embodied to be switched in accordance with the line sensing preparation signal LSPS and the (n−2)th carry signal CS[n−2] in the first sensing control circuit SCC1 embodied in the nth stage circuit ST[n] to control the potential of the fifth odd control node 1Qmo through the first gate high potential voltage GVdd1.

The second sensing control circuit SCC2 may be embodied to be switched in accordance with the first reset signal RST1 to control the potential of the first even control node 2Qe through the first gate high potential voltage GVdd1 supplied from the first sensing control circuit SCC1 of the nth stage circuit ST[n].

The second node control circuit NCC2 may be embodied to control the voltage of each of the first to third even control nodes 2Qe, 2Qbo and 2Qbe.

The second node control circuit NCC2 may be embodied to be switched in accordance with the (n−2)th carry signal CS[n−2] to control the potential of the first even control node 2Qe through the first gate high potential voltage GVdd1, and may be embodied to be switched in accordance with the (n+4)th carry signal CS[n+4] to control the potential of each of the first even control node 2Qe and the fourth even control node 2Qhe through the third gate low potential voltage GVss3.

The second node control circuit NCC2 may be embodied to be switched in accordance with the voltage of the first even control node 2Qe to control the potential of the fourth even control node 2Qhe through the first gate high potential voltage GVdd1. The second node control circuit NCC2 may be embodied to be switched in accordance with the voltage of the second even control node 2Qbo or the voltage of the third even control node 2Qbe to control the potential of each of the first even control node 2Qe and the fourth even control node 2Qhe through the third gate low potential voltage GVss3.

The second inverter circuit IC2 may be embodied to be switched in accordance with the voltage of the first even control node 2Qe to control the potential of the second even control node 2Qbo through the fourth gate high potential voltage GVdde or the third gate low potential voltage GVss3. For example, when the potential of the first even control node 2Qe is a high voltage or more, the second inverter circuit IC2 may control the potential of the second even control node 2Qbo through the third gate low potential voltage GVss3. The second inverter circuit IC2 may be embodied to be switched in accordance with the voltage of the first odd control node 1Qo of the nth stage circuit ST[n] to control the potential of the second even control node 2Qbo through the third gate high potential voltage GVddo or the third gate low potential voltage GVss3. For example, when the potential of the first odd control node 1Qo of the nth stage circuit ST[n] is a low voltage, the second inverter circuit IC2 may control the potential of the second even control node 2Qbo through the fourth gate high potential voltage GVdde.

The first even node reset circuit ENRC1 may be embodied to be switched in accordance with the voltage of the fifth even control node 2Qme, the fourth gate high potential voltage GVdde, the second reset signal RST2 and the display panel on signal POS to control the potential of the first even control node 2Qe through the third gate low potential voltage GVss3. For example, the first even node reset circuit ENRC1 may be embodied to be switched in accordance with the display panel on signal POS to discharge or reset the potential of the first even control node 2Qe to the third gate low potential voltage GVss3. The first even node reset circuit ENRC1 may be embodied to be switched in accordance with the voltage of the fifth odd control node 1Qmo, the fourth gate high potential voltage GVdde and the second reset signal RST2 based on the operation of the first sensing control circuit SCC1 to discharge or reset the potential of the first even control node 2Qe to the third gate low potential voltage GVss3.

The second even node reset circuit ENRC2 may be embodied to be switched in accordance with the (n−3)th carry signal CS[n−3] to control the potential of the second even control node 2Qbo through the third gate low potential voltage GVss3. The second even node reset circuit ENRC2 may be embodied to be switched in accordance with the voltage of the fifth even control node 2Qme and the first reset signal RST1 to control the potential of the second even control node 2Qbo through the third gate low potential voltage GVss3.

The second output buffer circuit OBC2 may be embodied to be switched in accordance with the voltage of each of the first to third even control nodes 2Qe, 2Qbo and 2Qbe to output the (n+1)th scan shift clock SCCLK[n+1] as the (n+1)th scan signal SC[n+1]. The second output buffer circuit OBC2 may be embodied to be switched in accordance with the voltage of each of the first to third even control nodes 2Qe, 2Qbo and 2Qbe to output the (n+1)th sense shift clock SECLK[n+1] as the (n+1)th sense signal SE[n+1]. The second output buffer circuit OBC2 may be embodied to be switched in accordance with the voltage of each of the first to third even control nodes 2Qe, 2Qbo and 2Qbe to output the (n+1)th carry shift clock CRCLK[n+1] as the (n+1)th carry signal CS[n+1].

According to one embodiment, when the potential of the first even control node 2Qe based on coupling between a boost capacitor embodied between the first even control node 2Qe and the output node and a clock is bootstrapped, the second output buffer circuit OBC2 may output each of the corresponding scan shift clock SCCLK[n+1], sense shift clock SECLK[n+1] and carry shift clock CRCLK[n+1] to a corresponding output node.

In the gate driving circuit according to one embodiment of the present disclosure, some circuit that includes the fifth odd control node 1Qmo in the sensing control circuits SCC1 and SCC2 embodied in the nth stage circuit ST[n] may be shared with the (n+1)th stage circuit ST(n+1) adjacent thereto, whereby circuit configuration for the sensing mode may be simplified. In the gate driving circuit according to one embodiment of the present disclosure, the nth stage circuit ST[n] and the (n+1)th stage circuit ST[n+1], which are adjacent to each other, may mutually share the second and third control nodes 1Qbo, 1Qbe, 2Qbo and 2Qbe, which are alternately driven, whereby configuration of the inverter circuits IC1 and IC2 of the stage circuits may be simplified.

Meanwhile, for convenience of description, the aforementioned description of FIG. 8 is based on that the control node embodied in each of the nth stage circuit ST[n] and the (n+1)th stage circuit ST[n+1] is divided into the odd control node and the even control node, but is not limited thereto. For example, it is to be understood that each of the first to mth stage circuits ST[1] to ST[m] includes first to fifth control nodes.

Figure 9:
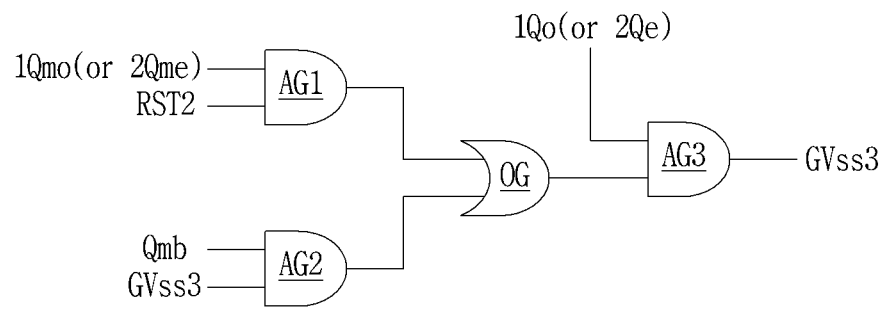
FIG. 9 is a block view illustrating a second odd node reset circuit of an nth stage circuit or a second odd node reset circuit of an (n+1)th stage circuit according to one embodiment shown in FIG. 8.

FIG. 9 is a block view illustrating a second odd node reset circuit of an nth stage circuit or a second odd node reset circuit of an (n+1)th stage circuit according to one embodiment shown in FIG. 8. In description of FIG. 9, the first odd control node 1Qo of the nth stage circuit and the first even control node 2Qe of the (n+1)th stage circuit will be referred to as the first control nodes 1Qo and 2Qe, and the fifth odd node 1Qmo of the nth stage circuit and the fifth even control node 2Qme of the (n+1)th stage circuit will be referred to as the fifth control nodes 1Qmo and 2Qme Referring to FIGS. 8 and 9, each of the first odd node reset circuit ONRC1 and the first even node reset circuit ENRC1 according to one embodiment of the present disclosure may be embodied to be switched in accordance with the voltages of the fifth control nodes 1Qmo and 2Qme and the second reset signal RST2 to stably maintain the potential of the first control nodes 1Qo and 2Qe or discharge the potential of the first control nodes 1Qo and 2Qe with the third gate low potential voltage GVss3. To this end, each of the first odd node reset circuit ONRC1 and the first even node reset circuit ENRC1 according to one embodiment may include a first logic AND circuit AG1, a second logic AND circuit AG2, a logic OR circuit OG, and a third logic AND circuit AG3.

The first logic AND circuit AG1 may include a first input terminal connected to the fifth control nodes 1Qmo and 2Qme, a second input terminal connected to the second reset signal line, and an output terminal connected to the first logic AND circuit AG1. In some embodiments, the first logic AND circuit AG1 may output a high voltage or may electrically connect the second reset signal line with the output terminal only when the voltage of the fifth control nodes 1Qmo and 2Qme is a high voltage and the second reset signal RST2 supplied through the second reset signal line is a high voltage.

The second logic AND circuit AG2 may include a first input terminal connected to an inversion node Qmb having a voltage level inverted to the voltage of the fifth control nodes 1Qmo and 2Qme, a second input terminal connected to the third gate low potential voltage line, and an output terminal connected to the first logic AND circuit AG1. In some embodiments, the second logic AND circuit AG2 may output a low voltage or may electrically connect the third gate low potential voltage line with the output terminal only when the voltage of the inversion node Qmb is a high voltage in accordance with the low voltage of the fifth control nodes 1Qmo and 2Qme.

The logic OR circuit OG may include a first input terminal connected to the output terminal of the first logic AND circuit AG1, a second input terminal connected to the output terminal of the second logic AND circuit AG2, and an output terminal connected to the third logic AND circuit AG3. The logic OR circuit OG may output a high voltage or may electrically connect the second reset signal line with the output terminal when it is supplied with the high voltage from the output terminal of the first logic AND circuit AG1 or electrically connected to the second reset signal line through the first logic AND circuit AG1.

The third logic AND circuit AG3 may include a first input terminal connected to the first control nodes 1Qo and 2Qe, a second input terminal connected to the output terminal of the logic OR circuit OG, and an output terminal connected to the third gate low potential voltage line. The third logic AND circuit AG3 may electrically connect the first control nodes 1Qo and 2Qe to the third gate low potential voltage line when it is supplied with the high voltage from the output terminal of the logic OR circuit OG or electrically connected to the second reset signal line through the logic OR gate OG and the first logic AND circuit AG1, or the voltages of the first control nodes 1Qo and 2Qe are high voltages.

Each of the first odd node reset circuit ONRC1 and the first even node reset circuit ENRC1 according to one embodiment may discharge or reset the potential of the first control nodes 1Qo and 2Qe to the third gate low potential voltage by electrically connecting the first control nodes 1Qo and 2Qe to the third gate low potential voltage line in accordance with the high voltage of the fifth control nodes 1Qmo and 2Qme and the high voltage of the second reset signal RST2. Also, each of the first odd node reset circuit ONRC1 and the first even node reset circuit ENRC1 according to one embodiment may prevent current leakage of the first control nodes 1Qo and 2Qe from occurring by electrically disconnecting the first control nodes 1Qo and 2Qe from the third gate low potential voltage line in accordance with the low voltage of the fifth control nodes 1Qmo and 2Qme and the low voltage of the second reset signal RST2, thereby stably maintaining the voltage charged in the first control nodes 1Qo and 2Qe.

Figure 10:
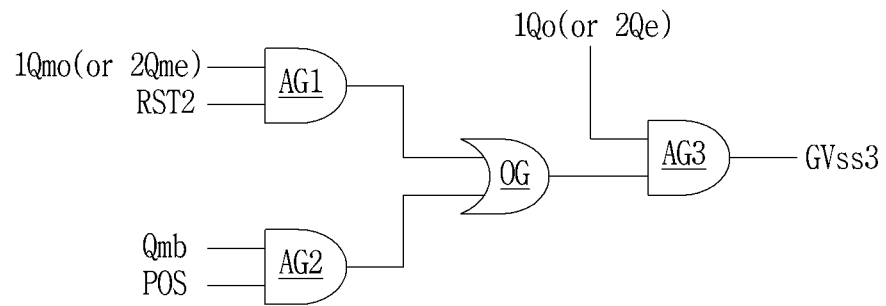
FIG. 10 is a block view illustrating a second odd node reset circuit of an nth stage circuit or a second odd node reset circuit of an (n+1)th stage circuit according to another embodiment shown in FIG. 8.

FIG. 10 is a block view illustrating a second odd node reset circuit of an nth stage circuit or a second odd node reset circuit of an (n+1)th stage circuit according to another embodiment shown in FIG. 8. In description of FIG. 10, the first odd control node 1Qo of the nth stage circuit and the first even control node 2Qe of the (n+1)th stage circuit will be referred to as the first control nodes 1Qo and 2Qe, and the fifth odd node 1Qmo of the nth stage circuit and the fifth even control node 2Qme of the (n+1)th stage circuit will be referred to as the fifth control nodes 1Qmo and 2Qme Referring to FIGS. 8 and 10, each of the first odd node reset circuit ONRC1 and the first even node reset circuit ENRC1 according to another embodiment of the present disclosure may be embodied to be switched in accordance with the voltages of the fifth control nodes 1Qmo and 2Qme and the second reset signal RST2 to stably maintain the potential of the first control nodes 1Qo and 2Qe or discharge the potential of the first control nodes 1Qo and 2Qe with the third gate low potential voltage GVss3. To this end, each of the first odd node reset circuit ONRC1 and the first even node reset circuit ENRC1 according to another embodiment may include a first logic AND circuit AG1, a second logic AND circuit AG2, a logic OR circuit OG, and a third logic AND circuit AG3.

The first logic AND circuit AG1 may include a first input terminal connected to the fifth control nodes 1Qmo and 2Qme, a second input terminal connected to the second reset signal line, and an output terminal connected to the first logic AND circuit AG1. In some embodiments, the first logic AND circuit AG1 may output a high voltage or may electrically connect the second reset signal line with the output terminal only when the voltage of the fifth control nodes 1Qmo and 2Qme is a high voltage and the second reset signal RST2 supplied through the second reset signal line is a high voltage.

The second logic AND circuit AG2 may include a first input terminal connected to an inversion node Qmb having a voltage level inverted to the voltage of the fifth control nodes 1Qmo and 2Qme, a second input terminal connected to the display panel on signal line, and an output terminal connected to the first logic AND circuit AG1. In some embodiments, the second logic AND circuit AG2 may output a high voltage or may electrically connect the display panel on signal line with the output terminal only when the voltage of the inversion node Qmb is a high voltage in accordance with the low voltage of the fifth control nodes 1Qmo and 2Qme and the display panel on signal POS supplied through the display panel on signal line is a high voltage.

The logic OR circuit OG may include a first input terminal connected to the output terminal of the first logic AND circuit AG1, a second input terminal connected to the output terminal of the second logic AND circuit AG2, and an output terminal connected to the third logic AND circuit AG3. The logic OR circuit OG may output a high voltage or may electrically connect the display panel on signal line with the output terminal when it is supplied with the high voltage from the output terminal of the first logic AND circuit AG1 or electrically connected to the display panel on signal line through the first logic AND circuit AG1.

The third logic AND circuit AG3 may include a first input terminal connected to the first control nodes 1Qo and 2Qe, a second input terminal connected to the output terminal of the logic OR circuit OG, and an output terminal connected to the third gate low potential voltage line. The third logic AND circuit AG3 may electrically connect the first control nodes 1Qo and 2Qe to the third gate low potential voltage line when it is supplied with the high voltage from the output terminal of the logic OR circuit OG or electrically connected to the display panel on signal line through the logic OR gate OG and the first logic AND circuit AG1, or the voltages of the first control nodes 1Qo and 2Qe are high voltages.

Each of the first odd node reset circuit ONRC1 and the first even node reset circuit ENRC1 according to another embodiment may discharge or reset the potential of the first control nodes 1Qo and 2Qe to the third gate low potential voltage by electrically connecting the first control nodes 1Qo and 2Qe to the third gate low potential voltage line in accordance with the high voltage of the fifth control nodes 1Qmo and 2Qme and the high voltage of the second reset signal RST2. Also, each of the first odd node reset circuit ONRC1 and the first even node reset circuit ENRC1 according to another embodiment may prevent current leakage of the first control nodes 1Qo and 2Qe from occurring by electrically disconnecting the first control nodes 1Qo and 2Qe from the third gate low potential voltage line in accordance with the low voltage of the fifth control nodes 1Qmo and 2Qme and the low voltage of the display panel on signal POS, thereby stably maintaining the voltage charged in the first control nodes 1Qo and 2Qe. Also, each of the first odd node reset circuit ONRC1 and the first even node reset circuit ENRC1 according to another embodiment may prevent current leakage of the first control nodes 1Qo and 2Qe from occurring by electrically disconnecting the first control nodes 1Qo and 2Qe from the third gate low potential voltage line in accordance with the low voltage of the fifth control nodes 1Qmo and 2Qme and the low voltage of the display panel on signal POS, thereby stably maintaining the voltage charged in the first control nodes 1Qo and 2Qe.

Figure 11:
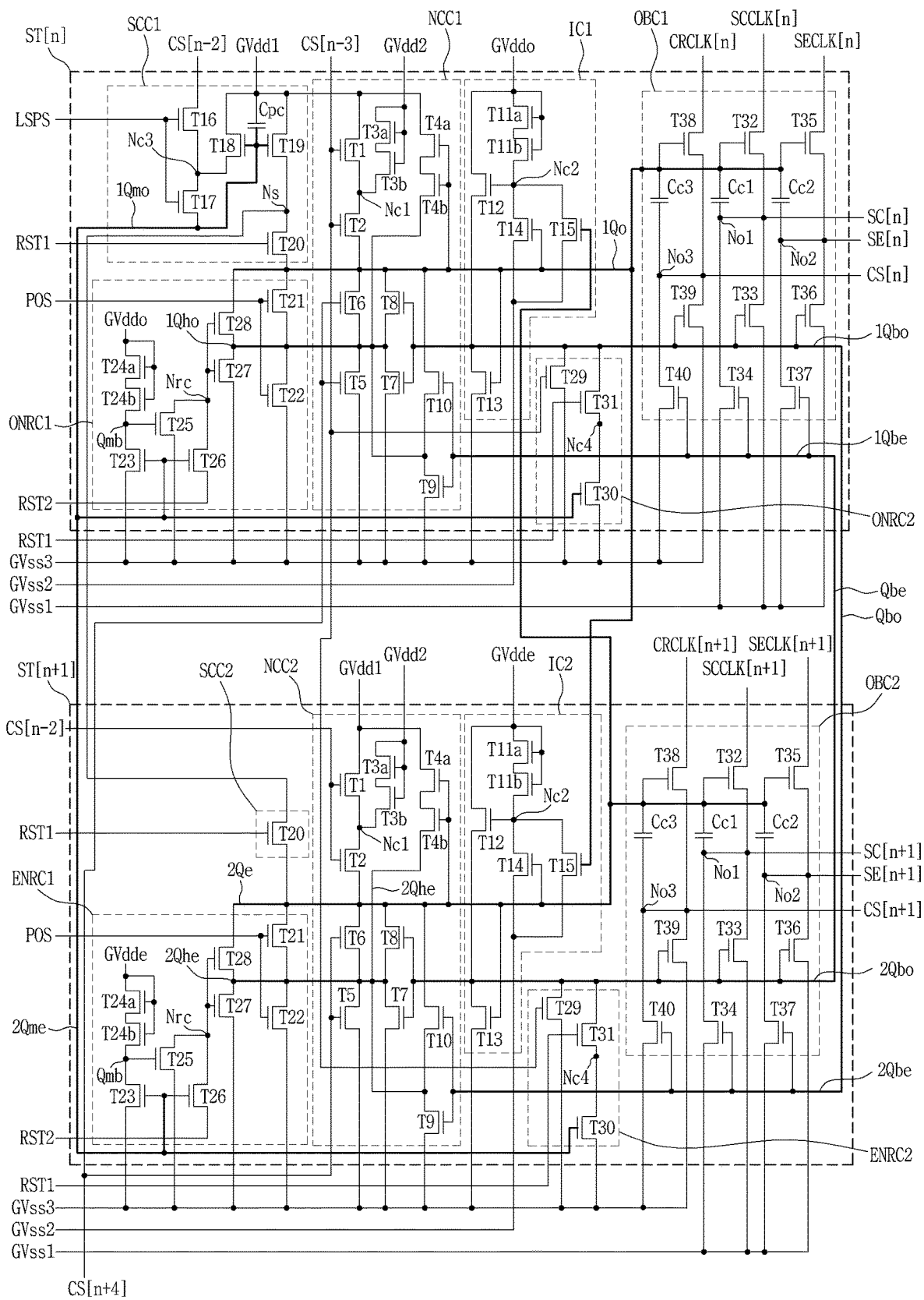
FIG. 11 is a circuit view illustrating an nth stage circuit and an (n+1)th stage circuit according to one embodiment of the present disclosure shown in FIG. 8.

FIG. 11 is a circuit view illustrating an nth stage circuit and an (n+1)th stage circuit according to one embodiment of the present disclosure shown in FIG. 8.

Referring to FIGS. 7, 8 and 11, the nth stage circuit ST[n] according to one embodiment of the present disclosure may include a first sensing control circuit SCC1, a first node control circuit NCC1, a first inverter circuit IC1, a first odd node reset circuit ONRC1, a second odd node reset circuit ONRC2 and a first output buffer circuit OBC1, which are selectively connected to the first to fifth odd control nodes 1Qo, 1Qbo, 1Qbe, 1Qho and 1Qmo.

The first node control circuit NCC1 according to one embodiment may include first to tenth TFTs T1 to T10.

The first to fourth TFTs T1, T2, T3a, T3b, T4a and T4b serve to control or setup the potential of the first odd control node 1Qo, and thus may be expressed as first node setup circuits.

The first TFT T1 and the second TFT T2 may be embodied to be electrically connected between the first gate high potential voltage line for transferring the first gate high potential voltage GVdd1 and the first odd control node 1Qo in series and switched in accordance with the (n−3)th carry signal CS[n−3] to charge the first gate high potential voltage GVdd1 in the first odd control node 1Qo.

The first TFT T1 may be switched in accordance with the (n−3)th carry signal CS[n−3] supplied through a front carry input line to output the first gate high potential voltage GVdd1 to a first connection node Nc1. For example, the first TFT T1 may be turned on in accordance with the (n−3)th carry signal CS[n−3] of a high voltage to output the first gate high potential voltage GVdd1 to the first connection node Nc1.

The second TFT T2 may be switched in accordance with the (n−3)th carry signal CS[n−3] to electrically connect the first connection node Nc1 to the first odd control node 1Qo. For example, the second TFT T2 may be turned on in accordance with the (n−3)th carry signal CS[n−3] of a high voltage simultaneously with the first TFT T1 to supply the first gate high potential voltage GVdd1 supplied through the first connection node Nc1 to the first odd control node 1Qo.

The third TFTs T3a and T3b may be switched in accordance with the second gate high potential voltage GVdd2 to supply the second gate high potential voltage GVdd2 to the first connection node Nc1. For example, the third TFTs T3a and T3b may be turned on in accordance with the second gate high potential voltage GVdd2 to at least partially or always supply the second gate high potential voltage GVdd2 to the first connection node Nc1 between the first TFT T1 and the second TFT T2, thereby preventing off current of the first TFT T1 and current leakage of the first odd control node 1Qo from occurring. For example, the third TFTs T3a and T3b may completely turn off the first TFT T1 turned off by the (n−3)th carry signal CS[n−3] having a low voltage by increasing a voltage difference between the gate voltage of the first TFT T1 and the first connection node Nc1. As a result, voltage drop (or current leakage) of the first odd control node 1Qo by off current of the first TFT T1 which is turned off may be prevented from occurring, whereby the voltage of the first odd control node 1Qo may stably be maintained. For example, when the threshold voltage of the first TFT T1 has a negative polarity (−), the gate-source voltage Vgs of the first TFT T1 may be fixed to the negative polarity (−) by the second gate high potential voltage GVdd2 supplied to the drain electrode. For this reason, the first TFT T1 which is turned off may become a complete off state, whereby current leakage based on the off current may be prevented from occurring.

The second gate high potential voltage GVdd2 is set to a voltage level lower than the first gate high potential voltage GVdd1. Resistance of the second gate high potential voltage GVdd2 is set to be higher than that of the first gate high potential voltage GVdd1 to reduce a voltage drop of the first gate high potential voltage GVdd1. The second gate high potential voltage line for supplying the second gate high potential voltage GVdd2 may be used as a path through which a leakage current of the third TFTs T3a and T3b flows, whereby the voltage drop of the first gate high potential voltage GVdd1 may be reduced. Therefore, in one embodiment of the present disclosure, the first gate high potential voltage line and the second gate high potential voltage line may be detached from each other to independently configure voltage drop components of the first gate high potential voltage line and the second gate high potential voltage line, whereby the voltage drop of the first gate high potential voltage line may be reduced or minimized. As a result, an error operation of the gate driving circuit, which is generated due to the voltage drop of the first gate high potential voltage line, may be avoided.

The third TFTs T3a and T3b according to one embodiment may include (3-1)th and (3-2)th TFTs T3a and T3b electrically connected with each other in series between the second gate high potential voltage line and the first connection node Nc1 to prevent the leakage current due to the off current from occurring.

The (3-1)th TFT T3a may be turned on by the second gate high potential voltage GVdd2 to supply the second gate high potential voltage GVdd2 to the (3-2)th TFT T3b. For example, the (3-1)th TFT T3a may be connected to the second gate high potential voltage line in the form of diode.

The (3-2)th TFT T3b may be turned on by the second gate high potential voltage GVdd2 simultaneously with the (3-1)th TFT T3a to supply the second gate high potential voltage GVdd2 supplied through the (3-1)th TFT T3a, to the first connection node Nc1.

The fourth TFTs T4a and T4b may be switched in accordance with the first odd control node 1Qo to supply the first gate high potential voltage GVdd1 to the fourth odd control node 1Qho. For example, the fourth TFTs T4a and T4b may be turned on in accordance with the high voltage of the first odd control node 1Qo to supply the first gate high potential voltage GVdd1 to the fourth odd control node 1Qho.

The fourth TFTs T4a and T4b according to one embodiment may include (4-1)th and (4-2)th TFTs T4a and T4b electrically connected with each other in series between the first gate high potential voltage line and the fourth odd control node 1Qho to prevent the leakage current due to the off current from occurring.

The (4-1)th TFT T4a may be turned on by the high voltage of the first odd control node 1Qo to supply the first gate high potential voltage GVdd1 to the (4-2)th TFT T4b.

The (4-2)th TFT T4b may be turned on by the high voltage of the first odd control node 1Qo simultaneously with the (4-1)th TFT T4a to supply the first gate high potential voltage GVdd1 supplied through the (4-1)th TFT T4a, to the fourth odd control node 1Qho.

The fifth and sixth TFTs T5 and T6 may be embodied to be switched in accordance with the (n+4)th carry signal CS[n+4] to control the potential of each of the first odd control node 1Qo and the fourth odd control node 1Qho through the third gate low potential voltage GVss3. The fifth and sixth TFTs T5 and T6 may be expressed as first odd discharge circuits.

The fifth TFT T5 may be embodied to be switched in accordance with the (n+4)th carry signal CS[n+4] to control the potential of the fourth odd control node 1Qho through the third gate low potential voltage GVss3. For example, the fifth TFT T5 may be turned on in accordance with the (n+4)th carry signal CS[n+4] of a high voltage to discharge or reset the potential of the fourth odd control node 1Qho to the third gate low potential voltage GVss3.

The sixth TFT T6 may be switched in accordance with the (n+4)th carry signal CS[n+4] to electrically connect the first odd control node 1Qo with the fourth odd control node 1Qho. For example, the sixth TFT T6 may be turned on in accordance with the (n+4)th carry signal CS[n+4] of a high voltage simultaneously with the fifth TFT T5 to supply the third gate low potential voltage GVss3 supplied through the fifth TFT T5 and the fourth odd control node 1Qho, to the first odd control node 1Qo, thereby discharging or resetting the potential of the first odd control node 1Qo to the third gate low potential voltage GVss3.

The fourth odd control node 1Qho between the fifth TFT T5 and the sixth TFT T6 may be supplied with the first gate high potential voltage GVdd1 through the fourth TFTs T4a and T4b. Therefore, the fourth TFTs T4a and T4b may completely turn off the sixth TFT T6 turned off by the (n+4)th carry signal CS[n+4] of a low voltage by increasing a voltage difference between the gate voltage of the sixth TFT T6 and the fourth odd control node 1Qho. As a result, a voltage drop (or current leakage) of the first odd control node 1Qo through the sixth TFT T6 which is turned off may be prevented from occurring, whereby the voltage of the first odd control node 1Qo may stably be maintained.

The seventh and eighth TFTs T7 and T8 may be embodied to be switched in accordance with the voltage of the second odd control node 1Qbo to control the potential of each of the first odd control node 1Qo and the fourth odd control node 1Qho through the third gate low potential voltage GVss3. The seventh and eighth TFTs T7 and T8 may be expressed as second odd discharge circuits.

The seventh TFT T7 may be embodied to be switched in accordance with the voltage of the second odd control node 1Qbo to control the potential of the fourth odd control node 1Qho through the third gate low potential voltage GVss3. For example, the seventh TFT T7 may be turned on in accordance with the high voltage of the second odd control node 1Qbo to discharge or reset the potential of the fourth odd control node 1Qho to the third gate low potential voltage GVss3.

The eighth TFT T8 may be switched in accordance with the voltage of the second odd control node 1Qbo to electrically connect the first odd control node 1Qo with the fourth odd control node 1Qho. For example, the eighth TFT T8 may be turned on by the high voltage of the second odd control node 1Qbo simultaneously with the seventh TFT T7 to supply the third gate low potential voltage GVss3 supplied through the seventh TFT T7 and the fourth odd control node 1Qho, to the first odd control node 1Qo, thereby discharging or resetting the potential of the first odd control node 1Qo to the third gate low potential voltage GVss3.

The fourth odd control node 1Qho between the seventh TFT T7 and the eighth TFT T8 may be supplied with the first gate high potential voltage GVdd1 through the fourth TFTs T4a and T4b. Therefore, the fourth TFTs T4a and T4b may completely turn off the eighth TFT T8 turned off by the (n+4)th carry signal CS[n+4] of a low voltage by increasing a voltage difference between the gate voltage of the eighth TFT T8 and the fourth odd control node 1Qho. As a result, a voltage drop (or current leakage) of the first odd control node 1Qo through the eighth TFT T8 which is turned off may be prevented from occurring, whereby the voltage of the first odd control node 1Qo may stably be maintained.

The ninth and tenth TFTs T9 and T10 may be embodied to be switched in accordance with the voltage of the third odd control node 1Qbe to control the potential of each of the first odd control node 1Qo and the fourth odd control node 1Qho through the third gate low potential voltage GVss3. The ninth and tenth TFTs T9 and T10 may be expressed as third odd discharge circuits.

The ninth TFT T9 may be embodied to be switched in accordance with the voltage of the third odd control node 1Qbe to control the potential of the fourth odd control node 1Qho through the third gate low potential voltage GVss3. For example, the ninth TFT T9 may be turned on in accordance with the high voltage of the third odd control node 1Qbe to discharge or reset the potential of the fourth odd control node 1Qho to the third gate low potential voltage GVss3.

The tenth TFT T10 may be switched in accordance with the voltage of the third odd control node 1Qbe to electrically connect the first odd control node 1Qo with the fourth odd control node 1Qho. For example, the tenth TFT T10 may be turned on by the high voltage of the third odd control node 1Qbe simultaneously with the ninth TFT T9 to supply the third gate low potential voltage GVss3 supplied through the ninth TFT T9 and the fourth odd control node 1Qho, to the first odd control node 1Qo, thereby discharging or resetting the potential of the first odd control node 1Qo to the third gate low potential voltage GVss3.

The fourth odd control node 1Qho between the ninth TFT T9 and the tenth TFT T10 may be supplied with the first gate high potential voltage GVdd1 through the fourth TFTs T4a and T4b. Therefore, the fourth TFTs T4a and T4b may completely turn off the tenth TFT T10 turned off by the (n+4)th carry signal CS[n+4] of a low voltage by increasing a voltage difference between the gate voltage of the tenth TFT T10 and the fourth odd control node 1Qho. As a result, a voltage drop (or current leakage) of the first odd control node 1Qo through the tenth TFT T10 which is turned off may be prevented from occurring, whereby the voltage of the first odd control node 1Qo may stably be maintained.

The first inverter circuit IC1 according to one embodiment may include 11th to 15th TFTs T11a, T11b, T12, T13, T14 and T15.

The 11th TFTs T11a and T11b may be switched by the third gate high potential voltage GVddo to supply the third gate high potential voltage GVddo to a second connection node Nc2. The 11th TFTs T11a and T11b according to one embodiment may include (11-1)th and (11-2)th TFTs T11a and T11b electrically connected with each other in series between the third gate high potential voltage line and the second connection node Nc2 to prevent the leakage current due to the off current from occurring.

The (11-1)th TFT T11a may be turned on by the third gate high potential voltage GVddo to supply the third gate high potential voltage GVddo to the (11-2)th TFT T11b. For example, the (11-1)th TFT T11a may be connected to the third gate high potential voltage line in the form of diode.

The (11-2)th TFT T11b may be turned on by the third gate high potential voltage GVddo simultaneously with the (11-1)th TFT T11a to supply the third gate high potential voltage GVddo supplied through the (11-1)th TFT T11a, to the second connection node Nc2.

The 12th TFT T12 may be turned on or turned off in accordance with a voltage of the second connection node Nc2, and may supply the third gate high potential voltage GVddo to the second odd control node 1Qbo when it is turned on.

The 13th TFT T13 may be turned on or turned off in accordance with the voltage of the first odd control node 1Qo, and may discharge or reset the potential of the second odd control node 1Qbo to the third gate low potential voltage GVss3 when it is turned on.

The 14th TFT T14 may be turned on or turned off in accordance with the voltage of the first odd control node 1Qo, and may discharge or reset the potential of the second connection node Nc2 to the second gate low potential voltage GVss2 when it is turned on.

The 15th TFT T15 may be turned on or turned off in accordance with the voltage of the first even control node 2Qe of the (n+1)th stage circuit ST[n+1], and may discharge or reset the potential of the second connection node Nc2 to the second gate low potential voltage GVss2 when it is turned on.

The first sensing control circuit SCC1 according to one embodiment may include 16th to 20th TFTs T16 to T20, and a precharging capacitor Cpc.

The 16th to 18th TFTs T16 to T18 and the precharging capacitor Cpc may be embodied to be switched in accordance with the line sensing preparation signal LSPS and the (n-2)th carry signal CS[n-2] to control the fifth odd control node 1Qmo through the (n-2)th carry signal CS[n-2]. The 16th to 18th TFTs T16 to T18 and the precharging capacitor Cpc may be expressed as line sensing preparation circuits or line sensing precharging circuits for precharging the voltage of the fifth odd control node 1Qmo in the display mode. For example, the fifth odd control node 1Qmo may be expressed as a memory node or precharging node for the sensing mode.

The 16th TFT T16 may be switched in accordance with the line sensing preparation signal LSPS to output the (n-2)th carry signal CS[n-2] to a third connection node Nc3. For example, in the image display mode, the 16th TFT T16 may be turned on in accordance with the line sensing selection pulse LSP1 transferred through the sensing preparation signal line, to output the (n-2)th carry signal CS[n-2] of a high voltage synchronized with the line sensing selection pulse LSP1 to the third connection node Nc3. In the image display mode, the 16th TFT T16 may be turned on in accordance with the line sensing release pulse LSP2 transferred through the sensing preparation signal line, to output the (n-2)th carry signal CS[n-2] of a low voltage to the third connection node Nc3.

The 17th TFT T17 may be switched in accordance with the line sensing preparation signal LSPS to electrically connect the third connection node Nc3 with the fifth odd control node 1Qmo. For example, the 17th TFT T17 may be turned on in accordance with the line sensing preparation signal LSP of a high voltage simultaneously with the 16th TFT T16 to supply the (n-2)th carry signal CS[n-2] supplied through the 17th TFT T17 and the third connection node Nc3, to the fifth odd control node 1Qmo. The third connection node Nc3 may be a connection line between the 16th TFT T16 and the 17th TFT T17.

The 18th TFT T18 may be switched in accordance with the voltage of the fifth odd control node 1Qmo to supply the first gate high potential voltage GVdd1 to the third connection node Nc3. For example, the 18th TFT T18 may be turned on in accordance with the high voltage of the fifth odd control node 1Qmo to supply the first gate high potential voltage GVdd1 to the third connection node Nc3, thereby preventing a voltage leakage of the fifth odd control node 1Qmo from occurring. For example, the 18th TFT T18 may turn off the 16th TFT T16 turned off by the line sensing preparation signal LSPS of a low voltage by increasing a voltage difference between the gate voltage of the 16th TFT T16 and the third connection control node Nc3. As a result, a voltage drop (or current leakage) of the fifth odd control node 1Qmo through the 16th TFT T16 which is turned off may be prevented from occurring, whereby the voltage of the fifth odd control node 1Qmo may stably be maintained.

The precharging capacitor Cpc may be formed between the fifth odd control node 1Qmo and the first gate high potential voltage line to store a differential voltage between the voltage of the fifth odd control node 1Qmo and the first gate high potential voltage GVdd1. For example, a first electrode of the precharging capacitor Cpc may electrically be connected with the fifth odd control node 1Qmo connected to a gate electrode of the 18th TFT T18, and a second electrode of the precharging capacitor Cpc may electrically be connected with the fifth gate high potential voltage line. The precharging capacitor Cpc stores the high voltage of the (n-2)th carry signal CS[n-2] in accordance with turn-on of the 16th, 17th and 18th TFTs T16, T17 and T18, and maintains the voltage of the fifth odd control node 1Qmo for a certain time period by the voltage stored when the 16th, 17th and 18th TFTs T16, T17 and T18 are turned off. For example, the voltage of the fifth odd control node 1Qmo may be maintained until the 16th and 17th TFTs T16 and T17 are again turned on by the line sensing release pulse LSP2 of the line sensing preparation signal LSPS.

The 19th and 20th TFTs T19 and T20 may be embodied to be switched in accordance with the voltage of the fifth odd control node 1Qmo and the first reset signal RST1 to control the potential of the first odd control node 1Qo through the first gate high potential voltage GVdd1. The 19th and 20th TFTs T19 and T20 may be expressed as sensing line selection circuits.

The 19th TFT T19 may be switched in accordance with the voltage of the fifth odd control node 1Qmo to output the first gate high potential voltage GVdd1 to a sharing node Ns. For example, the 19th TFT T19 may be turned on in accordance with the high voltage of the fifth odd control node 1Qmo precharged with the first gate high potential voltage GVdd1 to supply the first gate high potential voltage GVdd1 to the sharing node Ns.

The 20th TFT T20 may be switched in accordance with the first reset signal RST1 to electrically connect the 19th TFT T19 to the first odd control node 1Qo. For example, the 20th TFT T20 may be turned on in accordance with the first reset signal RST1 of the high voltage to supply the first gate high potential voltage GVdd1 supplied through the 19th TFT T19 and the sharing node Ns, to the first odd control node 1Qo, thereby charging the first gate high potential voltage GVdd1 in the first odd control node 1Qo to activate the first odd control node 1Qo.

Optionally, the first sensing control circuit SCC1 may be omitted. That is, since the first sensing control circuit SCC1 is a circuit used to sense driving characteristics in accordance with the sensing mode, if the pixel is not driven in the sensing mode, the first sensing control circuit SCC1 is an unnecessary element and thus may be omitted.

The first odd node reset circuit ONRC1 according to one embodiment may include 21st to 28th TFTs T21 to T28.

The 21st and 22nd TFTs T21 and T22 may be embodied to be switched in accordance with the display panel on signal POS supplied when the light emitting display apparatus is powered on, thereby discharging or resetting the potential of the first odd control node 1Qo to the third gate low potential voltage GVss3. The 21st and 22nd TFTs T21 and T22 may be expressed as first stage initialization circuits or (1-1)th node discharge circuits.

The 21st TFT (or first power on reset TFT) T21 may be switched in accordance with the display panel on signal POS to supply the third gate low potential voltage GVss3 supplied through the third gate low potential voltage line, to the fourth odd control node 1Qho. For example, the 21st TFT T21 may be turned on in accordance with the display panel on signal POS of the high voltage to discharge or reset the potential of the fourth odd control node 1Qo to the third gate low potential voltage GVss3.

The 22nd TFT (or second power on reset TFT) T22 may be switched in accordance with the display panel on signal POS to electrically connect the first odd control node 1Qo with the fourth odd control node 1Qho. For example, the 22nd TFT T22 may be turned on in accordance with the display panel on signal POS of the high voltage simultaneously with the 21st TFT T21 to supply the third gate low potential voltage GVss3 supplied through the 21st TFT T21 and the fourth odd control node 1Qho, to the first odd control node 1Qo, thereby charging or resetting the potential of the first odd control node 1Qo to the third gate low potential voltage GVss3.

The fourth odd control node 1Qho between the 21st TFT T21 and the 22nd TFT T22 may be supplied with the first gate high potential voltage GVdd1 through the fourth TFTs T4a and T4b of the first control circuit NCC1. Therefore, the fourth TFTs T4a and T4b may completely turn off the 21st TFT T21 turned off by the display panel on signal POS of the low voltage by increasing a voltage difference between a gate voltage of the 21st TFT T21 and the fourth odd control node 1Qho. As a result, a voltage drop (or current leakage) of the first odd control node 1Qo through the 21st TFT T21 which is turned off may be prevented from occurring, whereby the voltage of the first odd control node 1Qo may stably be maintained.

The 23rd to 28th TFTs T23 to T28 may stably maintain the charging voltage of the first odd control node 1Qo, and may be embodied to be switched in accordance with the second reset signal RST2 generated at the end timing of the sensing mode to discharge the potential of the first odd control node 1Qo, and may be expressed as first node voltage sustain/discharge circuits. For example, the 23rd to 28th TFTs T23 to T28 may be expressed as first to sixth reset TFTs, respectively.

The 23rd TFT (or first reset TFT) T23 may be embodied to be switched in accordance with the voltage of the fifth odd control node 1Qmo to control an inversion node (or voltage inversion node) Qmb of the fifth odd control node 1Qmo through the third gate low potential voltage GVss3. For example, the 23rd TFT T23 may be turned on in accordance with the high voltage of the fifth odd control node 1Qmo to discharge or reset the inversion node Qmb of the fifth odd control node 1Qmo to the third gate low potential voltage GVss3.

The 24th TFTs (or second reset TFTs) T24a and T24b may be turned on in accordance with the third gate high potential voltage GVddo to at least partially or always supply the third gate high potential voltage GVddo to the inversion node Qmb of the fifth odd control node 1Qmo. The 24th TFTs T24a and T24b according to one embodiment may include (24-1)th and (24-2)th TFTs T24a and T24b electrically connected with each other in series between the third gate high potential voltage line and the inversion node Qmb of the fifth odd control node 1Qmo to prevent the leakage current due to the off current from occurring. At this time, the (24-1)th TFT T24a may be connected to the third gate high potential voltage line in the form of diode. The (24-2)th TFT T24b may be turned on by the third gate high potential voltage GVddo simultaneously with the (24-1)th TFT T24a to supply the third gate high potential voltage GVddo supplied through the (24-1)th TFT T24a, to the inversion node Qmb of the fifth odd control node 1Qmo.

The 25th TFT (or third reset TFT) T25 may be embodied to be switched in accordance with the inversion node Qmb of the fifth odd control node 1Qmo to control the reset control node Nrc through the third gate low potential voltage GVss3. For example, the 25th TFT T25 may be turned on in accordance with the high voltage of the inversion node Qmb of the fifth odd control node 1Qmo to discharge or reset the reset control node Nrc to the third gate low potential voltage GVss3. In this case, the reset control node Nrc may embody the logic OR circuit OG shown in FIG. 9.

The 23rd TFT T23, the 24th TFTs T24a and T24b and the 25th TFT T25 may embody the second logic AND circuit AG2 shown in FIG. 9.

The 26th TFT (or fourth reset TFT) T26 may be embodied to be switched in accordance with the voltage of the fifth odd control node 1Qmo to supply the second reset signal RST2 to the reset control node Nrc. For example, the 26th TFT T26 may be turned on in accordance with the high voltage of the fifth odd control node 1Qmo to supply the second reset signal RST2 to the reset control node Nrc. The 26th TFT T26 may embody the first logic AND circuit AG1 shown in FIG. 9.

The 27th and 28th TFTs T27 and T28 may be embodied to be switched in accordance with a voltage of the reset control node Nrc to discharge or reset the potential of the first odd control node 1Qo to the third gate low potential voltage GVss3. The 27th and 28th TFTs T27 and T28 may be expressed as first and node discharge circuits.

The 27th TFT (or fifth reset TFT) T27 may be switched in accordance with the voltage of the reset control node Nrc to supply the third gate low potential voltage GVss3 supplied through the third gate low potential voltage line, to the fourth odd control node 1Qho. For example, the 27th TFT T27 may be turned on in accordance with a high voltage of the reset control node Nrc to discharge or reset the potential of the fourth odd control node 1Qho to the third gate low potential voltage GVss3.

The 28th TFT (or sixth reset TFT) T28 may be switched in accordance with the voltage of the reset control node Nrc to electrically connect the first odd control node 1Qo with the fourth odd control node 1Qho. For example, the 28th TFT T28 may be turned on in accordance with the high voltage of the reset control node Nrc simultaneously with the 27th TFT T27 to supply the third gate low potential voltage GVss3 supplied through the 27th TFT T27 and the fourth odd control node 1Qho, to the first odd control node 1Qo, thereby discharging or resetting the potential of the first odd control node 1Qo to the third gate low potential voltage GVss3.

The fourth odd control node 1Qho between the 27th TFT T27 and the 28th TFT T28 may be supplied with the first gate high potential voltage GVdd1 through the fourth TFTs T4a and T4b of the first node control circuit NCC1. Therefore, the fourth TFTs T4a and T4b may completely turn off the 28th TFT T28 turned off by a low voltage of the reset control node Nrc by increasing a voltage difference between the gate voltage of the 28th TFT T28 and the fourth odd control node 1Qho. As a result, a voltage drop (or current leakage) of the first odd control node 1Qo through the 28th TFT T28 which is turned off may be prevented from occurring, whereby the voltage of the first odd control node 1Qo may stably be maintained.

The first odd node reset circuit ONRC1 according to one embodiment may include two parallel discharge paths having a first discharge path provided with the 21st TFT T21 and the 22nd TFT T22, and a second discharge path provided with the 27th TFT T27 and the 28th TFT T28, thereby smoothly discharging the potential of the first odd control node 1Qo after sensing period RSP. Particularly, in some embodiments, even when on-current or mobility characteristic of at least one of TFTs disposed in two parallel discharge paths is deteriorated, the voltage of the first odd control node 1Qo may smoothly be discharged through a short discharge path having only two TFTs. Therefore, in one embodiment of the present disclosure, an error operation of the gate driving circuit, which is caused by a non-discharge voltage of the first odd control node 1Qo after the sensing period RSP, and picture quality deterioration due to the error operation may be avoided.

The second odd node reset circuit ONRC2 according to one embodiment may include 29th, 30th and 31st TFTs T29, T30 and T31.

The 29th TFT may be embodied to be switched in accordance with the (n−3)th carry signal CS[n−3] to control the potential of the second odd control node 1Qbo through the third gate low potential voltage GVss3. The 29th TFT T29 may be expressed as a (1-1)th reset circuit.

The 29th TFT T29 may be turned on in accordance with the (n−3)th carry signal CS[n−3] of the high voltage in the display mode to discharge or reset the potential of the second odd control node 1Qbo to the third gate low potential voltage GVss3.

The 30th and 31st TFTs T30 and T31 may be embodied to be switched in accordance with the voltage of the fifth odd control node 1Qmo and the first reset signal RST1 to control the potential of the second odd control node 1Qbo through the third gate low potential voltage GVss3. The 30th and 31st TFTs T30 and 31 may be expressed as (1-2)th reset circuits.

The 30th TFT T30 may be switched in accordance with the fifth odd control node 1Qmo to supply the third gate low potential voltage GVss3 to a fourth connection node Nc4. For example, the 30th TFT T30 may be turned on in accordance with the high voltage of the fifth odd control node 1Qmo to supply the third gate low potential voltage GVss3 to the fourth connection node Nc4.

The 31st TFT T31 may be switched in accordance with the first reset signal RST1 to electrically connect the second odd control node 1Qbo to the fourth connection node Nc4. For example, the 31st TFT T31 may be turned on in accordance with the first reset signal RST1 of the high voltage to supply the third gate low potential voltage GVss3 supplied through the 30th TFT T30 and the fourth connection node Nc4, to the second odd control node 1Qbo. The fourth connection node Nc4 may be a connection line between the 30th TFT T30 and the 31st TFT T31.

Meanwhile, the 30th and 31st TFTs T30 and T31 may be omitted when the first sensing control circuit SCC1 is omitted.

The first output buffer circuit OBC1 according to one embodiment may include 32nd to 40th TFTs T32 to T40, and first to third coupling capacitors Cc1, Cc2 and Cc3.

The 32nd to 34th TFTs T32, T33 and T34 and the first coupling capacitor Cc1 may be embodied to be switched in accordance with the voltages of the first to third odd control nodes 1Qo, 1Qbo and 1Qbe to output an nth scan shift clock SCCLK[n] as the nth scan signal SC[n]. The 32nd to 34th TFTs T32, T33 and T34 and the first coupling capacitor Cc1 may be may be expressed as scan output circuits.

The 32nd TFT T32 (or first odd pull-up TFT) may output the nth scan signal SC[n] having a scan pulse of a high voltage corresponding to the nth scan shift clock SCCLK[n] to the first output node No1 in accordance with the voltage of the first odd control node 1Qo to supply the scan pulse of the nth scan signal SC[n] to the first gate line of the nth gate line group. For example, the 32nd TFT T32 may include a gate electrode connected to the first odd control node 1Qo, a first source/drain electrode connected to the first output node No1 (or scan output terminal), and a second source/drain electrode connected to the nth scan clock line.

According to one embodiment, as shown in FIG. 7, based on the nth scan shift clock SCCLK[n], the 32nd TFT T32 may supply the first scan pulse SCP1 to the first gate line of the nth gate line group in the image display period of the display mode, and may supply the second scan pulse SCP2 to the first gate line of the nth gate line group in the black display period of the display mode. In the sensing mode, when driving characteristics of the pixels embodied in the nth horizontal line are sensed, the 32nd TFT T32 may additionally supply the third scan pulse SCP3 and the fourth scan pulse SCP4 to the first gate line of the nth gate line group in the sensing period RSP based on the nth scan shift clock SCCLK[n].

The 33rd TFT T33 (or (1-1)th odd pull-down TFT) may output the nth scan signal SC[n] of a low voltage corresponding to the first gate low potential voltage GVss1 to the first output node No1 in accordance with the voltage of the second odd control node 1Qbo to supply the nth scan signal SC[n] of the low voltage to the first gate line of the nth gate line group. For example, the 33rd TFT T33 may include a gate electrode connected to the second odd control node 1Qbo, a first source/drain electrode connected to the first output node No1, and a second source/drain electrode connected to the first gate low potential voltage line.

The 34th TFT T34 (or (1-2)th odd pull-down TFT) may output the nth scan signal SC[n] of the low voltage corresponding to the first gate low potential voltage GVss1 to the first output node No1 in accordance with the voltage of the third odd control node 1Qbe to supply the nth scan signal SC[n] of the low voltage to the first gate line of the nth gate line group. For example, the 34th TFT T34 may include a gate electrode connected to the third odd control node 1Qbe, a first source/drain electrode connected to the first output node No1, and a second source/drain electrode connected to the first gate low potential voltage line.

Since the 33rd TFT T33 and the 34th TFT T34 are maintained at the turn-on state for a relatively longer time period than that of the 32nd TFT T32, a degradation speed may be relatively faster than that of the 32nd TFT T32. Therefore, the 33rd TFT T33 and the 34th TFT T34 according to the present disclosure may be driven alternately on a certain time period basis in accordance with an opposite voltage of each of the second odd control node 1Qbo and the third odd control node 1Qbe, whereby the degradation speed may be delayed. For example, when the 33rd TFT T33 is maintained at the turn-on state, the 34th TFT T34 may be maintained at the turn-off state. On the contrary, when the 33rd TFT T33 is maintained at the turn-off state, the 34th TFT T34 may be maintained at the turn-on state.

The first coupling capacitor Cc1 may be embodied between the first odd control node 1Qo and the first output node No1. Optionally, the first coupling capacitor Cc1 may be embodied by parasitic capacitance between the gate electrode of the 32nd TFT T32 and the first output node No1. The first coupling capacitor Cc1 generates bootstrapping in the first odd control node 1Qo in accordance with phase shift (or change) of the nth scan shift clock SCCLK[n], whereby the 32nd TFT T32 may completely turned on. As a result, the nth scan shift clock SCCLK[n] of the high voltage may be output to the first output node No1 through the 32nd TFT T32, which is completely turned, without loss.

The 35th to 37th TFTs T35, T36 and T37 and the second coupling capacitor Cc2 may be embodied to be switched in accordance with the voltages of the first to third odd control nodes 1Qo, 1Qbo and 1Qbe to output an nth sense shift clock SECLK[n] as the nth sense signal SE[n]. The 35th to 37th TFTs T35, T36 and T37 and the second coupling capacitor Cc2 may be may be expressed as sense output circuits.

The 35th TFT T35 (or second odd pull-up TFT) may output the nth sense signal SE[n] having a sense pulse of a high voltage corresponding to the nth sense shift clock SECLK[n] to the second output node No2 in accordance with the voltage of the first odd control node 1Qo to supply the sense pulse of the nth sense signal SE[n] to the second gate line of the nth gate line group. For example, the 35th TFT T35 may include a gate electrode connected to the first odd control node 1Qo, a first source/drain electrode connected to the second output node No2 (or sense output terminal), and a second source/drain electrode connected to the nth sense clock line.

According to one embodiment, as shown in FIG. 7, based on the nth sense shift clock SECLK[n], the 35th TFT T35 may supply the first sense pulse SEP1 to the second gate line of the nth gate line group in the image display period of the display mode. In the sensing mode, when driving characteristics of the pixels embodied in the nth horizontal line are sensed, the 35th TFT T35 may additionally supply the second sense pulse SEP2 to the second gate line of the nth gate line group in the sensing period RSP based on the nth sense shift clock SECLK[n].

The 36th TFT T36 (or (2-1)th odd pull-down TFT) may output the nth sense shift clock SECLK[n] of a low voltage corresponding to the first gate low potential voltage GVss1 to the second output node No2 in accordance with the voltage of the second odd control node 1Qbo to supply the nth sense shift clock SECLK[n] of the low voltage to the second gate line of the nth gate line group. For example, the 36th TFT T36 may include a gate electrode connected to the second odd control node 1Qbo, a first source/drain electrode connected to the second output node No2, and a second source/drain electrode connected to the first gate low potential voltage line.

The 37th TFT T37 (or (2-2)th odd pull-down TFT) may output the nth sense shift clock SECLK[n] of the low voltage corresponding to the first gate low potential voltage GVss1 to the second output node No2 in accordance with the voltage of the third odd control node 1Qbe to supply the nth sense shift clock SECLK[n] of the low voltage to the second gate line of the nth gate line group. For example, the 37th TFT T37 may include a gate electrode connected to the third odd control node 1Qbe, a first source/drain electrode connected to the second output node No2, and a second source/drain electrode connected to the first gate low potential voltage line.

The 36th TFT T36 and the 37th TFT T37 according to the present disclosure may be driven alternately on a certain time period basis in accordance with an opposite voltage of each of the second odd control node 1Qbo and the third odd control node 1Qbe, whereby the degradation speed may be delayed.

The second coupling capacitor Cc2 may be embodied between the first odd control node 1Qo and the second output node No2. Optionally, the second coupling capacitor Cc2 may be embodied by parasitic capacitance between the gate electrode of the 35th TFT T35 and the second output node No2. The second coupling capacitor Cc2 generates bootstrapping in the first odd control node 1Qo in accordance with phase shift (or change) of the nth sense shift clock SECLK[n], whereby the 35th TFT T35 may completely turned on. As a result, the nth sense shift clock SECLK[n] of the high voltage may be output to the second output node No2 through the 35th TFT T35, which is completely turned, without loss.

The 38th to 40th TFTs T38, T39 and T40 and the third coupling capacitor Cc3 may be embodied to be switched in accordance with the voltages of the first to third odd control nodes 1Qo, 1Qbo and 1Qbe to output an nth carry shift clock CRCLK[n] as the nth carry signal SE[n]. The 38th to 40th TFTs T38, T39 and T40 and the third coupling capacitor Cc3 may be may be expressed as carry output circuits.

The 38th TFT T38 (or third odd pull-up TFT) may output the nth carry signal CS[n] having a carry pulse of a high voltage corresponding to the nth carry shift clock CRCLK[n] to the third output node No3 in accordance with the voltage of the first odd control node 1Qo to supply the nth carry signal CS[n] of the high voltage to the front or rear stage circuit. According to one embodiment, as shown in FIG. 7, based on the nth carry shift clock CRCLK[n], the 38th TFT T38 may output the nth carry signal CS[n] to the front or rear stage circuit in the display mode based on the nth carry shift clock CRCLK[n]. For example, the 38th TFT T38 may include a gate electrode connected to the first odd control node 1Qo, a first source/drain electrode connected to the third output node No3, and a second source/drain electrode connected to the nth carry clock line.

The 39th TFT T39 (or (3-1)th odd pull-down TFT) may output the nth carry signal CS[n] of a low voltage corresponding to the first gate low potential voltage GVss1 to the third output node No3 in accordance with the voltage of the second odd control node 1Qbo to supply the nth carry signal CS[n] of the low voltage to the front or rear stage circuit. For example, the 39th TFT T39 may include a gate electrode connected to the second odd control node 1Qbo, a first source/drain electrode connected to the third output node No3, and a second source/drain electrode connected to the first gate low potential voltage line.

The 40th TFT T40 (or (3-2)th odd pull-down TFT) may output the nth carry signal CS[n] of the low voltage corresponding to the first gate low potential voltage GVss1 to the third output node No3 in accordance with the voltage of the third odd control node 1Qbe to supply the nth carry signal CS[n] of the low voltage to the front or rear stage circuit. For example, the 40th TFT T40 may include a gate electrode connected to the third odd control node 1Qbe, a first source/drain electrode connected to the third output node No3, and a second source/drain electrode connected to the first gate low potential voltage line.

The 39th TFT T39 and the 40th TFT T40 according to the present disclosure may be driven alternately on a certain time period basis in accordance with an opposite voltage of each of the second odd control node 1Qbo and the third odd control node 1Qbe, whereby the degradation speed may be delayed.

The third coupling capacitor Cc3 may be embodied between the first odd control node 1Qo and the third output node No3. Optionally, the third coupling capacitor Cc3 may be embodied by parasitic capacitance between the gate electrode of the 38th TFT T38 and the third output node No3. The third coupling capacitor Cc3 generates bootstrapping in the first odd control node 1Qo in accordance with phase shift (or change) of the nth carry shift clock CRCLK [n], whereby the 38th TFT T38 may completely turned on. As a result, the nth carry shift clock CRCLK[n] of the high voltage may be output to the third output node No3 through the 38th TFT T38, which is completely turned, without loss.

The first and second coupling capacitors Cc1 and Cc2 of the first to third coupling capacitors Cc1, Cc2 and Cc3 may generate coupling between a scan output circuit and a sense output circuit or serve as holding capacitors. In this case, the potential of the first odd control node 1Qo may be lowered, whereby driving characteristics and reliability of the gate driving circuit may be deteriorated. Therefore, in order to prevent coupling between the scan output circuit and the sense output circuit from occurring, any one of the first and second coupling capacitors Cc1 and Cc2 may be omitted. For example, the first coupling capacitor Cc1 of the first and second coupling capacitors Cc1 and Cc2 may be omitted.

The (n+1)th stage circuit ST[n+1] according to one embodiment of the present disclosure may include a second sensing control circuit SCC2, a second node control circuit NCC2, a second inverter circuit IC2, a first even node reset circuit ENRC1, a second even node reset circuit ENRC2, and a second output buffer circuit OBC2, which are selectively connected to the first to fifth even control nodes 2Qe, 2Qbo, 2Qbe, 2Qhe and 2Qme. The (n+1)th stage circuit ST[n+1] may be embodied to be substantially the same as the nth stage circuit ST[n] except the second sensing control circuit SCC2.

The (n+1)th stage circuit ST[n+1] according to one embodiment is substantially the same as the nth stage circuit ST[n] except that the (n+1)th stage circuit ST[n+1] shares the line sensing preparation circuit, the second odd control node 1Qbo, the third odd control node 1Qbe and the fourth odd control node 1Qmo and is switched in accordance with the (n−2)th carry signal CS[n−2] and the fourth gate high potential voltage GVdde to control the potential of the first even control node 2Qe through the first gate high potential voltage GVdd1. Therefore, the same reference numerals will be given to the same elements of the (n+1)th stage circuit ST[n+1] as those of the nth stage circuit ST[n], and a repeated description of the same elements will be omitted or simplified.

The second node control circuit NCC2 according to one embodiment may include first to tenth TFTs T1 to T10.

The first to fourth TFTs T1, T2, T3a, T3b, T4a and T4b serve to control or setup the potential of the second even control node 2Qbo, and thus may be expressed as second node setup circuits.

The first TFT T1 and the second TFT T2 may be embodied to be electrically connected between the first gate high potential voltage line for transferring the first gate high potential voltage GVdd1 and the first odd control node 1Qo in series and switched in accordance with the (n−2)th carry signal CS[n−2] to charge the first gate high potential voltage GVdd1 in the first even control node 2Qe.

The first TFT T1 may be turned on in accordance with the (n−2)th carry signal CS[n−2] of a high voltage to output the first gate high potential voltage GVdd1 to a first connection node Nc1.

The second TFT T2 may be turned on in accordance with the (n−2)th carry signal CS[n−2] of the high voltage simultaneously with the first TFT T1 to supply the first gate high potential voltage GVdd1 supplied through the first TFT T1 and the first connection node Nc1 to the first even control node 2Qe.

The third TFTs T3a and T3b may be turned on in accordance with the second gate high potential voltage GVdd2 to at least partially or always supply the second gate high potential voltage GVdd2 to the first connection node Nc1 between the first TFT T1 and the second TFT T2, thereby preventing off current of the first TFT T1 and current leakage of the first even control node 2Qe from occurring.

The third TFTs T3a and T3b according to one embodiment may include (3-1)th and (3-2)th TFTs T3a and T3b electrically connected with each other in series between the second gate high potential voltage line and the first connection node Nc1 to prevent the leakage current due to the off current from occurring.

The (3-1)th TFT T3a may be connected to the second gate high potential voltage line in the form of diode. The (3-2)th TFT T3b may be turned on by the second gate high potential voltage GVdd2 simultaneously with the (3-1)th TFT T3a to supply the second gate high potential voltage GVdd2 supplied through the (3-1)th TFT T3a, to the first connection node Nc1.

The fourth TFTs T4a and T4b may be turned on in accordance with the high voltage of the first even control node 2Qe to supply the first gate high potential voltage GVdd1 to the fourth even control node 2Qhe.

The fourth TFTs T4a and T4b according to one embodiment may include (4-1)th and (4-2)th TFTs T4a and T4b electrically connected with each other in series between the first gate high potential voltage line and the fourth even control node 2Qhe to prevent the leakage current due to the off current from occurring.

The (4-1)th TFT T4a may be turned on by the high voltage of the first even control node 2Qe to supply the first gate high potential voltage GVdd1 to the (4-2)th TFT T4b.

The (4-2)th TFT T4b may be turned on by the high voltage of the first even control node 2Qe simultaneously with the (4-1)th TFT T4a to supply the first gate high potential voltage GVdd1 supplied through the (4-1)th TFT T4a, to the fourth even control node 2Qhe.

The fifth and sixth TFTs T5 and T6 may be embodied to be switched in accordance with the (n+4)th carry signal CS[n+4] to control the potential of each of the second even control node 2Qbo and the fourth even control node 2Qhe through the third gate low potential voltage GVss3. The fifth and sixth TFTs T5 and T6 may be expressed as first even discharge circuits.

The fifth TFT T5 may be turned on in accordance with the (n+4)th carry signal CS[n+4] of a high voltage to discharge or reset the potential of the fourth even control node 2Qhe to the third gate low potential voltage GVss3.

The sixth TFT T6 may be turned on in accordance with the (n+4)th carry signal CS[n+4] of a high voltage simultaneously with the fifth TFT T5 to supply the third gate low potential voltage GVss3 supplied through the fifth TFT T5 and the fourth even control node 2Qhe, to the first even control node 2Qe, thereby discharging or resetting the potential of the first even control node 2Qe to the third gate low potential voltage GVss3.

The seventh and eighth TFTs T7 and T8 may be embodied to be switched in accordance with the voltage of the second even control node 2Qbo to control the potential of each of the first even control node 2Qe and the fourth even control node 2Qhe through the third gate low potential voltage GVss3. The seventh and eighth TFTs T7 and T8 may be expressed as second even discharge circuits.

The seventh TFT T7 may be turned on in accordance with the high voltage of the second even control node 2Qbo to discharge or reset the potential of the fourth even control node 2Qhe to the third gate low potential voltage GVss3.

The eighth TFT T8 may be turned on by the high voltage of the second even control node 2Qbo simultaneously with the seventh TFT T7 to supply the third gate low potential voltage GVss3 supplied through the seventh TFT T7 and the fourth even control node 2Qhe, to the first even control node 2Qe, thereby discharging or resetting the potential of the first even control node 2Qe to the third gate low potential voltage GVss3.

The ninth and tenth TFTs T9 and T10 may be embodied to be switched in accordance with the voltage of the third even control node 2Qbe to control the potential of each of the first even control node 2Qe and the fourth even control node 2Qhe through the third gate low potential voltage GVss3. The ninth and tenth TFTs T9 and T10 may be expressed as third even discharge circuits.

The ninth TFT T9 may be turned on in accordance with the high voltage of the third even control node 2Qbe to discharge or reset the potential of the fourth even control node 2Qhe to the third gate low potential voltage GVss3.

The tenth TFT T10 may be turned on by the high voltage of the third even control node 2Qbe simultaneously with the ninth TFT T9 to supply the third gate low potential voltage GVss3 supplied through the ninth TFT T9 and the fourth even control node 2Qhe, to the first even control node 2Qe, thereby discharging or resetting the potential of the first even control node 2Qe to the third gate low potential voltage GVss3.

The second inverter circuit IC2 according to one embodiment may include 11th to 15th TFTs T11a, T11b, T12, T13, T14 and T15.

The 11th TFTs T11a and T11b may be switched by the fourth gate high potential voltage GVdde to supply the fourth gate high potential voltage GVdde to the second connection node Nc2. The 11th TFTs T11a and T11b according to one embodiment may include (11-1)th and (11-2)th TFTs T11a and T11b electrically connected with each other in series between the fourth gate high potential voltage line and the second connection node Nc2 to prevent the leakage current due to the off current from occurring.

The (11-1)th TFT T11a may be connected to the fourth gate high potential voltage line in the form of diode. The (11-2)th TFT T11b may be turned on by the fourth gate high potential voltage GVdde simultaneously with the (11-1)th TFT T11a to supply the fourth gate high potential voltage GVdde supplied through the (11-1)th TFT T11a, to the second connection node Nc2.

The 12th TFT T12 may be turned on or turned off in accordance with a voltage of the second connection node Nc2, and may supply the fourth gate high potential voltage GVdde to the second even control node 2Qbo when it is turned on.

The 13th TFT T13 may be turned on or turned off in accordance with the voltage of the first even control node 2Qe, and may discharge or reset the potential of the second even control node 2Qbo to the third gate low potential voltage GVss3 when it is turned on.

The 14th TFT T14 may be turned on or turned off in accordance with the voltage of the first even control node 1Qo, and may discharge or reset the potential of the second connection node Nc2 to the second gate low potential voltage GVss2 when it is turned on.

The 15th TFT T15 may be turned on or turned off in accordance with the voltage of the first even control node 2Qe of the (n+1)th stage circuit ST[n+1], and may discharge or reset the potential of the second connection node Nc2 to the second gate low potential voltage GVss2 when it is turned on.

The second sensing control circuit SCC2 according to one embodiment may include 20th TFT T20.

The 20th TFT T20 may be embodied to be switched in accordance with the first reset signal RST1 to control the potential of the first even control node 2Qe through the first gate high potential voltage GVdd1 supplied from the first sensing control circuit SCC1 of the nth stage circuit ST[n].

The 20th TFT T20 may be turned on in accordance with the first reset signal RST1 of the high voltage to supply the first gate high potential voltage GVdd1 supplied through the sharing node Ns of the nth stage circuit ST[n], to the first even control node 2Qe, thereby charging the first gate high potential voltage GVdd1 in the first even control node 2Qe to activate the first even control node 2Qe.

Optionally, the second sensing control circuit SCC2 may be omitted when the nth stage circuit ST[n] is omitted.

The first even node reset circuit ENRC1 according to one embodiment may include 21st to 28th TFTs T21 to T28.

The 21st and 22nd TFTs T21 and T22 may be embodied to be switched in accordance with the display panel on signal POS supplied when the light emitting display apparatus is powered on, thereby discharging or resetting the potential of the first even control node 2Qe to the third gate low potential voltage GVss3. The 21st and 22nd TFTs T21 and T22 may be expressed as second stage initialization circuits or (2-1)th node discharge circuits.

The 21st TFT T21 may be switched in accordance with the display panel on signal POS to supply the third gate low potential voltage GVss3 supplied through the third gate low potential voltage line, to the fourth even control node 2Qhe. For example, the 21st TFT T21 may be turned on in accordance with the display panel on signal POS of the high voltage to discharge or reset the potential of the fourth even control node 2Qhe to the third gate low potential voltage GVss3.

The 22nd TFT T22 may be switched in accordance with the display panel on signal POS to electrically connect the first even control node 2Qe with the fourth even control node 2Qhe. For example, the 22nd TFT T22 may be turned on in accordance with the display panel on signal POS of the high voltage simultaneously with the 21st TFT T21 to supply the third gate low potential voltage GVss3 supplied through the 21st TFT T21 and the fourth even control node 2Qhe, to the first even control node 2Qe, thereby charging or resetting the potential of the first even control node 2Qe to the third gate low potential voltage GVss3.

The fourth even control node 2Qhe between the 21st TFT T21 and the 22nd TFT T22 may be supplied with the first gate high potential voltage GVdd1 through the fourth TFTs T4a and T4b of the first control circuit NCC1. Therefore, the fourth TFTs T4a and T4b may completely turn off the 21st TFT T21 turned off by the display panel on signal POS of the low voltage by increasing a voltage difference between a gate voltage of the 21st TFT T21 and the fourth even control node 2Qhe. As a result, a voltage drop (or current leakage) of the first even control node 2Qe through the 21st TFT T21 which is turned off may be prevented from occurring, whereby the voltage of the first even control node 2Qe may stably be maintained.

The 23rd to 28th TFTs T23 to T28 may stably maintain the charging voltage of the first even control node 2Qe, and may be embodied to be switched in accordance with the second reset signal RST2 generated at the end timing of the sensing mode to discharge the potential of the first even control node 2Qe, and may be expressed as second node voltage sustain/discharge circuits. For example, the 23rd to 28th TFTs T23 to T28 may be expressed as first to sixth reset TFTs, respectively.

The 23rd TFT T23 may be embodied to be switched in accordance with the voltage of the fifth even control node 2Qme to control an inversion node (or voltage inversion node) Qmb of the fifth even control node 2Qme through the third gate low potential voltage GVss3. For example, the 23rd TFT T23 may be turned on in accordance with the high voltage of the fifth even control node 2Qme to discharge or reset the inversion node Qmb of the fifth even control node 2Qme to the third gate low potential voltage GVss3.

The 24th TFTs T24a and T24b may be turned on in accordance with the fourth gate high potential voltage GVdde to at least partially or always supply the fourth gate high potential voltage GVdde to the inversion node Qmb of the fifth even control node 2Qme. The 24th TFTs T24a and T24b according to one embodiment may include (24-1)th and (24-2)th TFTs T24a and T24b electrically connected with each other in series between the fourth gate high potential voltage line and the inversion node Qmb of the fifth even control node 2Qme to prevent the leakage current due to the off current from occurring. At this time, the (24-1)th TFT T24a may be connected to the third gate high potential voltage line in the form of diode. The (24-2)th TFT T24b may be turned on by the fourth gate high potential voltage GVdde simultaneously with the (24-1)th TFT T24a to supply the fourth gate high potential voltage GVdde supplied through the (24-1)th TFT T24a, to the inversion node Qmb of the fifth even control node 2Qme.

The 25th TFT T25 may be embodied to be switched in accordance with the inversion node Qmb of the fifth even control node 2Qme to control the reset control node Nrc through the third gate low potential voltage GVss3. For example, the 25th TFT T25 may be turned on in accordance with the high voltage of the inversion node Qmb of the fifth even control node 2Qme to discharge or reset the reset control node Nrc to the third gate low potential voltage GVss3. In this case, the reset control node Nrc may embody the logic OR circuit OG shown in FIG. 9.

The 23rd TFT T23, the 24th TFTs T24a and T24b and the 25th TFT T25 may embody the second logic AND circuit AG2 shown in FIG. 9.

The 26th TFT T26 may be embodied to be switched in accordance with the voltage of the fifth even control node 2Qme to supply the second reset signal RST2 to the reset control node Nrc. For example, the 26th TFT T26 may be turned on in accordance with the high voltage of the fifth even control node 2Qme to supply the second reset signal RST2 to the reset control node Nrc. The 26th TFT T26 may embody the first logic AND circuit AG1 shown in FIG. 9.

The 27th and 28th TFTs T27 and T28 may be embodied to be switched in accordance with the voltage of the reset control node Nrc to discharge or reset the potential of the first even control node 2Qe to the third gate low potential voltage GVss3. The 27th and 28th TFTs T27 and T28 may be expressed as (2-2)th node discharge circuits.

The 27th TFT T27 may be switched in accordance with the voltage of the reset control node Nrc to supply the third gate low potential voltage GVss3 supplied through the third gate low potential voltage line, to the fourth even control node 2Qhe. For example, the 27th TFT T27 may be turned on in accordance with the high voltage of the reset control node Nrc to discharge or reset the potential of the fourth even control node 2Qhe to the third gate low potential voltage GVss3.

The 28th TFT T28 may be switched in accordance with the voltage of the reset control node Nrc to electrically connect the first even control node 2Qe with the fourth even control node 2Qhe. For example, the 28th TFT T28 may be turned on in accordance with the high voltage of the reset control node Nrc simultaneously with the 27th TFT T27 to supply the third gate low potential voltage GVss3 supplied through the 27th TFT T27 and the fourth even control node 2Qhe, to the first even control node 2Qe, thereby discharging or resetting the potential of the first even control node 2Qe to the third gate low potential voltage GVss3.

The fourth even control node 2Qhe between the 27th TFT T27 and the 28th TFT T28 may be supplied with the first gate high potential voltage GVdd1 through the fourth TFTs T4a and T4b of the first node control circuit NCC1. Therefore, the fourth TFTs T4a and T4b may completely turn off the 28th TFT T28 turned off by the low voltage of the reset control node Nrc by increasing a voltage difference between the gate voltage of the 28th TFT T28 and the fourth even control node 2Qhe. As a result, a voltage drop (or current leakage) of the first even control node 2Qe through the 28th TFT T28 which is turned off may be prevented from occurring, whereby the voltage of the first even control node 2Qe may stably be maintained.

The first even node reset circuit ENRC1 according to one embodiment may include two parallel discharge paths in the same manner as the first odd node reset circuit ONRC1, thereby smoothly discharging the potential of the first odd control node 1Qo after sensing period RSP.

The second even node reset circuit ENRC2 according to one embodiment may include 29th, 30th and 31st TFTs T29, T30 and T31.

The 29th TFT T29 may be embodied to be switched in accordance with the (n−3)th carry signal CS[n−3] to control the potential of the second even control node 2Qbo through the third gate low potential voltage GVss3. The 29th TFT T29 may be expressed as a (2-1)th reset circuit.

The 29th TFT T29 may be turned on in accordance with the (n−3)th carry signal CS[n−3] of the high voltage in the display mode to discharge or reset the potential of the second even control node 2Qbo to the third gate low potential voltage GVss3.

The 30th and 31st TFTs T30 and T31 may be embodied to be switched in accordance with the voltage of the fifth even control node 2Qme and the first reset signal RST1 to control the potential of the second even control node 2Qbo through the third gate low potential voltage GVss3. The 30th and 31st TFTs T30 and T31 may be expressed as (2-2)th reset circuits.

The 30th TFT T30 may be switched in accordance with the fifth even control node 2Qme to supply the third gate low potential voltage GVss3 to a fourth connection node Nc4. For example, the 30th TFT T30 may be turned on in accordance with the high voltage of the fifth even control node 2Qme to supply the third gate low potential voltage GVss3 to the fourth connection node Nc4.

The 31st TFT T31 may be switched in accordance with the first reset signal RST1 to electrically connect the second even control node 2Qbo to the fourth connection node Nc4. For example, the 31st TFT T31 may be turned on in accordance with the first reset signal RST1 of the high voltage to supply the third gate low potential voltage GVss3 supplied through the 30th TFT T30 and the fourth connection node Nc4, to the second even control node 2Qbo. The fourth connection node Nc4 may be a connection line between the 30th TFT T30 and the 31st TFT T31.

Meanwhile, the 30th and 31st TFTs T30 and T31 may be omitted when the first sensing control circuit SCC1 is omitted.

The second output buffer circuit OBC2 according to one embodiment may include 32nd to 40th TFTs T32 to T40, and first to third coupling capacitors Cc1, Cc2 and Cc3.

The 32nd to 34th TFTs T32, T33 and T34 and the first coupling capacitor Cc1 may be embodied to be switched in accordance with the voltages of the first to third even control nodes 2Qe, 2Qbo and 2Qbe to output an (n+1)th scan shift clock SCCLK[n+1] as the (n+1)th scan signal SC[n+1]. The 32nd to 34th TFTs T32, T33 and T34 and the first coupling capacitor Cc1 may be may be expressed as scan output circuits.

The 32nd TFT T32 (or first even pull-up TFT) may output the (n+1)th scan signal SC[n+1] having a scan pulse of a high voltage corresponding to the (n+1)th scan shift clock SCCLK[n+1] to the first output node No1 in accordance with the voltage of the first even control node 2Qe to supply the scan pulse of the (n+1)th scan signal SC[n+1] to the first gate line of the nth gate line group.

According to one embodiment, as shown in FIG. 7, based on the (n+1)th scan shift clock SCCLK[n+1], the 32nd TFT T32 may supply the first scan pulse SCP1 to the first gate line of the nth gate line group in the image display period of the display mode, and may supply the second scan pulse SCP2 to the first gate line of the (n+1)th gate line group in the black display period of the display mode. In the sensing mode, when driving characteristics of the pixels embodied in the (n+1)th horizontal line are sensed, the 32nd TFT T32 may additionally supply the third scan pulse SCP3 and the fourth scan pulse SCP4 to the first gate line of the (n+1)th gate line group in the sensing period RSP based on the (n+1)th scan shift clock SCCLK[n+1].

The 33rd TFT T33 (or (1-1)th even pull-down TFT) may output the (n+1)th scan signal SC[n+1] of a low voltage corresponding to the first gate low potential voltage GVss1 to the first output node No1 in accordance with the voltage of the second even control node 2Qbo to supply the (n+1)th scan signal SC[n+1] of the low voltage to the first gate line of the (n+1)th gate line group.

The 34th TFT T34 (or (1-2)th even pull-down TFT) may output the (n+1)th scan signal SC[n+1] of the low voltage corresponding to the first gate low potential voltage GVss1 to the first output node No1 in accordance with the voltage of the third even control node 2Qbe to supply the (n+1)th scan signal SC[n+1] of the low voltage to the first gate line of the (n+1)th gate line group.

The 33rd TFT T33 and the 34th TFT T34 according to the present disclosure may be driven alternately on a certain time period basis in accordance with an opposite voltage of each of the second even control node 2Qbo and the third even control node 2Qbe, whereby the degradation speed may be delayed.

The first coupling capacitor Cc1 may be embodied between the first even control node 2Qe and the first output node No1. Optionally, the first coupling capacitor Cc1 may be embodied by parasitic capacitance between the gate electrode of the 32nd TFT T32 and the first output node No1.

The 35th to 37th TFTs T35, T36 and T37 and the second coupling capacitor Cc2 may be embodied to be switched in accordance with the voltages of the first to third even control nodes 2Qe, 2Qbo and 2Qbe to output an (n+1)th sense shift clock SECLK[n+1] as the (n+1)th sense signal SE[n+1]. The 35th to 37th TFTs T35, T36 and T37 and the second coupling capacitor Cc2 may be may be expressed as sense output circuits.

The 35th TFT T35 (or second even pull-up TFT) may output the (n+1)th sense signal SE[n+1] having a sense pulse of a high voltage corresponding to the (n+1)th sense shift clock SECLK[n+1] to the second output node No2 in accordance with the voltage of the first even control node 2Qe to supply the sense pulse of the (n+1)th sense signal SE[n+1] to the second gate line of the (n+1)th gate line group.

According to one embodiment, as shown in FIG. 7, based on the (n+1)th sense shift clock SECLK[n+1], the 35th TFT T35 may supply the first sense pulse SEP1 to the second gate line of the (n+1)th gate line group in the image display period of the display mode. In the sensing mode, when driving characteristics of the pixels embodied in the (n+1)th horizontal line are sensed, the 35th TFT T35 may additionally supply the second sense pulse SEP2 to the second gate line of the (n+1)th gate line group in the sensing period RSP based on the (n+1)th sense shift clock SECLK[n+1].

The 36th TFT T36 (or (2-1)th even pull-down TFT) may output the (n+1)th sense shift clock SECLK[n+1] of the low voltage corresponding to the first gate low potential voltage GVss1 to the second output node No2 in accordance with the voltage of the second even control node 2Qbo to supply the (n+1)th sense shift clock SECLK[n+1] of the low voltage to the second gate line of the (n+1)th gate line group.

The 37th TFT T37 (or (2-2)th even pull-down TFT) may output the (n+1)th sense shift clock SECLK[n+1] of the low voltage corresponding to the first gate low potential voltage GVss1 to the second output node No2 in accordance with the voltage of the third even control node 2Qbe to supply the (n+1)th sense shift clock SECLK[n+1] of the low voltage to the second gate line of the (n+1)th gate line group.

The 36th TFT T36 and the 37th TFT T37 according to the present disclosure may be driven alternately on a certain time period basis in accordance with an opposite voltage of each of the second even control node 2Qbo and the third even control node 2Qbe, whereby the degradation speed may be delayed.

The second coupling capacitor Cc2 may be embodied between the first even control node 2Qe and the second output node No2. Optionally, the second coupling capacitor Cc2 may be embodied by parasitic capacitance between the gate electrode of the 35th TFT T35 and the second output node No2.

The 38th to 40th TFTs T38, T39 and T40 and the third coupling capacitor Cc3 may be embodied to be switched in accordance with the voltages of the first to third even control nodes 2Qe, 2Qbo and 2Qbe to output an (n+1)th carry shift clock CRCLK[n+1] as the nth carry signal SE[n]. The 38th to 40th TFTs T38, T39 and T40 and the third coupling capacitor Cc3 may be may be expressed as carry output circuits.

The 38th TFT T38 (or third even pull-up TFT) may output the (n+1)th carry signal CS[n+1] having a carry pulse of a high voltage corresponding to the (n+1)th carry shift clock CRCLK[n+1] to the third output node No3 in accordance with the voltage of the first even control node 2Qe to supply the (n+1)th carry signal CS[n+1] of the high voltage to the front or rear stage circuit. According to one embodiment, as shown in FIG. 7, based on the (n+1)th carry shift clock CRCLK[n+1], the 38th TFT T38 may output the (n+1)th carry signal CS[n+1] to the front or rear stage circuit in the display mode based on the (n+1)th carry shift clock CRCLK[n+1].

The 39th TFT T39 (or (3-1)th even pull-down TFT) may output the (n+1)th carry signal CS[n+1] of the low voltage corresponding to the first gate low potential voltage GVss1 to the third output node No3 in accordance with the voltage of the second even control node 2Qbo to supply the (n+1)th carry signal CS[n+1] of the low voltage to the front or rear stage circuit.

The 40th TFT T40 (or (3-2)th even pull-down TFT) may output the (n+1)th carry signal CS[n+1] of the low voltage corresponding to the first gate low potential voltage GVss1 to the third output node No3 in accordance with the voltage of the third even control node 2Qbe to supply the (n+1)th carry signal CS[n+1] of the low voltage to the front or rear stage circuit.

The 39th TFT T39 and the 40th TFT T40 according to the present disclosure may be driven alternately on a certain time period basis in accordance with an opposite voltage of each of the second even control node 2Qbo and the third even control node 2Qbe, whereby the degradation speed may be delayed.

The third coupling capacitor Cc3 may be embodied between the first even control node 2Qe and the third output node No3. Optionally, the third coupling capacitor Cc3 may be embodied by parasitic capacitance between the gate electrode of the 38th TFT T38 and the third output node No3.

Any one of the first and second coupling capacitors Cc1 and Cc2 of the first to third coupling capacitors Cc1, Cc2 and Cc3 may be omitted. For example, the first coupling capacitor Cc2 of the first and second coupling capacitors Cc1 and Cc2 may be omitted.

Figure 12:
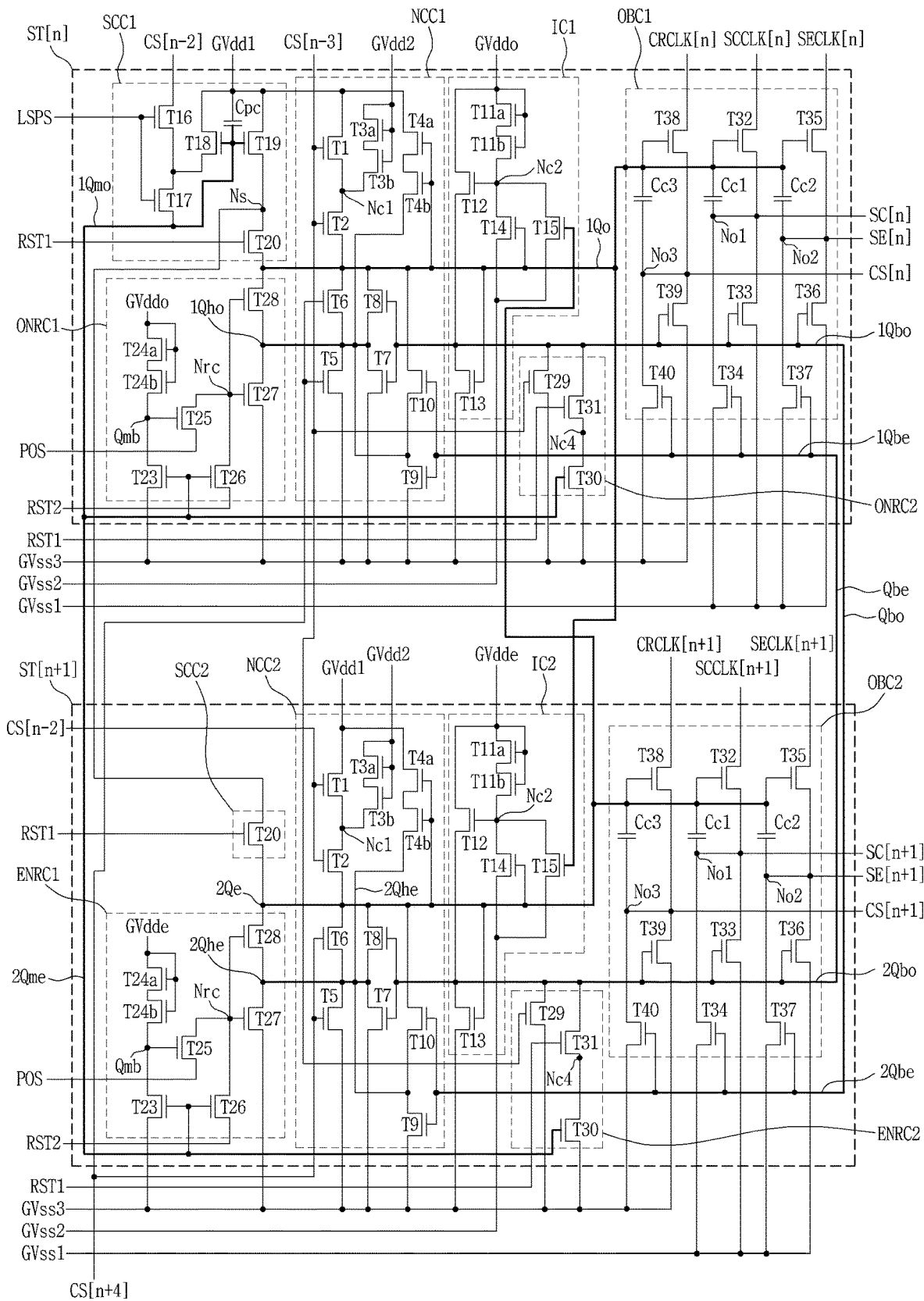
FIG. 12 is a circuit view illustrating an nth stage circuit and an (n+1)th stage circuit according to another embodiment of the present disclosure shown in FIG. 8.

FIG. 12 is a circuit view illustrating an nth stage circuit and an (n+1)th stage circuit according to another embodiment of the present disclosure shown in FIG. 8. In FIG. 12, the second odd node reset circuit and the second even node reset circuit, which are shown in FIG. 11, are respectively modified. Therefore, in the following description, the same reference numerals will be given to the other elements except each of the second odd node reset circuit and the second even node reset circuit among the elements of each of the nth stage circuit and the (n+1)th stage circuit, and their repeated description will be omitted.

Referring to FIGS. 7, 8 and 11, the first odd node reset circuit ONRC1 of the nth stage circuit ST[n] according to another embodiment of the present disclosure may be embodied to be switched in accordance with the voltage of the fifth odd control node 1Qmo, the third gate high potential voltage GVddo, the second reset signal RST2 and the display panel on signal POS to control the potential of the first odd control node 1Qo through the third gate low potential voltage GVss3. For example, the first odd node reset circuit ONRC1 may be embodied to be switched in accordance with the display panel on signal POS supplied when the light emitting display apparatus is powered on, to discharge or reset the potential of the first odd control node 1Qo to the third gate low potential voltage GVss3.

The first odd node reset circuit ONRC1 according to another embodiment may include 23rd to 28th TFTs T23 to T28. The first odd node reset circuit ONRC1 has a circuit configuration in which the 21st TFT T21 and the 22nd TFT T22 are removed from the first odd reset circuit ONRC1 shown in FIG. 11.

The 23rd to 28th TFTs T23 to T28 may stably maintain the charging voltage of the first odd control node 1Qo, and may be embodied to be switched in accordance with the second reset signal RST2 generated at the end timing of the sensing mode to discharge the potential of the first odd control node 1Qo, and may be expressed as first node voltage sustain/discharge circuits.

Each of the 23rd TFT T23 and the 24th TFTs T24a and T24b may be embodied to be switched in accordance with the voltage of the fifth odd control node 1Qmo to control the inversion node (or voltage inversion node) Qmb of the fifth odd control node 1Qmo through the third gate low potential voltage GVss3. These are substantially the same as the 23rd TFT T23 and the 24th TFTs T24a and T24b of the first odd node reset circuit ONRC1, which are shown in FIG. 11, and thus their repeated description will be omitted.

The 25th TFT T25 may be embodied to be switched in accordance with the voltage of the inversion node Qmb of the fifth odd control node 1Qmo to control the potential of the reset control node Nrc through the voltage of the display panel on signal POS. For example, the 25th TFT T25 may be turned on in accordance with the high voltage of the inversion node Qmb of the fifth odd control node 1Qmo to supply the display panel on signal POS to the reset control node Nrc. In this case, the reset control node Nrc may embody the logic OR circuit OG shown in FIG. 10.

The 23rd TFT T23, the 24th TFTs T24a and T24b and the 25th TFT T25 may embody the second logic AND circuit AG2 shown in FIG. 10.

The 26th TFT T26 may be embodied to be switched in accordance with the voltage of the fifth odd control node 1Qmo to supply the second reset signal RST2 to the reset control node Nrc. For example, the 26th TFT T26 may be turned on in accordance with the high voltage of the fifth odd control node 1Qmo to supply the second reset signal RST2 to the reset control node Nrc. The 26th TFT T26 may embody the first logic AND circuit AG1 shown in FIG. 10.

The 27th and 28th TFTs T27 and T28 may be embodied to be switched in accordance with the voltage of the reset control node Nrc to discharge or reset the potential of the first odd control node 1Qo to the third gate low potential voltage GVss3. Since these 27th and 28th TFTs T27 and T28 are substantially the same as those of the first odd node reset circuit ONRC1 shown in FIG. 11, their repeated description will be omitted.

As the first odd node reset circuit ONRC1 according to another embodiment has a parallel input structure of the second reset signal RST2 and the display panel on signal POS, the 21st TFT T21 and the 22nd TFT T22 may be removed from the first odd node reset circuit ONRC1 shown in FIG. 11, whereby a circuit size may be reduced as compared with the first odd node reset circuit ONRC1.

The first even node reset circuit ENRC1 of the (n+1)th stage circuit ST[n+1] according to another embodiment may be embodied to be switched in accordance with the voltage of the fifth even control node 2Qme, the fourth gate high potential voltage GVdde, the second reset signal RST2 and the display panel on signal POS to control the potential of the first even control node 2Qe through the third gate low potential voltage GVss3. For example, the first even node reset circuit ENRC1 may be embodied to be switched in accordance with the display panel on signal POS supplied when the light emitting display apparatus is powered on, to discharge or reset the potential of the first even control node 2Qe to the third gate low potential voltage GVss3.

The first even node reset circuit ENRC1 according to another embodiment may include 23rd to 28th TFTs T23 to T28. The first even node reset circuit ENRC1 has a circuit configuration in which the 21st TFT T21 and the 22nd TFT T22 are removed from the first even reset circuit ENRC1 shown in FIG. 11.

The 23rd to 28th TFTs T23 to T28 may stably maintain the charging voltage of the first even control node 2Qe, and may be embodied to be switched in accordance with the second reset signal RST2 generated at the end timing of the sensing mode to discharge the potential of the first even control node 2Qe, and may be expressed as second node voltage sustain/discharge circuits.

Each of the 23rd TFT T23 and the 24th TFTs T24a and T24b may be embodied to be switched in accordance with the voltage of the fifth even control node 2Qme to control the inversion node (or voltage inversion node) Qmb of the fifth even control node 2Qme through the third gate low potential voltage GVss3. These are substantially the same as the 23rd TFT T23 and the 24th TFTs T24a and T24b of the first even node reset circuit ENRC1, which are shown in FIG. 11, and thus their repeated description will be omitted.

The 25th TFT T25 may be embodied to be switched in accordance with the voltage of the inversion node Qmb of the fifth even control node 2Qme to control the potential of the reset control node Nrc through the voltage of the display panel on signal POS. For example, the 25th TFT T25 may be turned on in accordance with the high voltage of the inversion node Qmb of the fifth even control node 2Qme to supply the display panel on signal POS to the reset control node Nrc. In this case, the reset control node Nrc may embody the logic OR circuit OG shown in FIG. 10.

The 23rd TFT T23, the 24th TFTs T24a and T24b and the 25th TFT T25 may embody the second logic AND circuit AG2 shown in FIG. 10.

The 26th TFT T26 may be embodied to be switched in accordance with the voltage of the fifth even control node 2Qme to supply the second reset signal RST2 to the reset control node Nrc. For example, the 26th TFT T26 may be turned on in accordance with the high voltage of the fifth even control node 2Qme to supply the second reset signal RST2 to the reset control node Nrc. The 26th TFT T26 may embody the first logic AND circuit AG1 shown in FIG. 10.

The 27th TFT T27 and the 28th TFT T28 may be embodied to be switched in accordance with the voltage of the reset control node Nrc to discharge or reset the potential of the first even control node 2Qme to the third gate low potential voltage GVss3. For example, the 27th TFT T27 and the 28th TFT T28 may be expressed as second node discharge circuits. Since these 27th TFT T27 and the 28th TFT T28 are substantially the same as those of the first even node reset circuit ENRC1, which are shown in FIG. 11, their repeated description will be omitted.

As the first even node reset circuit ENRC1 according to another embodiment has a parallel input structure of the second reset signal RST2 and the display panel on signal POS, the 21st TFT T21 and the 22nd TFT T22 may be removed from the first even node reset circuit ENRC1 shown in FIG. 11, whereby a circuit size may be reduced as compared with the first even node reset circuit ENRC1.

Figure 13:
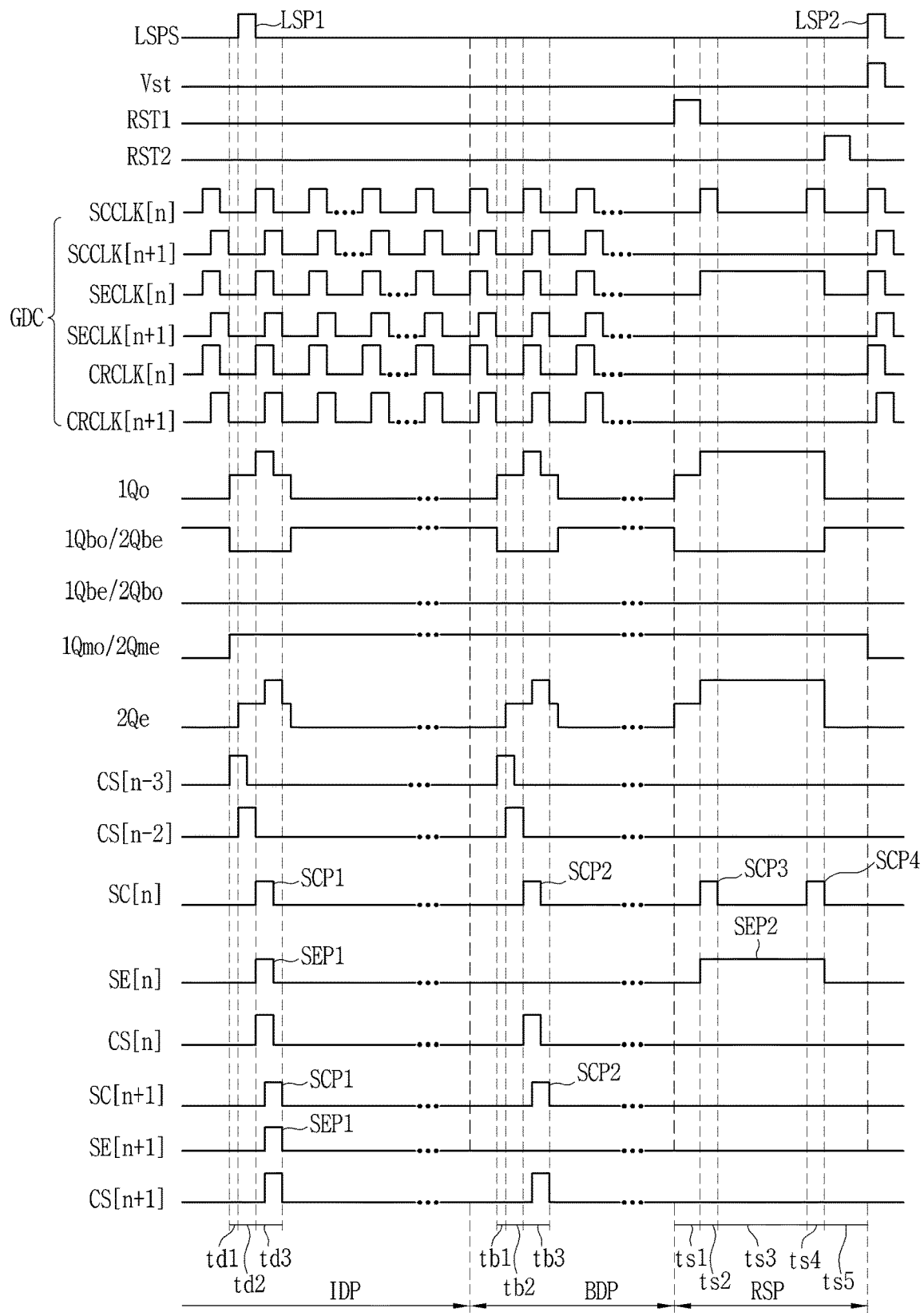
FIG. 13 is a view illustrating input and output waveforms of each of an nth stage circuit and an (n+1)th stage circuit shown in FIG. 11.

FIG. 13 is a view illustrating input and output waveforms of each of an nth stage circuit and an (n+1)th stage circuit shown in FIG. 11, and FIGS. 14A to 14I are views illustrating an operation process of each of an nth stage circuit and an (n+1)th stage circuit shown in FIG. 11 according to waveforms shown in FIG. 13. In FIGS. 14A to 14I, thick solid lines indicate nodes and turned-on TFTs, which have a potential of a high voltage or more, and thin solid lines indicate nodes and turned-off TFTs, which have a potential of a low voltage. In description of FIG. 13 and FIGS. 14A to 14I, operation description of TFTs embodied in the nth stage circuit and the (n+1)th stage circuit is substantially the same as the description in FIG. 11, its repeated description will be omitted.

Figure 14A:
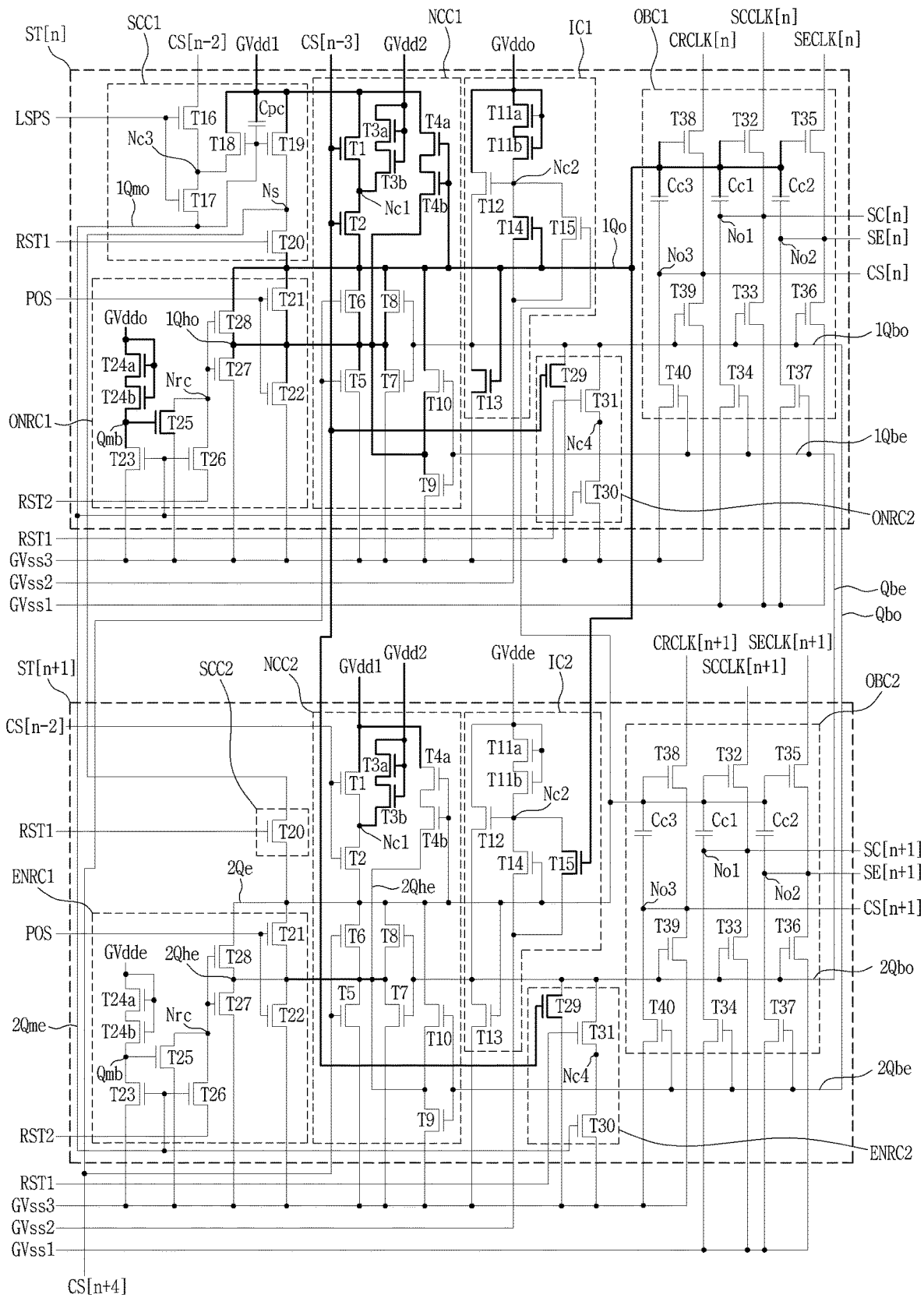
FIGS. 14A to 14I are views illustrating an operation process of each of an nth stage circuit and an (n+1)th stage circuit shown in FIG. 11 according to waveforms shown in FIG. 13.

Referring to FIGS. 13 and 14A, for a first display period td1 of the image display period IDP of the display mode according to one embodiment of the present disclosure, the first odd control node 1Qo of the nth stage circuit ST[n] is charged with the first gate high potential voltage GVdd1 in accordance with the operation of the first node control circuit NCC1 responding to the (n−3)th carry signal CS[n−3] of the high voltage. The second odd control node 1Qbo of the nth stage circuit ST[n] is discharged with the third gate low potential voltage GVss3 in accordance with the operation of the first inverter circuit IC1 responding to the charging voltage of the first odd control node 1Qo and the operation of the second odd node reset circuit ONRC2 responding to the (n−3)th carry signal CS[n−3] of the high voltage. The first odd node reset circuit ONRC1 of the nth stage circuit ST[n] supplies the third gate low potential voltage GVss3 to the reset control node Nrc through the 25th TFT T25 turned on in accordance with the third gate high potential voltage GVddo of the high voltage supplied to the inversion node Qmb, thereby turning off the 27th TFT T27 and the 28th TFT T28. Therefore, for the first display period td1 of the image display period IDP, the first gate high potential voltage GVdd1 may stably be charged in the first odd control node 1Qo, and is supplied from the first gate high potential voltage through two TFTs T1 and T2, whereby voltage charging characteristic of the first odd control node 1Qo may be enhanced.

At the first display period td1 of the image display period IDP, as each of the nth scan shift clock SCCLK[n], the nth sense shift clock SECLK[n] and the nth carry shift clock CRCLK[n] is maintained at the low voltage, bootstrapping is not generated in the first odd control node 1Qo, whereby each of the odd pull-up TFTs T32, T35 and T38 of the first output buffer circuit OBC1 is maintained at the turn-off state without being turned on.

For the first display period td1 of the image display period IDP according to one embodiment of the present disclosure, the first even control node 2Qe of the (n+1)th stage circuit ST[n+1] is discharged with the third gate low potential voltage GVss3 in accordance with the operation of the second inverter circuit IC2 responding to the charging voltage of the first odd control node 1Qo of the nth stage circuit ST[n]. The second even control node 2Qbo of the (n+1)th stage circuit ST[n+1] is connected with the third odd control node 1Qbe of the nth stage circuit ST[n] and thus maintained at the third gate low potential voltage GVss3. The third even control node 2Qbe of the (n+1)th stage circuit ST[n+1] is connected with the second odd control node 1Qbo of the nth stage circuit ST[n] and thus maintained at the third gate low potential voltage GVss3.

Figure 14B:
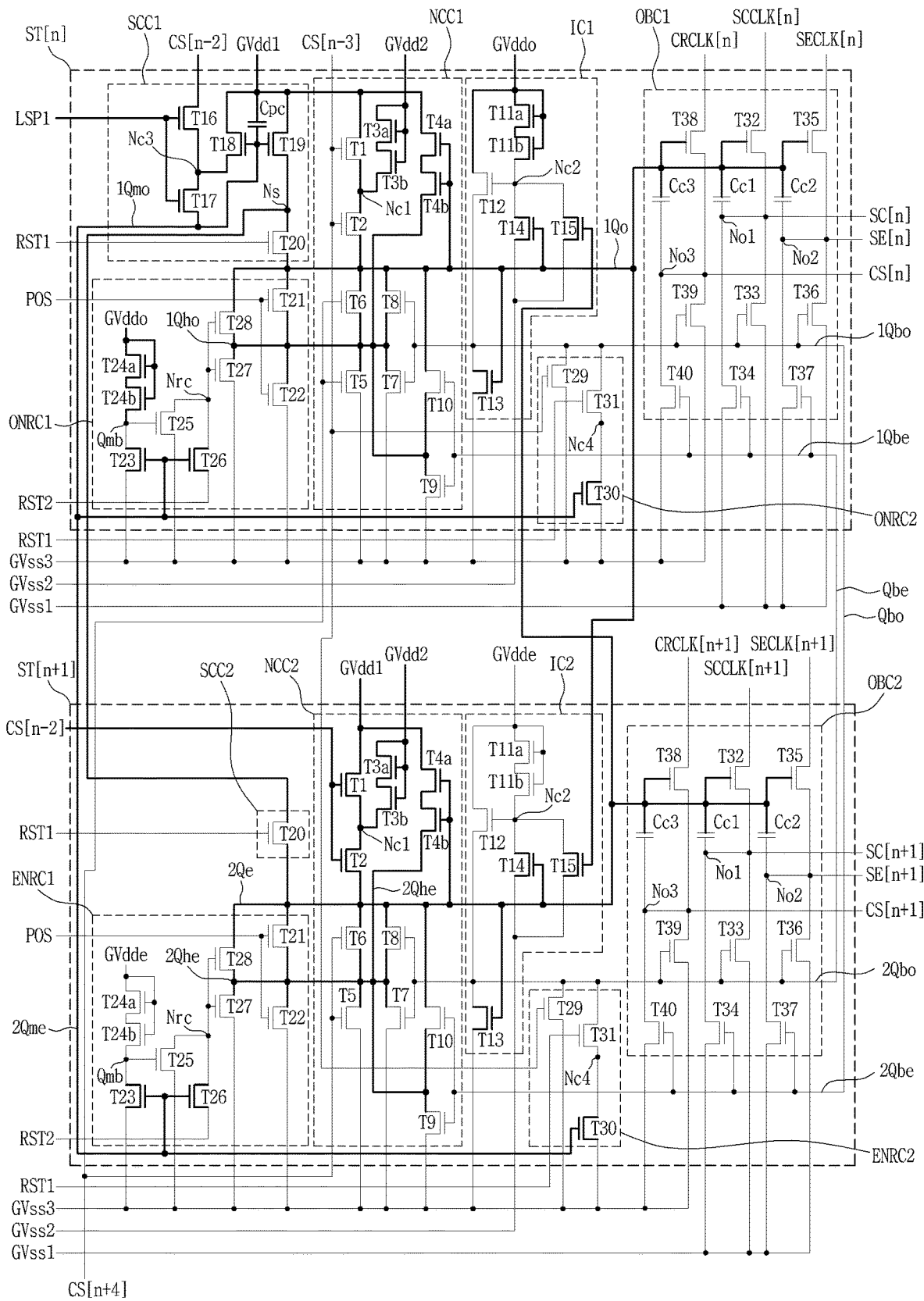

Referring to FIGS. 13 and 14B, for a second display period td2 of the image display period IDP of the display mode according to one embodiment of the present disclosure, the fifth odd control node 1Qmo of the nth stage circuit ST[n] is charged with the first gate high potential voltage GVdd1 in accordance with the operation of the first sensing control circuit SCC1 responding to the (n−2)th carry signal CS[n−2] of the high voltage and the line sensing selection pulse LSP1 of the line sensing preparation signal LSPS having a high voltage. The first odd node reset circuit ONRC1 of the nth stage circuit ST[n] supplies the third gate low potential voltage GVss3 to the reset control node Nrc through the 23rd and 24th TFTs T23 and T24 turned on in accordance with the high voltage of the fifth odd control node 1Qmo, thereby maintaining the turned off state of the 27th and 28th TFTs T27 and T28. Therefore, the first odd control node 1Qo of the nth stage circuit ST[n] may be maintained at the first gate high potential voltage GVdd1 charged for the first display period td1. At the second display period td2 of the image display period IDP, as each of the nth scan shift clock SCCLK[n], the nth sense shift clock SECLK [n] and the nth carry shift clock CRCLK[n] is maintained at the low voltage, bootstrapping is not generated in the first odd control node 1Qo, whereby each of the odd pull-up TFTs T32, T35 and T38 of the first output buffer circuit OBC1 is maintained at the turn-off state without being turned on.

For the second display period td2 of the image display period IDP according to one embodiment of the present disclosure, the first even control node 2Qe of the (n+1)th stage circuit ST[n+1] is charged with the first gate high potential voltage GVdd1 in accordance with the operation of the second node control circuit NCC2 responding to the (n−2)th carry signal CS[n−2] of the high voltage. The first even node reset circuit ENRC1 of the (n+1)th stage circuit ST[n+1] supplies the third gate low potential voltage GVss3 to the reset control node Nrc through the 23rd and 24th TFTs T23 and T24 turned on in accordance with the high voltage supplied to the fifth even control node 2Qme, through the fifth odd control node 1Qmo of the nth stage circuit ST[n], thereby maintaining the turned off state of the 27th and 28th TFTs T27 and T28. Therefore, the first gate high potential voltage GVdd1 may stably be charged in the first even control node 2Qe for the second display period td2 of the image display period IDP, and is supplied from the first gate high potential voltage line through two TFTs T1 and T2, whereby voltage charging characteristics of the first even control node 2Qe may be enhanced.

For the second display period td2 of the image display period IDP, the second odd control node 1Qbo of the nth stage circuit ST[n] is maintained at the third gate low potential voltage GVss3 in accordance with the operation of the first inverter circuit IC1 responding to the charging voltage of the first odd control node 1Qo. The third even control node 2Qbe of the (n+1)th stage circuit ST[n+1] is connected with the second odd control node 1Qbo of the nth stage circuit ST[n] and thus maintained at the third gate low potential voltage GVss3. The second even control node 2Qbo of the (n+1)th stage circuit ST[n+1] is maintained at the third gate low potential voltage GVss3 in accordance with the operation of the second inverter circuit IC2 responding to the charging voltage of the first even control node 2Qe. The third odd control node 1Qbe of the nth stage circuit ST[n] is connected with the second even control node 2Qbo of the (n+1)th stage circuit ST[n+1] and thus maintained at the third gate low potential voltage GVss3.

At the second display period td2 of the image display period IDP, as each of the (n+1)th scan shift clock SCCLK [n+1], the (n+1)th sense shift clock SECLK[n+1] and the (n+1)th carry shift clock CRCLK[n+1] is maintained at the low voltage, bootstrapping is not generated in the first even control node 2Qe, whereby each of the even pull-up TFTs T32, T35 and T38 of the second output buffer circuit OBC2 is maintained at the turn-off state without being turned on.

Figure 14C:
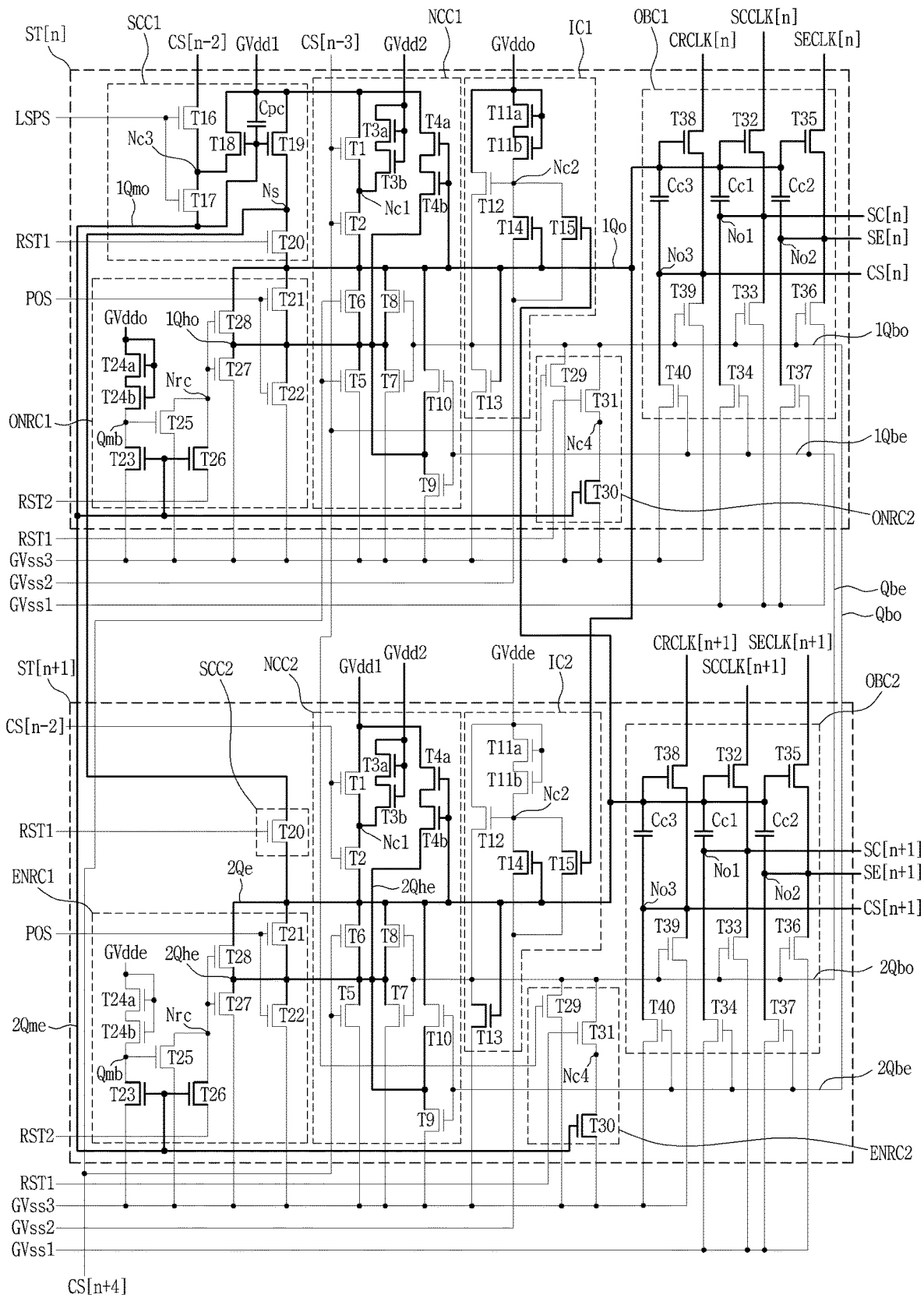

Referring to FIGS. 13 and 14C, for a third display period td3 of the image display period IDP of the display mode according to one embodiment of the present disclosure, each of the second to fifth odd control nodes 1Qbo, 1Qbe, 1Qho and 1Qmo of the nth stage circuit ST[n] and the reset control node Nrc maintains the voltage state of the second display period td2 as it is. Also, each of the first to fifth even control nodes 2Qe, 2Qbo, 2Qbe, 2Qhe and 2Qme of the (n+1)th stage circuit ST[n+1] and the reset control node Nrc maintains the voltage state of the second display period td2 as it is.

For the third display period td3 of the image display period IDP, as each of the nth scan shift clock SCCLK[n], the nth sense shift clock SECLK[n] and the nth carry shift clock CRCLK[n] is input as the high voltage, bootstrapping is generated in the first odd control node 1Qo, whereby each of the odd pull-up TFTs T32, T35 and T38 of the first output buffer circuit OBC1 is completely turned on. Therefore, the nth stage circuit ST[n] outputs the nth scan signal SC[n] having a first scan pulse SCP1 of a high voltage through the first output node No1, outputs the nth sense signal SE[n] having a first sense pulse SEP1 of a high voltage through the second output node No2, and outputs the nth carry signal CS[n] having a high voltage through the third output node No3. Therefore, an image data addressing period for the pixels disposed in the nth horizontal line may be performed.

At the third display period td3 of the image display period IDP, as each of the (n+1)th scan shift clock SCCLK[n+1], the (n+1)th sense shift clock SECLK[n+1] and the (n+1)th carry shift clock CRCLK[n+1] is maintained at the low voltage and then input as the high voltage for a clock non-overlap period, bootstrapping is generated in the first even control node 2Qe, whereby each of the odd pull-up TFTs T32, T35 and T38 of the first output buffer circuit OBC1 is completely turned on. Therefore, the (n+1)th stage circuit ST[n+1] outputs the (n+1)th scan signal SC[n+1] having a first scan pulse SCP1 of a high voltage through the first output node No1, outputs the (n+1)th sense signal SE[n+1] having a first sense pulse SEP1 of a high voltage through the second output node No2, and outputs the (n+1)th carry signal CS[n+1] having a high voltage through the third output node No3. Therefore, an image data addressing period for the pixels disposed in the (n+1)th horizontal line may be performed.

Figure 14D:
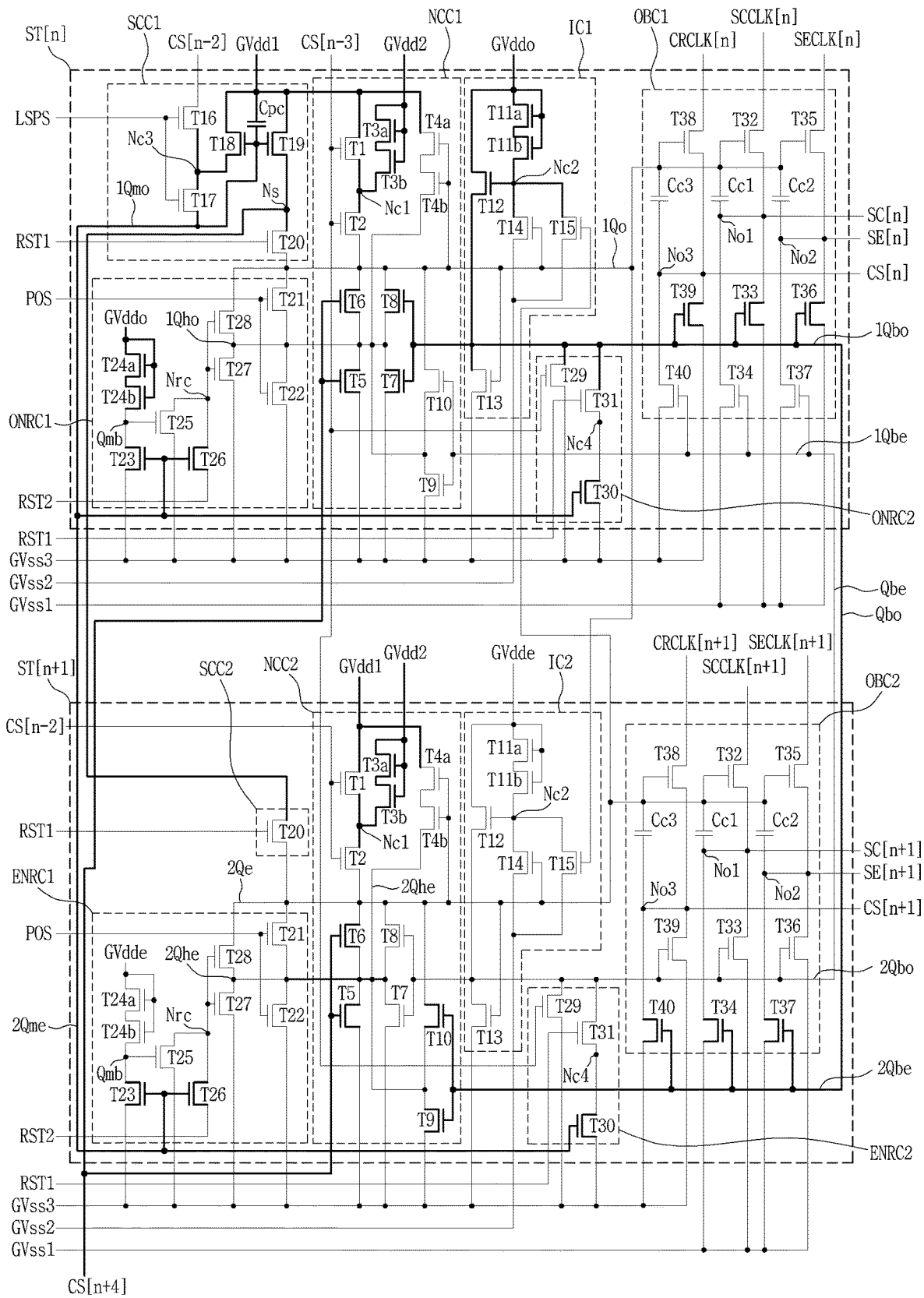

Referring to FIGS. 13 and 14D, after a third display period td3 of the image display period IDP of the display mode according to one embodiment of the present disclosure, the fifth odd control node 1Qmo of the nth stage circuit ST[n] maintains the charging state as it is. Also, each of the reset control node Nrc of the nth stage circuit ST[n] and the reset control node Nrc of the (n+1)th stage circuit ST[n+1] maintains the voltage stage of the second display period td2 as it is.

After the third display period td3 of the image display period IDP, the first odd control node 1Qo of the nth stage circuit ST[n] is discharged with the third gate low potential voltage GVss3 in accordance with the operation of the first node control circuit NCC1 responding to the (n+4)th carry signal CS[n+4] (or the (n+3)th carry signal CS[n+3]) of the high voltage. The second odd control node 1Qbo of the nth stage circuit ST[n] is charged with the third gate high potential voltage GVddo in accordance with the operation of the first inverter circuit IC1 responding to discharge of the first odd control node 1Qo. Therefore, as each of the odd pull-down TFTs T33, T36 and T38 is turned on by the charging voltage of the second odd control node 1Qbo, the first output buffer circuit OBC1 outputs the nth scan signal SC[n] of the low voltage through the first output node No1, outputs the nth sense signal SE[n] of the low voltage through the second output node No2, and outputs the nth carry signal CS[n] of the low voltage through the third output node No3. Therefore, the pixels disposed in the nth horizontal line may emit light in accordance with a data current corresponding to an image data voltage which is addressed.

After the third display period td3 of the image display period IDP, the first even control node 2Qe of the (n+1)th stage circuit ST[n+1] is discharged with the third gate low potential voltage GVss3 in accordance with the operation of the second node control circuit NCC2 responding to the (n+4)th carry signal CS[n+4] of the high voltage. The third even control node 2Qbe of the (n+1)th stage circuit ST[n+1] is connected with the second odd control node 1Qbo of the nth stage circuit ST[n] and thus charged with the third gate high potential voltage GVddo. Therefore, as each of the even pull-down TFTs T34, T37 and T40 is turned on by the charging voltage of the third even control node 2Qbe, the second output buffer circuit OBC2 outputs the (n+1)th scan signal SC[n+1] of the low voltage through the first output node No1, outputs the (n+1)th sense signal SE[n+1] of the low voltage through the second output node No2, and outputs the (n+1)th carry signal CS[n+1] of the low voltage through the third output node No3. Therefore, the pixels disposed in the (n+1)th horizontal line may emit light in accordance with a data current corresponding to an image data voltage which is addressed.

Figure 14E:
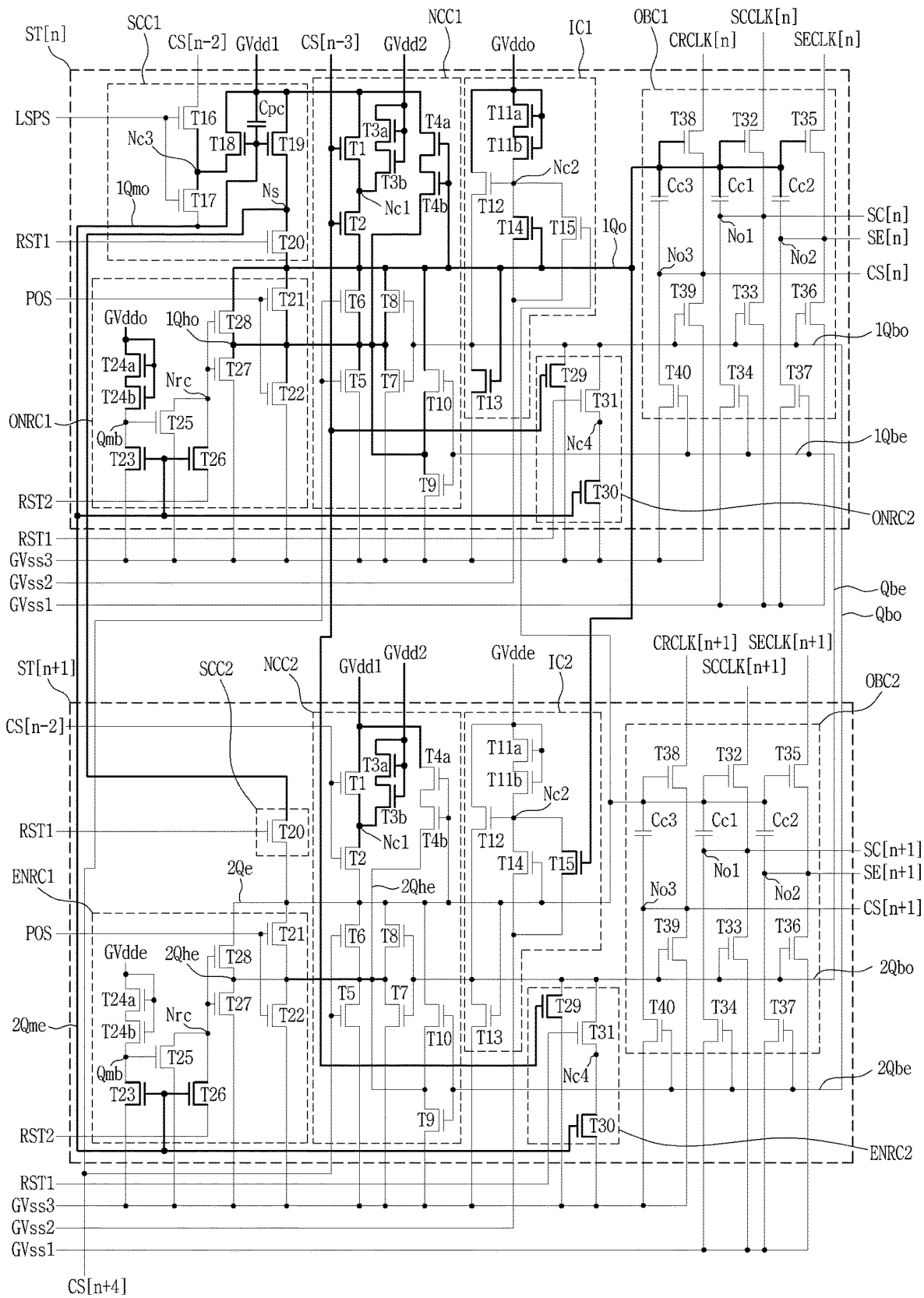

Referring to FIGS. 13 and 14E, for the black display period BDP of the display mode according to one embodiment of the present disclosure, the fifth odd control node 1Qmo of the nth stage circuit ST[n] maintains the charging state as it is. Also, each of the reset control node Nrc of the nth stage circuit ST[n] and the reset control node Nrc of the (n+1)th stage circuit ST[n+1] maintains the voltage stage of the second display period td2 as it is.

For a first black period tb1 of the black display period BDP, the first odd control node 1Qo of the nth stage circuit ST[n] is charged with the first gate high potential voltage GVdd1 in accordance with the operation of the first node control circuit NCC1 responding to the (n−3)th carry signal CS[n−3] of the high voltage. The second odd control node 1Qbo of the nth stage circuit ST[n] is discharged with the third gate low potential voltage GVss3 in accordance with the operation of the first inverter circuit IC1 responding to the charging voltage of the first odd control node 1Qo.

At the first black period tb1 of the black display period BDP, the first gate high potential voltage GVdd1 charged in the first odd control node 1Qo of the nth stage circuit ST[n] is supplied from the first gate high potential voltage line through two TFTs T1 and T2, whereby voltage charging characteristics of the first odd control node 1Qo may be enhanced.

For the first black period tb1 of the black display period BDP, the first even control node 2Qe of the (n+1)th stage circuit ST[n+1] is discharged with the third gate low potential voltage GVss3 in accordance with the operation of the second inverter circuit IC2 responding to the charging voltage of the first odd control node 1Qo. The second even control node 2Qbo of the (n+1)th stage circuit ST[n+1] is connected with the third odd control node 1Qbe of the nth stage circuit ST[n] and thus maintained at the third gate low potential voltage GVss3. The third even control node 2Qbe of the nth stage circuit ST[n] is connected with the second odd control node 1Qbo of the nth stage circuit ST[n] and thus maintained at the third gate low potential voltage GVss3.

At the second black period tb2 and the third black period tb3 after the first black period tb1 of the black display period BDP, the fifth odd control node 1Qmo of the nth stage circuit ST[n] maintains the charging state as it is. Since the first black period tb1 and the second black period tb2 are substantially the same as the second display period td2 and the third display period td3 shown in FIG. 14D except that the nth scan shift clock SCCLK[n] is only input as the high voltage, their repeated description will be omitted. Therefore, for the second black period tb2 and the third black period tb3 of the black display period BDP, the pixels disposed in the nth horizontal line may display a black image as a black data voltage is addressed by the nth scan signal SC[n] having the second scan pulse SCP2 of the high voltage.

Figure 14F:
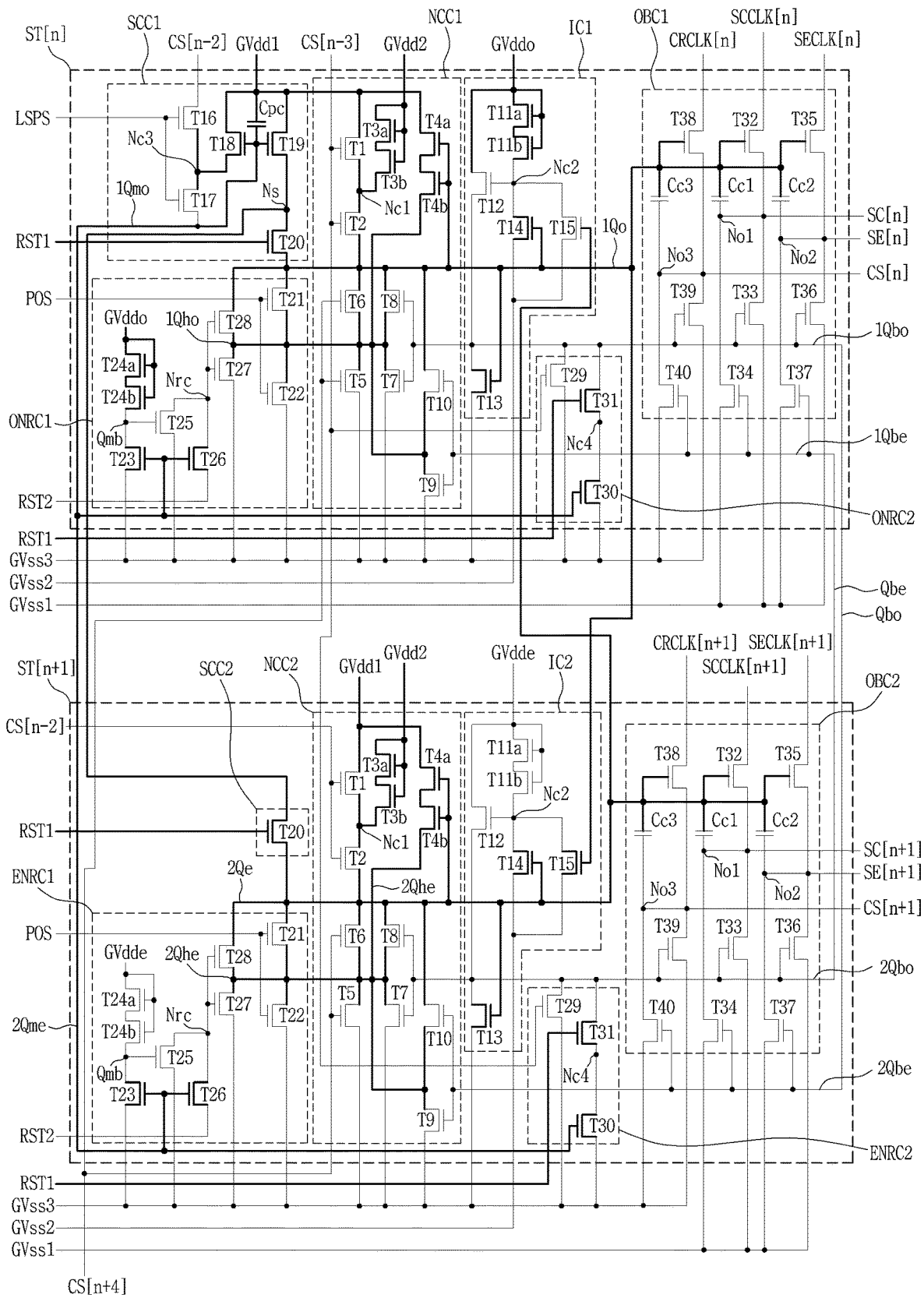

Referring to FIGS. 13 and 14F, at the first sensing period ts1 of the sensing period RSP of the sensing mode according to one embodiment of the present disclosure, each of the reset control node Nrc of the nth stage circuit ST[n] and the reset control node Nrc of the (n+1)th stage circuit ST[n+1] maintains the voltage state of the second display period td2 as it is.

For the first sensing period ts1 of the sensing period RSP, the first odd control node 1Qo of the nth stage circuit ST[n] is charged with the first gate high potential voltage GVdd1 in accordance with the operation of the first sensing control circuit SCC1 responding to the first reset signal RST1 of the high voltage. The second odd control node 1Qbo of the nth stage circuit ST[n] is discharged with the third gate low potential voltage GVss3 in accordance with the operation of the first inverter circuit IC1 responding to the charging voltage of the first odd control node 1Qo.

For the first sensing period ts1 of the sensing period RSP, the first even control node 2Qe of the (n+1)th stage circuit ST[n+1] is discharged with the first gate high potential voltage GVdd1 supplied through the sharing node Ns of the nth stage circuit ST[n] in accordance with the operation of the second sensing control circuit SCC2 responding to the first reset signal RST1 of the high voltage. The second even control node 2Qbo of the (n+1)th stage circuit ST[n+1] is discharged with the third gate low potential voltage GVss3 in accordance with the operation of the second inverter circuit IC2 responding to the charging voltage of the first even control node 2Qe.

At the first sensing period ts1 of the sensing period RSP, as each of the nth scan shift clock SCCLK[n] and the nth sense shift clock SECLK[n] is maintained at the low voltage, bootstrapping is not generated in the first odd control node 1Qo, whereby each of the odd pull-up TFTs T32, T35 and T38 of the first output buffer circuit OBC1 is maintained at the turn-off state without being turned on. Likewise, at the first sensing period ts1 of the sensing period RSP, as each of the (n+1)th scan shift clock SCCLK[n+1], the (n+1)th sense shift clock SECLK[n+1] and the (n+1)th carry shift clock CRCLK[n+1] is maintained at the low voltage, bootstrapping is not generated in the first even control node 2Qe, whereby each of the even pull-up TFTs T32, T35 and T38 of the second output buffer circuit OBC2 is maintained at the turn-off state without being turned on.

Figure 14G:
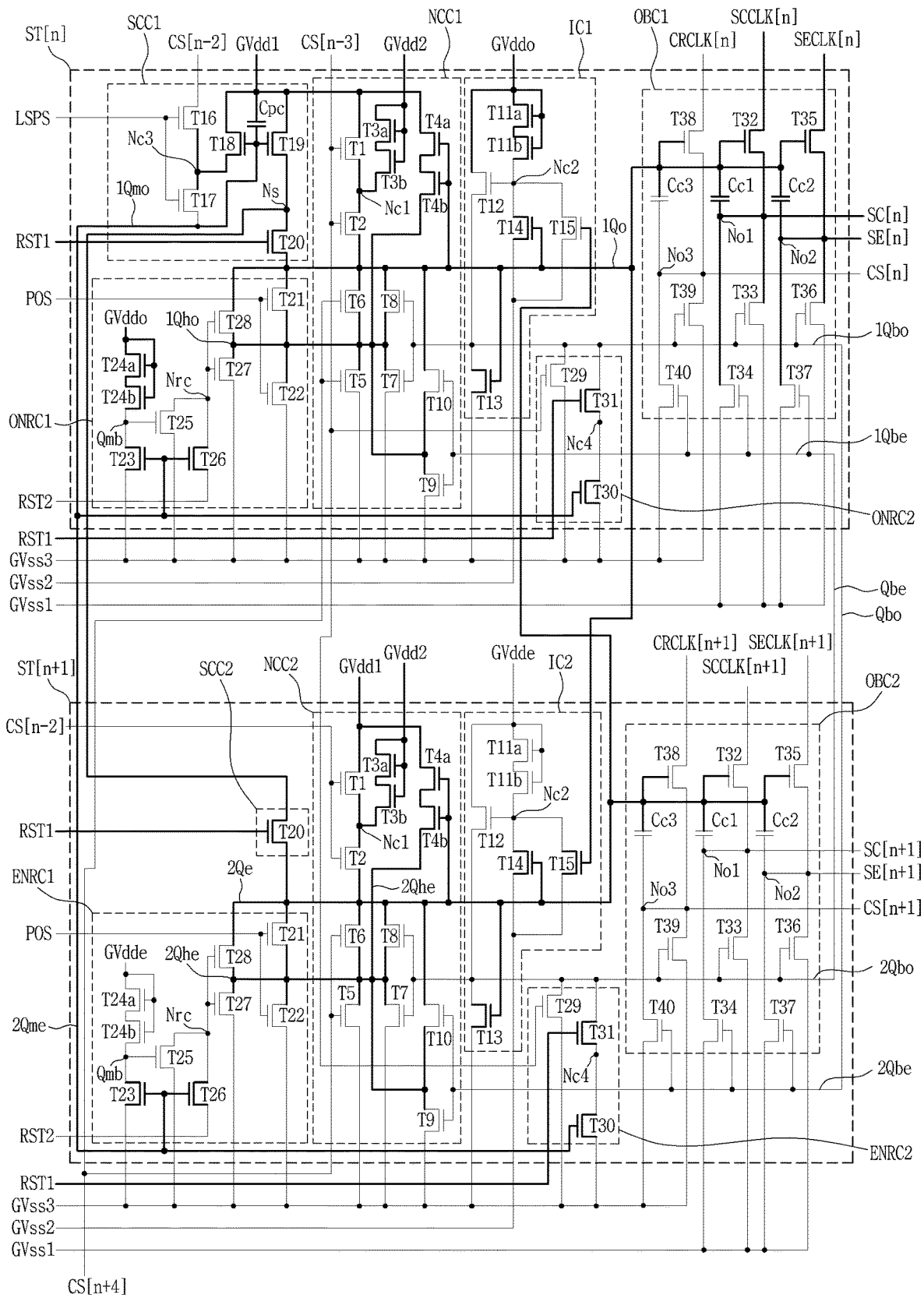

Referring to FIGS. 13 and 14G, at the second sensing period ts2 of the sensing period RSP of the sensing mode according to one embodiment of the present disclosure, each of the reset control node Nrc of the nth stage circuit ST[n] and the reset control node Nrc of the (n+1)th stage circuit ST[n+1] maintains the voltage state of the second display period td2 as it is.

For the second sensing period ts2 of the sensing period RSP, each of the nth scan shift clock SCCLK[n] and the nth sense shift clock SECLK[n] is input as the high voltage and the nth carry shift clock CRCLK[n] is input as the low voltage, bootstrapping is generated in the first odd control node 1Qo, whereby each of the odd pull-up TFTs T32, T35 and T38 of the first output buffer circuit OBC1 is completely turned on. Therefore, the nth stage circuit ST[n] outputs the nth scan signal SC[n] having a third scan pulse SCP3 of a high voltage through the first output node No1, outputs the nth sense signal SE[n] having a second sense pulse SEP2 of a high voltage through the second output node No2, and outputs the nth carry signal CS[n] having a low voltage through the third output node No3. Therefore, a sensing data addressing period for the pixels disposed in the nth horizontal line may be performed for the second sensing period ts2 of the sensing period RSP.

At the second sensing period ts2 of the sensing period RSP, as each of the (n+1)th scan shift clock SCCLK[n+1], the (n+1)th sense shift clock SECLK[n+1] and the (n+1)th carry shift clock CRCLK[n+1] is maintained at the low voltage, bootstrapping is not generated in the first even control node 2Qe, whereby each of the even pull-up TFTs T32, T35 and T38 of the second output buffer circuit OBC2 is maintained at the turn-off state without being turned on.

For a fourth sensing period ts4 after the third sensing period ts3 of the sensing period RSP, each of the nth scan shift clock SCCLK[n] and the nth carry shift clock CRCLK[n] is input as the low voltage and the nth sense shift clock SECLK[n] is input as the high voltage, whereby each of the odd pull-up TFTs T32, T35 and T38 of the first output buffer circuit OBC1 is maintained at the turn-on state. Therefore, the nth stage circuit ST[n] outputs the nth scan signal SC[n] of a low voltage through the first output node No1, outputs the nth sense signal SE[n] having a second sense pulse SEP2 of a high voltage through the second output node No2 as it is, and outputs the nth carry signal CS[n] having a low voltage through the third output node No3 as it is. Therefore, a sampling period for sensing driving characteristics of the pixels disposed in the nth horizontal line may be performed for the fourth sensing period ts4 of the sensing period RSP.

For a fifth sensing period ts5 after the fourth sensing period ts4 of the sensing period RSP, the nth scan shift clock SCCLK[n] is input as the high voltage, the nth sense shift clock SECLK[n] is maintained as the high voltage and the nth carry shift clock CRCL[n] is maintained at the low voltage, whereby each of the odd pull-up TFTs T32, T35 and T38 of the first output buffer circuit OBC1 is maintained at the turn-on state. Therefore, the nth stage circuit ST[n] outputs the nth scan signal SC[n] having a fourth scan pulse SCP4 of a high voltage through the first output node No1, outputs the nth sense signal SE[n] having a second sense pulse SEP2 of a high voltage through the second output node No2 as it is, and outputs the nth carry signal CS[n] having a low voltage through the third output node No3 as it is. Therefore, a data restoring period for restoring a light emission state of the pixels disposed in the nth horizontal line to a previous state of the sensing period RSP may be performed for the fourth sensing period ts4 of the sensing period RSP.

Figure 14H:
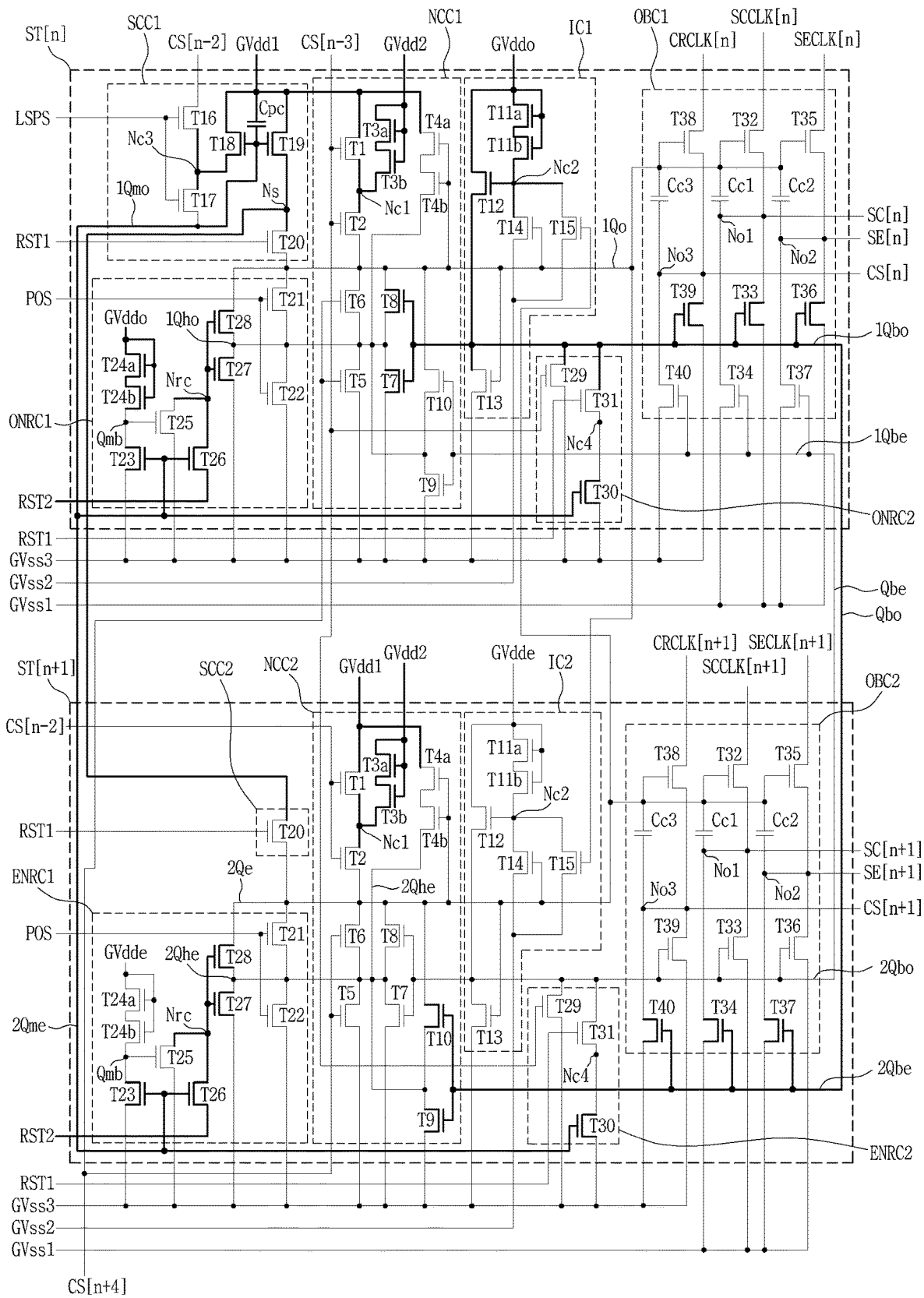

Referring to FIGS. 13 and 14H, for the fifth sensing period ts5 of the sensing period RSP of the sensing mode according to one embodiment of the present disclosure, the first odd control node 1Qo of the nth stage circuit ST[n] is discharged with the third gate low potential voltage GVss3 in accordance with the operation of the second odd nod reset circuit ENRC2 responding to the second reset signal RST2 of the high voltage and the charging voltage of the fifth odd control node 1Qmo. Therefore, the sensing mode for the pixels disposed in the nth horizontal line may be released.

At the fifth sensing period ts5 of the sensing period RSP, the first odd node reset circuit ONRC1 of the nth stage circuit ST[n] may supply the second reset signal RST2 of the high voltage supplied through the 26th TFT T26 turned on in accordance with the charging voltage of the fifth odd control node 1Qmo, to the reset control node Nrc to turn on the 27th and 28th TFTs T27 and T28, thereby discharging the potential of the first odd control node 1Qo with the third gate low potential voltage GVss3. At this time, since the potential of the first odd control node 1Qo is discharged with the third gate low potential voltage line through a discharge path comprised of two TFTs such as the 27th and 28th TFTs T27 and T28 electrically connected with each other in series, voltage discharge characteristics of the first odd control node 1Qo may be enhanced. Particularly, even when on-current or mobility characteristic of at least one of the 27th and 28th TFTs T27 and T28 is deteriorated by degradation or threshold voltage shift of the TFT, the voltage of the first odd control node 1Qo may smoothly be discharged through a short discharge path having a small number of TFTs, that is, two TFTs. Therefore, in one embodiment of the present disclosure, an error operation of the gate driving circuit, which is caused by a non-discharge voltage of the first odd control node 1Qo after the sensing period RSP, and picture quality deterioration due to the error operation may be avoided.

For the fifth sensing period ts5 of the sensing period RSP, the second odd control node 1Qbo of the nth stage circuit ST[n] is charged with the third gate high potential voltage GVddo in accordance with the operation of the first inverter circuit IC1 responding to the discharge voltage of the first odd control node 1Qo. Therefore, as each of the odd pull-up TFTs T33, T36 and T38 is turned on by the charging voltage of the second odd control node 1Qbo, the first output buffer circuit OBC1 outputs the nth scan signal SC[n] of a low voltage through the first output node No1, outputs the nth sense signal SE[n] of a low voltage through the second output node No2, and outputs the nth carry signal CS[n] having a low voltage through the third output node No3.

For the fifth sensing period ts5 of the sensing period RSP, the first odd control node 2Qe of the (n+1)th stage circuit ST[n+1] is discharged with the third gate low potential voltage GVss3 in accordance with the operation of the first even node reset circuit ENRC1 responding to the second reset signal RST2 of the high voltage and the discharge voltage of the fifth odd control node 1Qmo. At the fifth sensing period ts5 of the sensing period RSP, the first even node reset circuit ENRC1 of the (n+1)th stage circuit ST[n+1] may discharge the potential of the first even control node 2Qe with the third gate low potential voltage GVss3 by supplying the second reset signal RST2 of the high voltage supplied through the 26th TFT T26 turned on in accordance with the charging voltage of the fifth even control node 2Qme, to the reset control node Nrc to turn on the 27th and 28th TFTs T27 and T28. The third even control node 2Qbe of the (n+1)th stage circuit ST[n+1] is connected with the second odd control node 2Qbo of the nth stage circuit ST[n] and thus charged with the third gate high potential voltage GVddo. Therefore, as each of the even pull-down TFTs T34, T37 and T40 is turned on by the charging voltage of the third even control node 2Qbe, the second output buffer circuit OBC2 outputs the (n+1)th scan signal SC[n+1] of a low voltage through the first output node No1, outputs the (n+1)th sense signal SE[n+1] of a low voltage through the second output node No2, and outputs the (n+1)th carry signal CS[n+1] having a low voltage through the third output node No3.

Figure 14I:
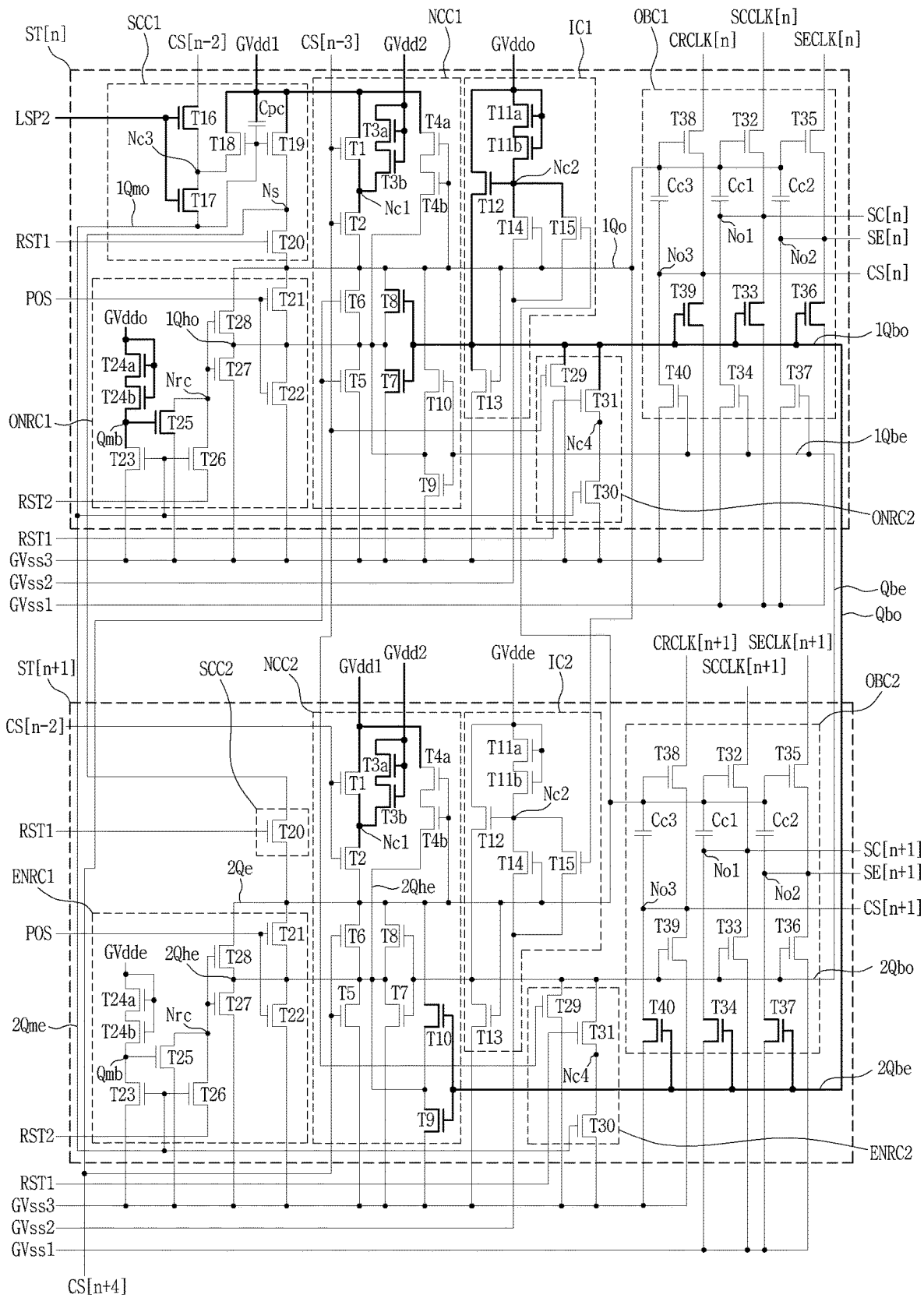

Referring to FIGS. 13 and 14I, at the start timing of the display mode after the sensing mode according to one embodiment of the present disclosure, the fifth odd control node 1Qmo of the nth stage circuit ST[n] is charged or discharged with the low voltage of the (n−2)th carry signal CS[n−2] in accordance with the operation of the first sensing control circuit SCC1 responding to the line sensing release pulse LSP2 having a high voltage of the line sensing preparation signal LSPS. The second odd control node 1Qbo of the nth stage circuit ST[n] maintains the charged state with the third gate high potential voltage GVddo. Therefore, as each of the odd pull-down TFTs T33, T36 and T38 is maintained at the turn-on state by the charging voltage of the second odd control node 1Qbo, the first output buffer circuit OBC1 outputs the nth scan signal SC[n] of a low voltage through the first output node No1, outputs the nth sense signal SE[n] of a low voltage through the second output node No2, and outputs the nth carry signal CS[n] having a low voltage through the third output node No3.

At the start timing of the display mode after the sensing mode, the third even control node 2Qbe of the (n+1)th stage circuit ST[n+1] is connected with the second odd control node 2Qbo of the nth stage circuit ST[n] and thus maintains the charged state with the third gate high potential voltage GVddo. Therefore, as each of the even pull-down TFTs T34, T37 and T40 is turned on by the charging voltage of the third even control node 2Qbe, the second output buffer circuit OBC2 outputs the (n+1)th scan signal SC[n+1] of a low voltage through the first output node No1, outputs the (n+1)th sense signal SE[n+1] of a low voltage through the second output node No2, and outputs the (n+1)th carry signal CS[n+1] having a low voltage through the third output node No3.

At the start timing of the display mode after the sensing mode, the first odd node reset circuit ONRC1 of the nth stage circuit ST[n] is switched in accordance with the low voltage of the fifth odd control node 1Qmo and the high voltage of the third gate high potential voltage GVddo to turn off the 27th and 28th TFTs T27 and T28, thereby quitting discharge of the first odd control node 1Qo. For example, in the first odd node reset circuit ONRC1, the 23rd and 26th TFTs T23 and T26 may be turned off by the low voltage of the fifth odd control node 1Qmo, the 25th TFT T25 may be turned on by the third gate high potential voltage GVddo of the high voltage supplied through the 24th TFTs T24a and T24b, and the 27th and 28th TFTs T27 and T28 may be turned off by the third gate low potential voltage GVss3 supplied to the reset control node Nrc through the 25th TFT T25, thereby quitting discharge of the first odd control node 1Qo.

The first even node reset circuit ENRC1 of the (n+1)th stage circuit ST[n+1] is switched in accordance with the low voltage of the fifth even control node 2Qme and the high voltage of the fourth gate high potential voltage GVdde to turn off the 27th and 28th TFTs T27 and T28, thereby quitting discharge of the first even control node 2Qe. For example, in the first even node reset circuit ENRC1, the 23rd and 26th TFTs T23 and T26 may be turned off by the low voltage of the fifth odd control node 1Qmo, the 25th TFT T25 may maintain the turn-off state, and the 27th and 28th TFTs T27 and T28 may be turned off by turn-off of each of the 25th TFT T25 and the 26th TFT T26, thereby quitting discharge of the first even control node 1Qe.

Figure 15A:
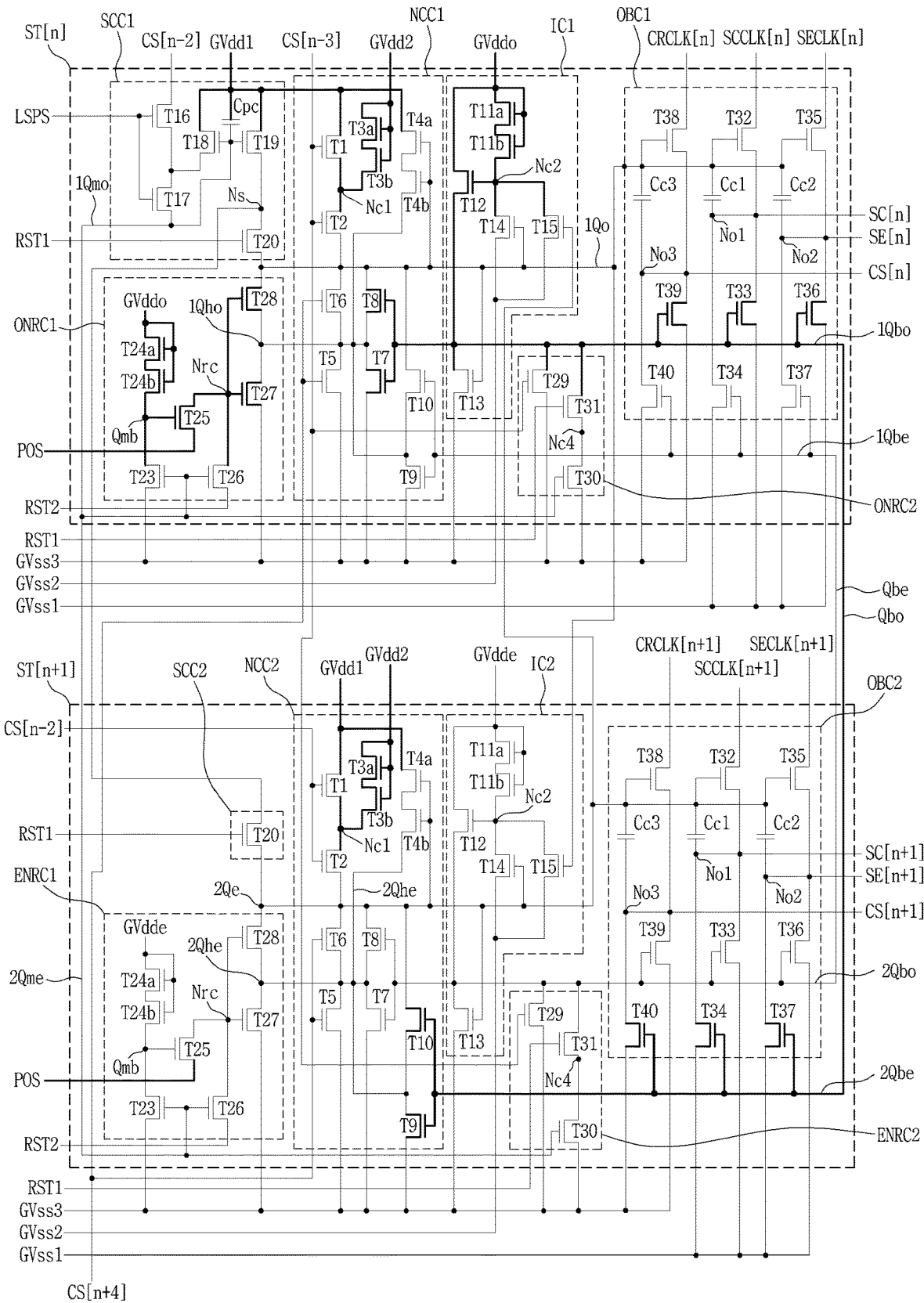
FIGS. 15A to 15C are views illustrating operations of a second odd node reset circuit of an nth stage circuit and a second even node reset circuit of an (n+1)th stage circuit, which are shown in FIG. 12.
Figure 15B:
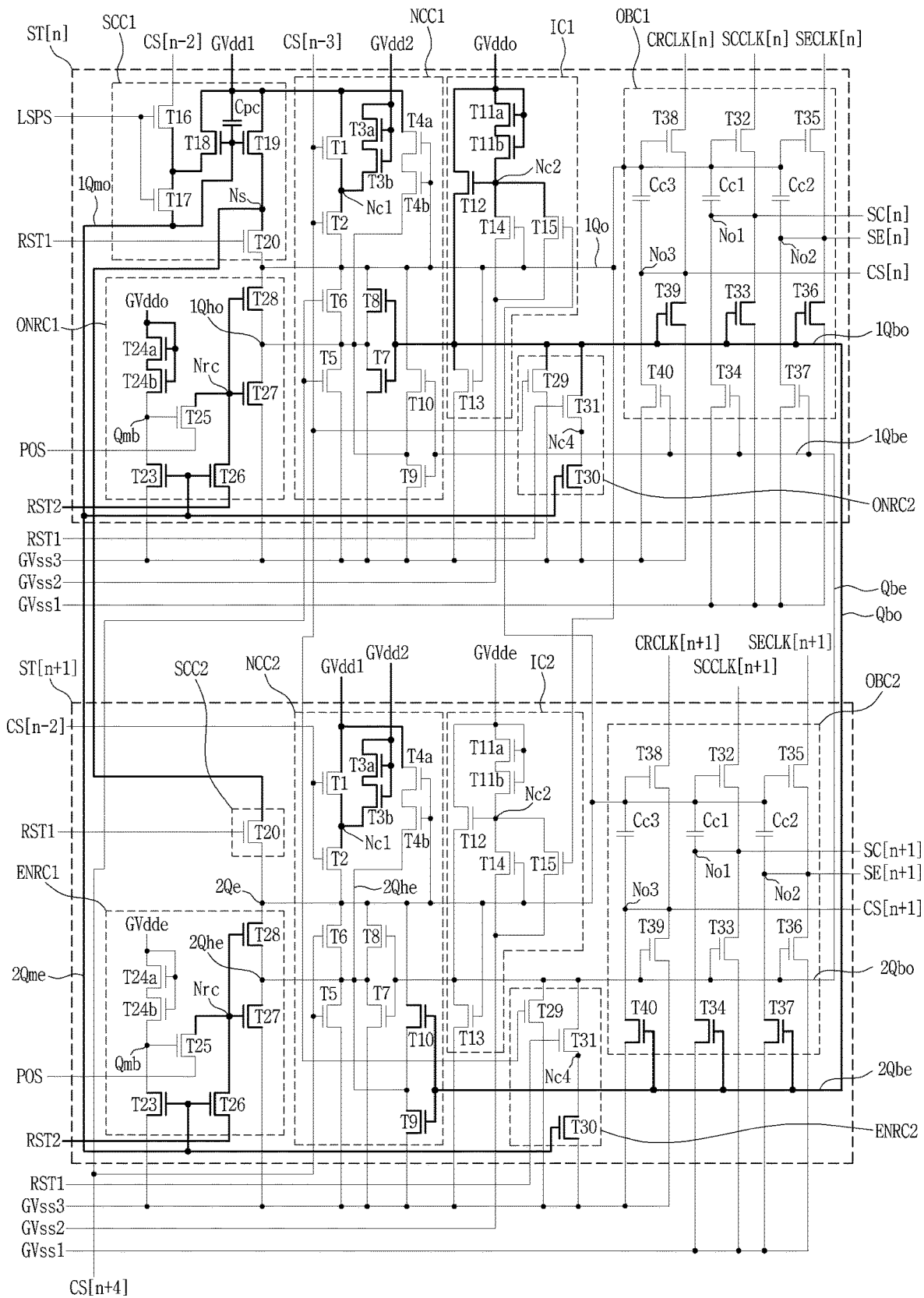
Figure 15C:
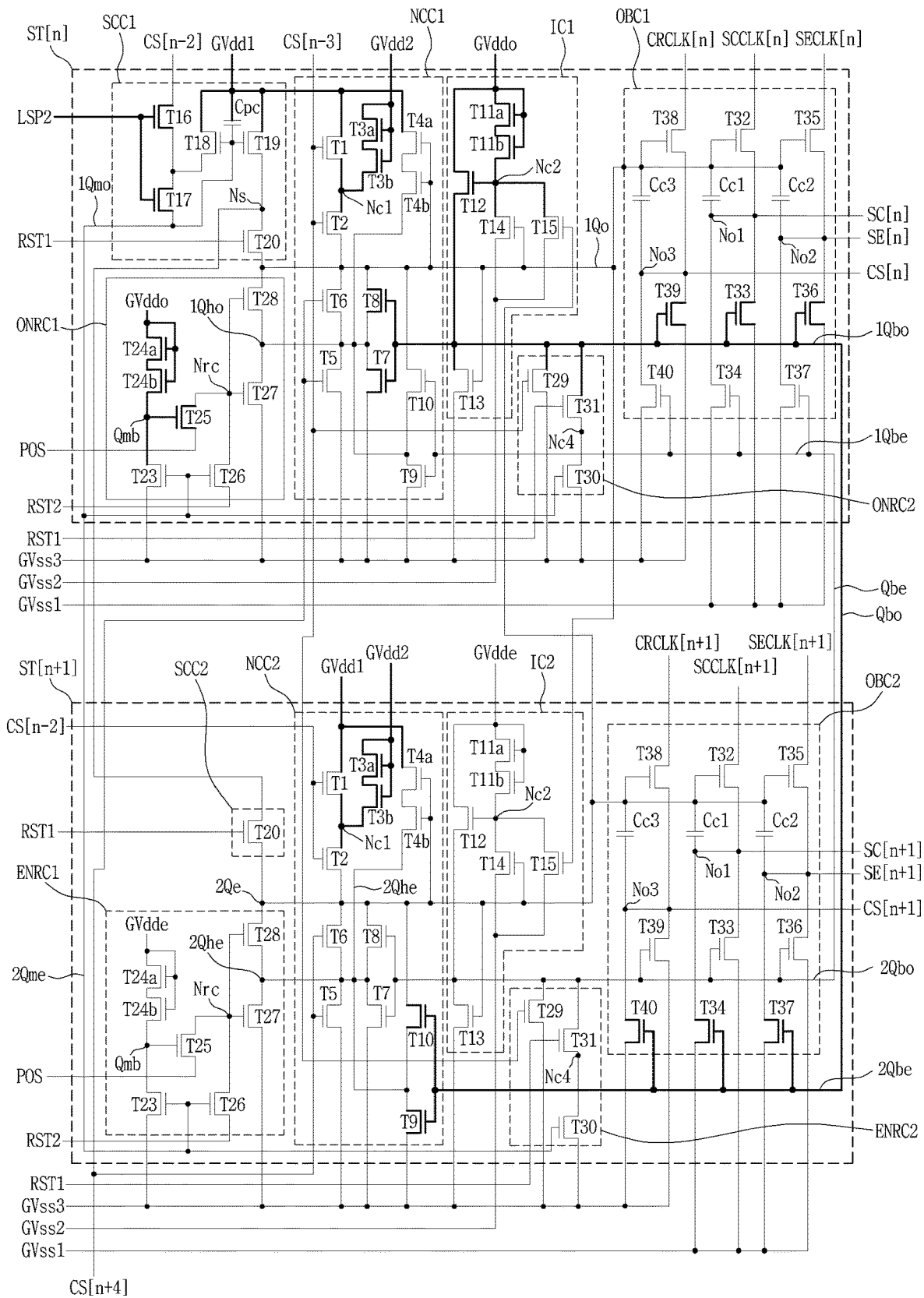

FIGS. 15A to 15C are views illustrating operations of a second odd node reset circuit of an nth stage circuit and a second even node reset circuit of an (n+1)th stage circuit, which are shown in FIG. 12.

First of all, since the operation of each of the nth stage circuit and the (n+1)th stage circuit, which are shown in FIG. 12, is the same as the operation of each of the nth stage circuit and the (n+1)th stage circuit, which are shown in FIGS. 14A to 14I, except the operation of each of the second odd node reset circuit and the second even node reset circuit, operation description of the other elements except the second odd node reset circuit of the nth stage circuit and the second even node reset circuit of the (n+1)th stage circuit will be omitted.

Referring to FIG. 15A, the first odd reset circuit ONRC1 of the nth stage circuit ST[n] may be switched in accordance with the display panel on signal POS of the high voltage supplied as the light emitting display apparatus is powered on, thereby discharging the voltage of the first odd control node 1Qo with the third gate low potential voltage GVss3. For example, the first odd node reset circuit ONRC1 may turn on the 27th and 28th TFTs T27 and T28 by supplying the display panel on signal POS of the high voltage to the reset control node Nrc through the 25th TFT T25 turned on in accordance with the third gate high potential voltage GVddo of the high voltage supplied to the inversion node Qmb. Therefore, the voltage of the first odd control node 1Qo may smoothly be discharged through a short discharge path having the 27th and 28th TFTs T27 and T28. Particularly, even when on-current or mobility characteristic of at least one of the 27th and 28th TFTs T27 and T28 is deteriorated by degradation or threshold voltage shift of the TFT, the voltage of the first odd control node 1Qo may smoothly be discharged through a short discharge path having a small number of TFTs, that is, two TFTs. Therefore, in one embodiment of the present disclosure, an error operation of the gate driving circuit, which is caused by a non-discharge voltage of the first odd control node 1Qo after the sensing period RSP, and picture quality deterioration due to the error operation may be avoided.

The first even node reset circuit ENRC1 of the (n+1)th stage circuit ST[n+1] may electrically float the first even control node 2Qe in accordance with turn-off of the 25th TFT T25 based on the fourth gate high potential voltage GVdde of the low voltage and turn-off of the 27th and 28th TFTs T27 and T28 based on the turn-off of the 25th TFT T25. Therefore, the first even control node 2Qe may be maintained at the third gate low potential voltage GVss3.

Referring to FIG. 15B, at the fifth sensing period ts5 of the sensing period RSP of the sensing mode shown in FIG. 13, the first odd node reset circuit ONRC1 of the nth stage circuit ST[n] according to one embodiment may be switched in accordance with the charging voltage of the fifth odd control node 1Qmo and the high voltage of the second reset signal RST2 to discharge the potential of the first odd control node 1Qo with the third gate low potential voltage GVss3. For example, the first odd node reset circuit ONRC1 may turn on the 27th and 28th TFTs T27 and T28 by supplying the second reset signal RST2 of the high voltage supplied through the 26th TFT T26 turned on in accordance with the charging voltage of the fifth odd control node 1Qmo, to the reset control node Nrc, thereby discharging the potential of the first odd control node 1Qo with the third gate low potential voltage GVss3. At this time, since the potential of the first odd control node 1Qo is discharged with the third gate low potential voltage line through a discharge path of two TFTs such as the 27th and 28th TFTs T27 and T28 electrically connected with each other in series, voltage discharging characteristics of the first odd control node 1Qo may be enhanced.

At the fifth sensing period ts5 of the sensing period RSP of the sensing mode shown in FIG. 13, the first even node reset circuit ENRC1 of the (n+1)th stage circuit ST[n+1] according to one embodiment may be switched in accordance with the charging voltage of the fifth odd control node 1Qmo and the high voltage of the second reset signal RST2 to discharge the potential of the first even control node 2Qe with the third gate low potential voltage GVss3. For example, the first even node reset circuit ENRC1 may turn on the 27th and 28th TFTs T27 and T28 by supplying the second reset signal RST2 of the high voltage supplied through the 26th TFT T26 turned on in accordance with the charging voltage of the fifth odd control node 1Qmo, to the reset control node Nrc, thereby discharging the potential of the first even control node 2Qe with the third gate low potential voltage GVss3. At this time, since the potential of the first even control node 2Qe is discharged with the third gate low potential voltage line through a discharge path of two TFTs such as the 27th and 28th TFTs T27 and T28 electrically connected with each other in series, voltage discharging characteristics of the first even control node 2Qe may be enhanced.

Referring to FIG. 15C, the first odd reset circuit ONRC1 of the nth stage circuit ST[n] according to one embodiment may be switched in accordance with the low voltage of the fifth odd control node 1Qmo and the high voltage of the third gate high potential voltage GVddo based on the high voltage of the line sensing preparation signal LSPS supplied at the start timing of the display mode after the sensing mode shown in FIG. 13, to turn off the 27th and 28th TFTs T27 and T28, thereby quitting discharge of the first odd control node 1Qo. For example, in the first odd node reset circuit ONRC1, the 23rd and 26th TFTs T23 and T26 are turned off by the low voltage of the fifth odd control node 1Qmo, the 25th TFT T25 is turned on by the third gate high potential voltage GVddo of the high voltage supplied through the 24th TFTs T24a and T24b, and the 27th and 28th TFTs T27 and T28 are turned off by the third gate low potential voltage GVss3 supplied to the reset control node Nrc through the 25th TFT T25, whereby discharge of the first odd control node 1Qo may be quitted.

The first even node reset circuit ENRC1 of the (n+1)th stage circuit ST[n+1] may be switched in accordance with the low voltage of the fifth even control node 2Qme and the low voltage of the fourth gate high potential voltage GVdde to turn off the 27th and 28th TFT T27 and T28, thereby quitting discharge of the first even control node 2Qe. For example, in the first even node reset circuit ENRC1, the 23rd and 26th TFTs T23 and T26 are turned off by the low voltage of the fifth odd control node 1Qmo, the 25th TFT T25 is maintained at the turn-off state as it is, and the 27th and 28th TFTs T27 and T28 are turned off by the turn-off of each of the 25th and 26th TFTs T25 and T26, whereby discharge of the first even control node 1Qe may be quitted.

A gate driving circuit and a light emitting display apparatus comprising the same According to one embodiment of the present disclosure will be described below.

A gate driving circuit according to one embodiment of the present disclosure comprises first to mth stage circuits, and each of the first to mth stage circuits includes first to fifth control nodes, a node control circuit controlling a voltage of each of the first to fourth control nodes based on a first front carry signal, a sensing control circuit controlling a voltage of the fifth control node based on a line sensing preparation signal, a second front carry signal and a first reset signal, and a first node reset circuit controlling the voltage of the first control node based on the voltage of the fifth control node and a second reset signal, and the first node reset circuit includes a discharge path having two thin film transistors connected between a gate low potential voltage line and the fifth control node.

According to one embodiment of the present disclosure, the node control circuit may include a node setup circuit switched in accordance with the first front carry signal supplied from a front stage circuit to charge a first gate high potential voltage to the first control node, and the first gate high potential voltage may be supplied to the first control node from a first gate high potential voltage line by passing through the two thin film transistors.

According to one embodiment of the present disclosure, the node setup circuit may include first and second thin film transistors electrically connected between the first gate high potential voltage line and the first control node in series and together turned on by the first front carry signal, and a third thin film transistor at least partially or always supplying a second gate high potential voltage to a first connection node between the first thin film transistor and the second thin film transistor.

According to one embodiment of the present disclosure, the second gate high potential voltage may be lower than the first gate high potential voltage.

According to one embodiment of the present disclosure, the first node reset circuit may include a first logic AND circuit having a first input terminal connected to the fifth control node and a second input terminal connected to a second reset signal line for transferring the second reset signal, a second logic AND circuit having a first input terminal connected to an inversion node having a voltage opposite to the voltage of the fifth control node and a second input terminal connected to a gate low potential voltage line, a logic OR circuit having a first input terminal connected to an output terminal of the first logic AND circuit and a second input terminal connected to an output terminal of the second logic AND circuit, and a third logic AND circuit having a first input terminal connected to the first control node and a second input terminal connected to an output terminal of the logic OR circuit and an output terminal connected to the gate low potential voltage line, and the third logic AND circuit may embody the discharge path.

According to one embodiment of the present disclosure, the first node reset circuit may include a first reset thin film transistor connecting the gate low potential voltage line with an inversion node in accordance with the voltage of the fifth control node, a second reset thin film transistor connecting a first gate high potential voltage line for transferring a first gate high potential voltage, with the inversion node in accordance with the first gate high potential voltage, a third reset thin film transistor connecting the gate low potential voltage line with a reset control node in accordance with the voltage of the inversion node, a fourth reset thin film transistor connecting a second reset signal line for transferring the second reset signal, with the reset control node in accordance with the voltage of the fifth control node, a fifth reset thin film transistor connecting the fourth control node with the gate low potential voltage line in accordance with a voltage of the reset control node, and a sixth reset thin film transistor connecting the first control node with the fifth reset thin film transistor in accordance with the voltage of the reset control node.

According to one embodiment of the present disclosure, the first node reset circuit may additionally control the voltage of the first control node based on a display panel on signal.

According to one embodiment of the present disclosure, the first node reset circuit may include a (1-1)th node discharge circuit controlling the voltage of the first control node based on the display panel on signal, and a (1-2)th node discharge circuit controlling the voltage of the first control node based on the voltage of the fifth control node and the second reset signal.

According to one embodiment of the present disclosure, the (1-1)th node discharge circuit may include a first power on reset thin film transistor connecting the fourth control node with the gate low potential voltage line in accordance with the display panel on signal, and a second power on reset thin film transistor connecting the first control node with the first power on reset thin film transistor in accordance with the display panel on signal.

According to one embodiment of the present disclosure, the (1-2)th node discharge circuit may include a first reset thin film transistor connecting the gate low potential voltage line with an inversion node in accordance with the voltage of the fifth control node, a second reset thin film transistor connecting a first gate high potential voltage line for transferring a first gate high potential voltage, with the inversion node in accordance with the first gate high potential voltage, a third reset thin film transistor connecting the gate low potential voltage line with a reset control node in accordance with the voltage of the inversion node, a fourth reset thin film transistor connecting a second reset signal line for transferring the second reset signal, with the reset control node in accordance with the voltage of the fifth control node, a fifth reset thin film transistor connecting the fourth control node with the gate low potential voltage line in accordance with a voltage of the reset control node, and a sixth reset thin film transistor connecting the first control node with the fifth reset thin film transistor in accordance with the voltage of the reset control node.

According to one embodiment of the present disclosure, the first node reset circuit may include a first logic AND circuit having a first input terminal connected to the fifth control node and a second input terminal connected to a second reset signal line for transferring the second reset signal, a second logic AND circuit having a first input terminal connected to an inversion node having a voltage opposite to the voltage of the fifth control node and a second input terminal connected to a display panel on signal line for transferring the display panel on signal, a logic OR circuit having a first input terminal connected to an output terminal of the first logic AND circuit and a second input terminal connected to an output terminal of the second logic AND circuit, and a third logic AND circuit having a first input terminal connected to the first control node and a second input terminal connected to an output terminal of the logic OR circuit and an output terminal connected to the gate low potential voltage line, and the third logic AND circuit may embody the discharge path.

According to one embodiment of the present disclosure, the first node reset circuit may include a first reset thin film transistor connecting the gate low potential voltage line with the inversion node in accordance with the voltage of the fifth control node, a second reset thin film transistor connecting a first gate high potential voltage line for transferring a first gate high potential voltage, with the inversion node in accordance with the first gate high potential voltage, a third reset thin film transistor connecting a display panel on signal line for transferring the display panel on signal, with a reset control node in accordance with the voltage of the inversion node, a fourth reset thin film transistor connecting a second reset signal line for transferring the second reset signal, with the reset control node in accordance with the voltage of the fifth control node, a fifth reset thin film transistor connecting the fourth control node with the gate low potential voltage line in accordance with a voltage of the reset control node, and a sixth reset thin film transistor connecting the first control node with the fifth reset thin film transistor in accordance with the voltage of the reset control node.

According to one embodiment of the present disclosure, the second control node embodied in an nth stage circuit among the first to mth stage circuits may be electrically connected with the third control node embodied in an (n+1)th stage circuit, and the third control node embodied in the nth stage circuit may be electrically connected with the second control node embodied in the (n+1)th stage circuit.

According to one embodiment of the present disclosure, each of the first to mth stage circuits further may include an inverter circuit controlling the voltage of the second control node in accordance with the voltage of the first control node, and a second node reset circuit switched in accordance with the first front carry signal, the first reset signal and the voltage of the fifth control node to reset the voltage of the second control node to a gate low potential voltage.

According to one embodiment of the present disclosure, an inverter circuit of the nth stage circuit may additionally control the voltage of the second control node of the nth stage circuit in accordance with the voltage of the first control node of the (n+1)th stage circuit, and an inverter circuit of the (n+1)th stage circuit may additionally control the voltage of the second control node of the (n+1)th stage circuit in accordance with the voltage of the first control node of the nth stage circuit.

According to one embodiment of the present disclosure, a sensing control circuit of the nth stage circuit may control the voltage of the fifth control node through a voltage of the second front carry signal in response to the line sensing preparation signal and the second front carry signal, and output the first gate high potential voltage to a sharing node in accordance with the voltage of the fifth control node, and supply the voltage of the first gate high potential voltage to the first control node in accordance with the voltage of the fifth control node.

According to one embodiment of the present disclosure, a sensing control circuit of the (n+1)th stage circuit may be electrically connected with the fifth control node of the nth stage circuit, and may be switched in accordance with the first reset signal to supply the first gate high potential voltage supplied through the sharing node of the nth stage circuit, to the first control node of the (n+1)th stage circuit.

According to one embodiment of the present disclosure, each of the first to mth stage circuits may sequentially output the scan signal, the sense signal and the carry signal at a vertical active period of each frame period, and any one of the first to mth stage circuits may output the scan signal and the sense signal at a vertical blank period of each frame period.

A light emitting display apparatus According to one embodiment of the present disclosure comprises a light emitting display panel including a plurality of pixels, a plurality of gate line groups having first and second gate lines connected to the plurality of pixels, and a plurality of data and reference lines connected to the plurality of pixels, overlapping the plurality of gate line groups, a gate driving circuit portion connected to the plurality of gate line groups, a data driving circuit portion connected to the plurality of data lines and the plurality of reference lines, and a timing controller controlling a driving timing of each of the gate driving circuit portion and the data driving circuit portion, and the gate driving circuit portion includes first to mth stage circuits, and each of the first to mth stage circuits includes first to fifth control nodes, a node control circuit controlling a voltage of each of the first to fourth control nodes based on a first front carry signal, a sensing control circuit controlling a voltage of the fifth control node based on a line sensing preparation signal, a second front carry signal and a first reset signal, and a first node reset circuit controlling the voltage of the first control node based on the voltage of the fifth control node and a second reset signal, and the first node reset circuit includes a discharge path having two thin film transistors connected between a gate low potential voltage line and the fifth control node.

According to one embodiment of the present disclosure, the timing controller may control the light emitting display panel in a display mode and a sensing mode, the gate driving circuit portion may supply a scan signal and a sense signal to any one of the plurality of gate line groups in the sensing mode, and the data driving circuit portion may supply a sensing data voltage synchronized with the scan signal to the plurality of data lines and sense driving characteristics of the pixels through the plurality of reference lines in the sensing mode.

According to one embodiment of the present disclosure, the timing controller may control the display mode in an image display period and a black display period, the gate driving circuit portion supply only the scan signal to a first gate line corresponding to at least one of the plurality of gate line groups at the black display period, and the data driving circuit portion may supply a black data voltage synchronized with the scan signal to the plurality of data lines at the black display period.

According to one embodiment of the present disclosure, each of the plurality of pixels may display an image at the image display period and display a black image at the black display period.

According to one embodiment of the present disclosure, the gate driving circuit portion may sequentially supply the scan signal and the sense signal to the plurality of gate line groups at a vertical active period of each frame period, and output the scan signal and the sense signal to any one of the plurality of gate line groups at a vertical blank period of each frame period.

A gate driving circuit and light emitting display apparatus including the same According to one embodiment of the present disclosure may be applied to all electronic apparatus including a light emitting display panel and/or a gate driving circuit built in the light emitting display panel. Example, gate driving circuit and light emitting display apparatus including the same According to one embodiment of the present disclosure may be applied to mobile devices, video phones, smart watches, watch phones, wearable devices, foldable devices, rollable devices, bendable devices, flexible devices, curved devices, portable multimedia players (PMPs), personal digital assistants (PDAs), electronic organizers, desktop personal computers (PCs), laptop PCs, netbook computers, workstations, navigation devices, automotive navigation devices, automotive display apparatuses, televisions (TVs), wall paper display apparatuses, signage devices, game machines, notebook computers, monitors, cameras, camcorders, home appliances, etc.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications derived from the meaning, scope, and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gate driving circuit comprising first to $m^{th}$ stage circuits, each of the first to $m^{th}$ stage circuits including:
   first to fifth control nodes;
   a node control circuit controlling a voltage of each of the first to fourth control nodes based on a first front carry signal;
   a sensing control circuit controlling a voltage of the fifth control node based on a line sensing preparation signal, a second front carry signal, and a first reset signal; and a first node reset circuit controlling the voltage of the first control node based on the voltage of the fifth control node and a second reset signal, wherein the first node reset circuit includes a discharge path having two thin film transistors connected between a gate low potential voltage line and the fifth control node.

2. The gate driving circuit of claim 1, wherein the node control circuit includes a node setup circuit switched based on the first front carry signal supplied from a front stage circuit to charge a first gate high potential voltage to the first control node, and the first gate high potential voltage is supplied to the first control node from a first gate high potential voltage line by passing through the two thin film transistors.

3. The gate driving circuit of claim 2, wherein the node setup circuit includes:
   first and second thin film transistors electrically connected between the first gate high potential voltage line and the first control node in series and configured to be turned on together by the first front carry signal; and
   a third thin film transistor supplying a second gate high potential voltage to a first connection node between the first thin film transistor and the second thin film transistor.

4. The gate driving circuit of claim 3, wherein the second gate high potential voltage is lower than the first gate high potential voltage.

5. The gate driving circuit of claim 1, wherein the first node reset circuit includes:
   a first logic AND circuit having a first input terminal connected to the fifth control node and a second input terminal connected to a second reset signal line for transferring the second reset signal;
   a second logic AND circuit having a first input terminal connected to an inversion node having a voltage opposite to the voltage of the fifth control node and a second input terminal connected to a gate low potential voltage line;
   a logic OR circuit having a first input terminal connected to an output terminal of the first logic AND circuit and a second input terminal connected to an output terminal of the second logic AND circuit; and
   a third logic AND circuit having a first input terminal connected to the first control node and a second input terminal connected to an output terminal of the logic OR circuit and an output terminal connected to the gate low potential voltage line, wherein the third logic AND circuit is included in the discharge path.

6. The gate driving circuit of claim 1, wherein the first node reset circuit includes:
   a first reset thin film transistor connecting the gate low potential voltage line with an inversion node based on the voltage of the fifth control node;
   a second reset thin film transistor connecting a first gate high potential voltage line for transferring a first gate high potential voltage, with the inversion node based on the first gate high potential voltage;
   a third reset thin film transistor connecting the gate low potential voltage line with a reset control node based on the voltage of the inversion node;
   a fourth reset thin film transistor connecting a second reset signal line for transferring the second reset signal, with the reset control node based on the voltage of the fifth control node;
   a fifth reset thin film transistor connecting the fourth control node with the gate low potential voltage line based on a voltage of the reset control node; and
   a sixth reset thin film transistor connecting the first control node with the fifth reset thin film transistor based on the voltage of the reset control node.

7. The gate driving circuit of claim 1, wherein the first node reset circuit is further configured to additionally control the voltage of the first control node based on a display panel on signal.

8. The gate driving circuit of claim 7, wherein the first node reset circuit includes:
   a $(1-1)^{th}$ node discharge circuit controlling the voltage of the first control node based on the display panel on signal; and
   a $(1-2)^{th}$ node discharge circuit controlling the voltage of the first control node based on the voltage of the fifth control node and the second reset signal.

9. The gate driving circuit of claim 8, wherein the $(1-1)^{th}$ node discharge circuit includes:
   a first power on reset thin film transistor connecting the fourth control node with the gate low potential voltage line based on the display panel on signal; and
   a second power on reset thin film transistor connecting the first control node with the first power on reset thin film transistor based on the display panel on signal.

10. The gate driving circuit of claim 8, wherein the $(1-2)^{th}$ node discharge circuit includes:
    a first reset thin film transistor connecting the gate low potential voltage line with an inversion node based on the voltage of the fifth control node;
    a second reset thin film transistor connecting a first gate high potential voltage line for transferring a first gate high potential voltage, with the inversion node based on the first gate high potential voltage;
    a third reset thin film transistor connecting the gate low potential voltage line with a reset control node based on the voltage of the inversion node;
    a fourth reset thin film transistor connecting a second reset signal line for transferring the second reset signal, with the reset control node based on the voltage of the fifth control node;
    a fifth reset thin film transistor connecting the fourth control node with the gate low potential voltage line based on a voltage of the reset control node; and
    a sixth reset thin film transistor connecting the first control node with the fifth reset thin film transistor based on the voltage of the reset control node.

11. The gate driving circuit of claim 7, wherein the first node reset circuit includes:
    a first logic AND circuit having a first input terminal connected to the fifth control node and a second input terminal connected to a second reset signal line for transferring the second reset signal;
    a second logic AND circuit having a first input terminal connected to an inversion node having a voltage opposite to the voltage of the fifth control node and a second input terminal connected to a display panel on signal line for transferring the display panel on signal;
    a logic OR circuit having a first input terminal connected to an output terminal of the first logic AND circuit and a second input terminal connected to an output terminal of the second logic AND circuit; and
    a third logic AND circuit having a first input terminal connected to the first control node and a second input terminal connected to an output terminal of the logic OR circuit and an output terminal connected to the gate low potential voltage line, and the third logic AND circuit embodies the discharge path.

12. The gate driving circuit of claim 7, wherein the first node reset circuit includes:
a first reset thin film transistor connecting the gate low potential voltage line with the inversion node based on the voltage of the fifth control node;
a second reset thin film transistor connecting a first gate high potential voltage line for transferring a first gate high potential voltage, with the inversion node based on the first gate high potential voltage;
a third reset thin film transistor connecting a display panel on signal line for transferring the display panel on signal, with a reset control node based on the voltage of the inversion node;
a fourth reset thin film transistor connecting a second reset signal line for transferring the second reset signal, with the reset control node based on the voltage of the fifth control node;
a fifth reset thin film transistor connecting the fourth control node with the gate low potential voltage line based on a voltage of the reset control node; and
a sixth reset thin film transistor connecting the first control node with the fifth reset thin film transistor based on the voltage of the reset control node.

13. The gate driving circuit of claim 1, wherein the second control node embodied in an $n^{th}$ stage circuit of the first to $m^{th}$ stage circuits is electrically connected with the third control node embodied in an $(n+1)^{th}$ stage circuit, and the third control node embodied in the $n^{th}$ stage circuit is electrically connected with the second control node embodied in the $(n+1)^{th}$ stage circuit.

14. The gate driving circuit of claim 13, wherein each of the first to $m^{th}$ stage circuits further includes:
an inverter circuit controlling the voltage of the second control node based on the voltage of the first control node; and
a second node reset circuit switched based on the first front carry signal, the first reset signal and the voltage of the fifth control node to reset the voltage of the second control node to a gate low potential voltage.

15. The gate driving circuit of claim 14, wherein an inverter circuit of the $n^{th}$ stage circuit additionally controls the voltage of the second control node of the nth stage circuit based on the voltage of the first control node of the $(n+1)^{th}$ stage circuit, and an inverter circuit of the $(n+1)^{th}$ stage circuit additionally controls the voltage of the second control node of the $(n+1)^{th}$ stage circuit based on the voltage of the first control node of the $n^{th}$ stage circuit.

16. The gate driving circuit of claim 14, wherein a sensing control circuit of the $n^{th}$ stage circuit controls the voltage of the fifth control node through a voltage of the second front carry signal in response to the line sensing preparation signal and the second front carry signal, and outputs the first gate high potential voltage to a sharing node based on the voltage of the fifth control node, and supplies the voltage of the first gate high potential voltage to the first control node based on the voltage of the fifth control node.

17. The gate driving circuit of claim 16, wherein a sensing control circuit of the $(n+1)^{th}$ stage circuit is electrically connected with the fifth control node of the $n^{th}$ stage circuit, and is switched based on the first reset signal to supply the first gate high potential voltage supplied through the sharing node of the $n^{th}$ stage circuit, to the first control node of the $(n+1)^{th}$ stage circuit.

18. The gate driving circuit of claim 1, wherein each of the first to $m^{th}$ stage circuits sequentially outputs the scan signal, the sense signal and the carry signal at a vertical active period of each frame period, and any one of the first to $m^{th}$ stage circuits outputs the scan signal and the sense signal at a vertical blank period of each frame period.

19. A light emitting display apparatus, comprising:
a light emitting display panel including a plurality of pixels, a plurality of gate line groups having first and second gate lines connected to the plurality of pixels, and a plurality of data and reference lines connected to the plurality of pixels, overlapping the plurality of gate line groups;
a gate driving circuit portion connected to the plurality of gate line groups;
a data driving circuit portion connected to the plurality of data lines and the plurality of reference lines; and
a timing controller controlling a driving timing of each of the gate driving circuit portion and the data driving circuit portion,
wherein the gate driving circuit portion includes a gate driving circuit including first to $m^{th}$ stage circuits, each of the first to $m^{th}$ stage circuits including:
first to fifth control nodes;
a node control circuit controlling a voltage of each of the first to fourth control nodes based on a first front carry signal;
a sensing control circuit controlling a voltage of the fifth control node based on a line sensing preparation signal, a second front carry signal, and a first reset signal; and
a first node reset circuit controlling the voltage of the first control node based on the voltage of the fifth control node and a second reset signal,
wherein the first node reset circuit includes a discharge path having two thin film transistors connected between a gate low potential voltage line and the fifth control node.

20. The light emitting display apparatus of claim 19, wherein the timing controller controls the light emitting display panel in a display mode and a sensing mode, the gate driving circuit portion supplies a scan signal and a sense signal to any one of the plurality of gate line groups in the sensing mode, and the data driving circuit portion supplies a sensing data voltage synchronized with the scan signal to the plurality of data lines and senses driving characteristics of the pixels through the plurality of reference lines in the sensing mode.

21. The light emitting display apparatus of claim 20, wherein the timing controller controls the display mode in an image display period and a black display period, the gate driving circuit portion supplies only the scan signal to a first gate line corresponding to at least one of the plurality of gate line groups at the black display period, and the data driving circuit portion supplies a black data voltage synchronized with the scan signal to the plurality of data lines at the black display period.

22. The light emitting display apparatus of claim 20, wherein each of the plurality of pixels displays an image at the image display period and displays a black image at the black display period.

23. The light emitting display apparatus of claim 19, wherein the gate driving circuit portion sequentially supplies the scan signal and the sense signal to the plurality of gate line groups at a vertical active period of each frame period, and outputs the scan signal and the sense signal to any one of the plurality of gate line groups at a vertical blank period of each frame period.

* * * * *